US005616510A

United States Patent [19]
Wong

[11] Patent Number: 5,616,510
[45] Date of Patent: Apr. 1, 1997

[54] METHOD FOR MAKING MULTIMEDIA STORAGE SYSTEM WITH HIGHLY COMPACT MEMORY CELLS

[76] Inventor: Chun C. D. Wong, 4260 Newberry Ct., Palo Alto, Calif. 94306

[21] Appl. No.: 472,942

[22] Filed: Jun. 6, 1995

Related U.S. Application Data

[62] Division of Ser. No. 336,361, Nov. 8, 1994, which is a continuation of Ser. No. 970,728, Nov. 2, 1992, Pat. No. 5,386,132.

[51] Int. Cl.$^6$ ............................................. H01L 21/8247
[52] U.S. Cl. .......................... 438/259; 438/267; 438/589
[58] Field of Search ................................. 437/38, 43, 50, 437/77, 78, 203, 915; 148/DIG. 50

[56] References Cited

U.S. PATENT DOCUMENTS

| | | | |
|---|---|---|---|
| 5,049,956 | 9/1991 | Yoshida et al. | 257/317 |
| 5,180,680 | 1/1993 | Yang | 437/43 |
| 5,460,989 | 10/1995 | Wake | 437/43 |
| 5,468,663 | 11/1995 | Bertin et al. | 437/203 |

OTHER PUBLICATIONS

Rinerson et al., "512K Eproms", IEEE ISSCC Digest Technical Papers, pp. 136–137 and 327, 1984.

Atsumi et al., "Fast Programmable 256K Read Only Memory with On–Chip Test Circuits", IEEE Journal of Solid State Circuits, vol. SC–20, No. 1, pp. 422–427, Feb. 1985.

*Primary Examiner*—Chandra Chaudhari
*Attorney, Agent, or Firm*—Skjerven, Morrill, Macpherson, Franklin & Friel; Alan H. MacPherson; David T. Millers

[57] ABSTRACT

A highly compact nonvolatile solid state memory core is provided that stores and reproduces both digital and analog signals for multimedia applications. The memory core includes vertical electrically erasable and programmable read only memories (EEPROM) cells having, for example, a stacked gate or a split channel configuration. An array of EEPROM cells on the same chip is prewritten and is used as a reference for digital-analog conversions and for memory cell programming. An intelligent write method allows each memory cell to either store an analog signal or multiple digital signals. Based on the previously stored signal, the intelligent write method determines whether to charge or to discharge the floating gate associated with the selected memory cell. Thus, full erasure is not required prior to programming each memory cell. The present invention significantly increases the density of memory cell arrays while prolonging the useful life of the array.

16 Claims, 43 Drawing Sheets

| DIGITAL DATA | STATE (LEVEL) | | REFERENCE LEVEL |
|---|---|---|---|
|  |  | - - - - | REF 4 |
| 11 | S4:STATE 4 | ——— |  |
|  |  | - - - - | REF 3 |
| 10 | S3:STATE 3 | ——— |  |
|  |  | - - - - | REF 2 |
| 01 | S2:STATE 2 | ——— |  |
|  |  | - - - - | REF 1 |
| 00 | S1:STATE 1 | ——— |  |
|  |  | - - - - | REF 0 |

FIG. 18

METHOD FOR MAKING MULTIMEDIA STORAGE SYSTEM WITH HIGHLY COMPACT MEMORY CELLS

This application is a division of application Ser. No. 08/336,361, filed Nov. 8, 1994 which was a continuation of application Ser. No. 07/970,728, now U.S. Pat. No. 5,386,132, filed Nov. 2, 1992.

BACKGROUND OF THE INVENTION

1. Field of the Invention

This invention relates to memory cells, and particularly to electrically erasable and programmable read only memories (EEPROMs) used as nonvolatile semiconductor storage systems to store both digital and analog signals.

2. Description of Related Art

As is well known in the art, an EEPROM cell utilizes a floating polysilicon layer, conventionally called a floating gate, positioned between but insulated from a channel region and a control gate. The channel region is formed between a source and a drain region. The floating gate retains charges, thereby varying the threshold voltage of the transistor. The threshold voltage is the minimum voltage applied to the control gate to turn on the transistor, i.e. to allow current to flow between source and drain regions. Each EEPROM cell conventionally stores only one bit of data, i.e. either a "0" or a "1". For example, a stored "0" in one convention is associated with an "on" state while a stored "1" is associated with an "off" state.

To read the data stored in a memory cell, a voltage is applied across the source and drain regions while another voltage is placed on the control gate. The amount of current flowing between source and drain regions as a result of these applied voltages determines whether the transistor is "on" or "off". In the "on" state, the channel is conducting and current flows between the source and drain regions, whereas in the "off" state, the channel is not conducting and no current flows between the source and drain regions. A memory cell can be programmed to the "on" or "off" state by changing the amount of charge retained on the floating gate so that the threshold voltage is either higher than the applied control gate voltage (resulting in an "off" state) or lower than the applied control gate voltage (resulting in an "on" state).

Writing data into a memory cell typically includes two steps. First, the cell is erased by removing charges from the floating gate, and then the cell is programmed by charging the floating gate according to the data to be stored. Transferring charges to and from the floating gate is achieved either by hot electron injection or tunnelling. During hot electron injection, electrons, accelerated in a high electrical field across the channel region, acquire the energy necessary to overcome the energy barrier imposed by the insulation formed between the channel region and the floating gate. During tunneling, electrons drift across the energy barrier of the insulation formed between the floating gate and other nearby electrodes, e.g. the source region, the drain region, or the channel region, by applying a high electrical field across the insulation. A conventional EEPROM cell usually relies on tunneling for both programming and erasing operations. To ensure cell-by-cell erasability and to avoid read errors caused by over-erase of some of the unselected cells, a separate select transistor is typically used to disconnect the drain regions of the unselected cells from the selected cell during erase and read operations. However, this additional transistor increases the size of the memory cell array.

A common trend in the semiconductor memory industry is to reduce the size of the memory array to achieve higher cell density on a single chip, thereby lowering the cost per bit. One method of reducing the array size is to eliminate the select transistors, as disclosed by Masuoka, et al. in an article entitled, "A new flash EPROM cell using triple polysilicon technology", IEDM Proceedings, page 464, 1984. Masuoka et al. reduced array size by using a split channel structure shown in FIGS. 1A and 1B and a flash erase scheme. A split-channel structure is conventionally defined as two transistors, a floating gate storage transistor and a select transistor, sharing a channel region. The term "flash" refers to the fact that an entire array or a relatively large block of memory cells is erased simultaneously.

FIGS. 1A and 1B show cross-sectional views of the memory cell 100 of Masuoka et al. along a bit line and a word line, respectively. Referring to these figures, the memory cell 100 erases using electron tunneling from floating gate 101 to a separate erase gate 102. Erase gate 102 eliminates the problem of having a very high voltage on source region 105 or drain region 106. However, the amount of overlap between erase gate 102 and floating gate 101 is critical, thereby increasing manufacturing complexity and lowering yield.

Advances in methods of growing oxide have allowed thinner layers of oxide to be used as insulation, thereby reducing the required threshold voltage for tunneling. FIG. 2 illustrates a stacked gate EEPROM cell 200 disclosed by Mukherjee et al. in an article entitled "A Single Transistor EEPROM Cell And Its Implementation In A 512K CMOS EEPROM" IEDM Proceedings, page 616, 1985. Mukherjee et al. eliminated the need for erase gate 102 (FIG. 1B) by allowing electrons to tunnel from floating gate 201 to source region 205. The thin insulation layer 204 facilitates this tunnelling. However, because electrical erasing is not self-limiting, floating gate 201 is likely to be over-erased and become positively charged after erasing. This positive charge on floating gate 201 turns memory cell 200 into a depletion mode transistor. If the floating gate transistor becomes a depletion-mode transistor after being over-erased, the transistor turns on even if it is unselected, thereby causing read errors of the selected cell.

To overcome this over-erase problem, G. Samachisa, et al. disclosed a split channel structure in an article entitled, "A 128K Flash EEPROM using Double-Polysilicon Technology", IEEE Journal of Solid State Circuits, Vol. SC-22, No. 5, page 676, October 1987. Referring to FIG. 3, Samachisa et al. added a series select transistor 307 to stacked gate EEPROM cell 200 to control the channel conductance. In this manner, if series select transistor 307 is off, no current flows between the source region 305 and the drain region 306, even if the floating gate transistor 300 is in a depletion mode. Like cell 200, cell 300 of Samachisa has a thin gate insulation 304 to allow electron tunneling from floating gate 301 to drain region 306.

Another method to overcome the over-erase problem was disclosed by V. N. Kynett, et al. in an article entitled, "An In-System Reprogrammable 32K×8 CMOS Flash Memory", IEEE Journal of Solid State Circuits, Vol. 23, No. 5, page 1157, October 1988. Kynett added program and erase verify circuitry (not shown) to the stacked gate flash-EEPROM cell 200. However, Kynett, like Mukherjee et al. and Samachisa et al. relies on the thinness of the gate insulation for electron tunneling, thereby creating problems in reliability and manufacturing yield.

Therefore, other methods to reduce array size, such as storing more than one bit of data per memory cell, have been devised. The concept of storing multiple bits of data per memory cell is essentially the same as storing an analog signal in a memory cell. Due to the advancement in digital signal processing, an analog signal is often converted into and represented by a string of binary code or a word of multiple bits. The higher the number of bits representing a sampled and held analog signal, the higher the accuracy of the signal represented. Thus, an EEPROM cell that stores multiple bits of data can effectively store a complete sampled and held analog signal. The accuracy of reproducing a stored analog signal typically depends on the full range of cell current and the signal to noise ratio.

An EEPROM cell, disclosed by Bleiker et al. in an article entitled "A Four-State EEPROM Using Floating-Gate Memory Cells", IEEE Journal Of Solid State Circuits, Vol. SC-22, No. 3, pages 460–463, June 1987, stored two bits of data. The four distinguishable states of this cell were defined by the levels of cell current detected. Each state was characterized by an upper and lower current limit. However, as is well known to those skilled in the art, to accurately detect the data stored in the memory cell within a reasonable read time, the current level used to characterize the least significant bit (LSB) must be large enough to yield an acceptable signal to noise ratio. Moreover, for a given LSB, the range of cell current must be increased to store additional bits of data per memory cell.

To increase cell current without changing the channel length, prior art methods typically increased the transistor width. However, an increase in transistor width increases memory cell size for conventional planar cells (such as cells 100, 200, and 300), i.e. cells which have source, drain and gate regions above and/or near the surface of the substrate.

To decrease memory cell size while providing increased cell current, Yoshida, et al. disclosed a vertical EPROM/EEPROM cell in U.S. Pat. No. 5,049,956, issued Sep. 17, 1991. Referring to FIG. 4 of this specification, a vertical stacked gate EEPROM cell 400 is formed on the side wall 406 of a trench 407 etched to source region 402 which is buried in substrate 401. The width of cell 400, which equals the perimeter of trench 407, is roughly four times that of planar cell 200 (FIG. 2) but occupies the same silicon area. However, this structure, like cell 200, lacks a select transistor and thus has no cell-by-cell erasability. Moreover, the thin gate insulation 408 which overlies the entire channel region 403 induces reliability and yield problems. Further, the uneven topography of cell 400, created by the projection of floating gate 405 above the surface of the array, further worsens reliability and yield.

Therefore, a need arises for a reliable memory cell capable of storing multiple data bits while occupying a small surface area of the chip.

SUMMARY OF THE INVENTION

In accordance with the present invention, a vertical memory cell uses a predetermined surface area of a chip regardless of the features integrated in the cell. The vertical memory cell comprises a buried source region, a drain region, a channel region formed between the source and drain regions, a floating gate insulated from the drain, channel, and source regions, and a control gate insulated from the floating gate.

In one embodiment of the present invention, the floating gate includes a first and a second portion, wherein each portion is spaced independently from the drain region, i.e. the insulation between the first portion and the drain region is formed thicker than the insulation between the second portion and the drain region. During erase operations, electrons tunnel between the second portion of the floating gate, which overlies the drain region, and the drain region. The reduced tunnel area associated with the second portion provides significant improvements in reliability and yield over prior art cells which provide tunnel oxide adjacent the whole channel region.

In another embodiment of the present invention, the drain region includes an extended drain region to provide a tunneling electrical field enhancement effect. This extended drain region is made from polysilicon, for example, which lowers the voltage required to achieve tunneling from the floating gate to the drain region. Thus, this embodiment also improves manufacturing yield by allowing for thicker insulation to be used between the floating gate and the channel region.

In yet another embodiment, the vertical memory cell further includes an erase/program gate positioned between the drain region and the control gate, and in operative relation to the floating gate and the source and drain regions. A predetermined voltage bias on the control gate and the erase/program gate allows electrons to tunnel between the erase/program gate and the floating gate during program and erase operations. In this manner, the present invention provides cell-by-cell erasing and programming.

In another embodiment of the present invention, the vertical memory cell comprises a first transistor formed in a first trench in a substrate and a second transistor formed in a second trench in the substrate. The first and second trenches are aligned, thereby forming a split channel structure. The first transistor is typically a floating gate storage transistor, while the second transistor is typically a series select transistor. The series select transistor eliminates any potential read errors caused by an over-erased floating gate. Specifically, if the series select transistor is off, no current flows between the source region and the drain region, even if the floating gate transistor is in a depletion mode.

Additional features, such as the segmented floating gate, the extended drain region, and the erase/program gate, are incorporated into this split channel structure in other embodiments without increasing the required surface area of the chip.

In further accordance with the present invention, the above-described vertical memory cells form a mass storage system that accepts either digital or analog input signals and reproduces the stored information in either form. This mass storage system includes a plurality of vertical memory cells which are prewritten to store a set of references for writing, reading, and digital-analog conversions. The number of references required for storing n bits of data per memory cell is $2^n+1$. The state of each cell is characterized by two references: an upper limit and a lower limit.

For each digital input signal, a pair of references is selected according to the state that represents the input signal. Based on this set of references, the voltage of the erase/program gate and the control gate are varied to perform the appropriate erase and program functions such that the input signal is written into a memory cell. For each sampled and held analog input signal $S_a$, the set of references used to vary voltages for writing is $S_a \pm \frac{1}{2}$ LSB, where LSB (the least significant bit) is the difference between two adjacent states.

To output stored information as an analog signal, the memory cell current is provided to one input of a differential amplifier. A reference level of maximum channel conducting is provided to the other input to the differential amplifier to compensate for variations in the performance of the storage cell due to temperature and supply voltage fluctuations. The output signal of the differential amplifier is the analog output of the memory cell.

To output stored information as a digital signal, the cell current or bit line voltage is fed to a set of comparators to compare with each reference in parallel. Then, the output signals from the comparators are encoded to provide the output digital data.

DESCRIPTION OF THE DRAWINGS

FIG. 18 shows a schematic diagram showing how each digital data is represented by a pair of references.

DETAILED DESCRIPTION OF THE DRAWINGS

I. Vertical EEPROM Cells

In accordance with the present invention, all vertical EEPROM cells take up identical surface area on the chip regardless of the different features integrated into each cell. These features include, for example, a floating gate which partially overlies the drain region, an extended drain region, a separate erase/program gate, and a series select transistor.

1. Vertical Stacked Gate EEPROM

Figure 1A:
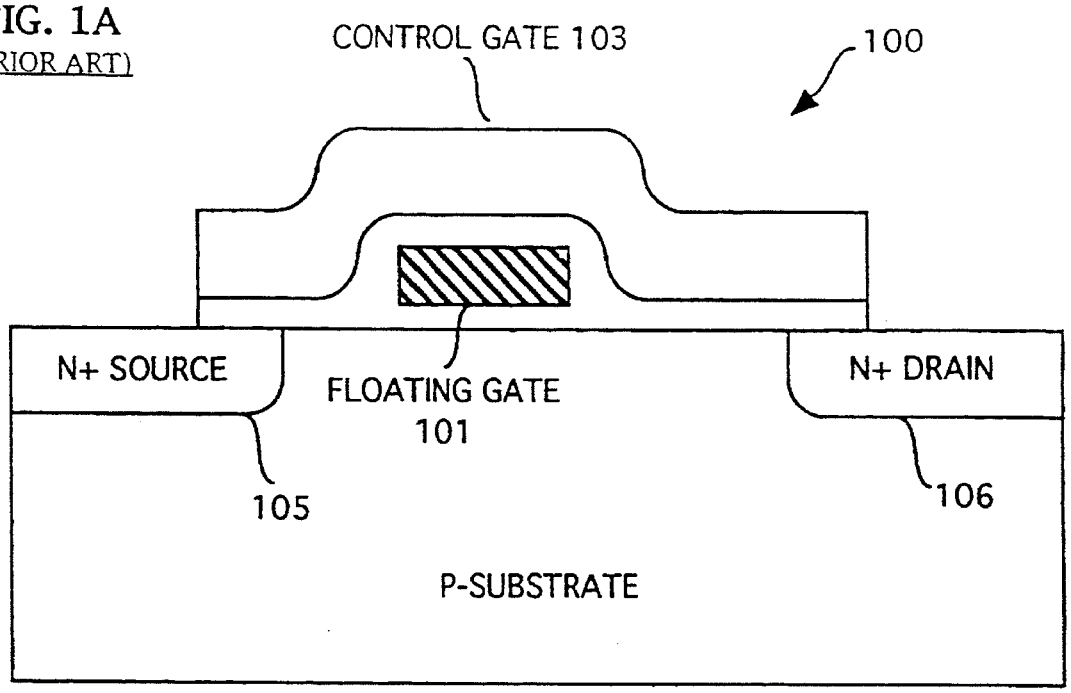
FIGS. 1A and 1B show cross-sectional views of the split channel flash-EEPROM cell of Masuoka with separate erase gate along a bit line and a word line, respectively.
Figure 1B:
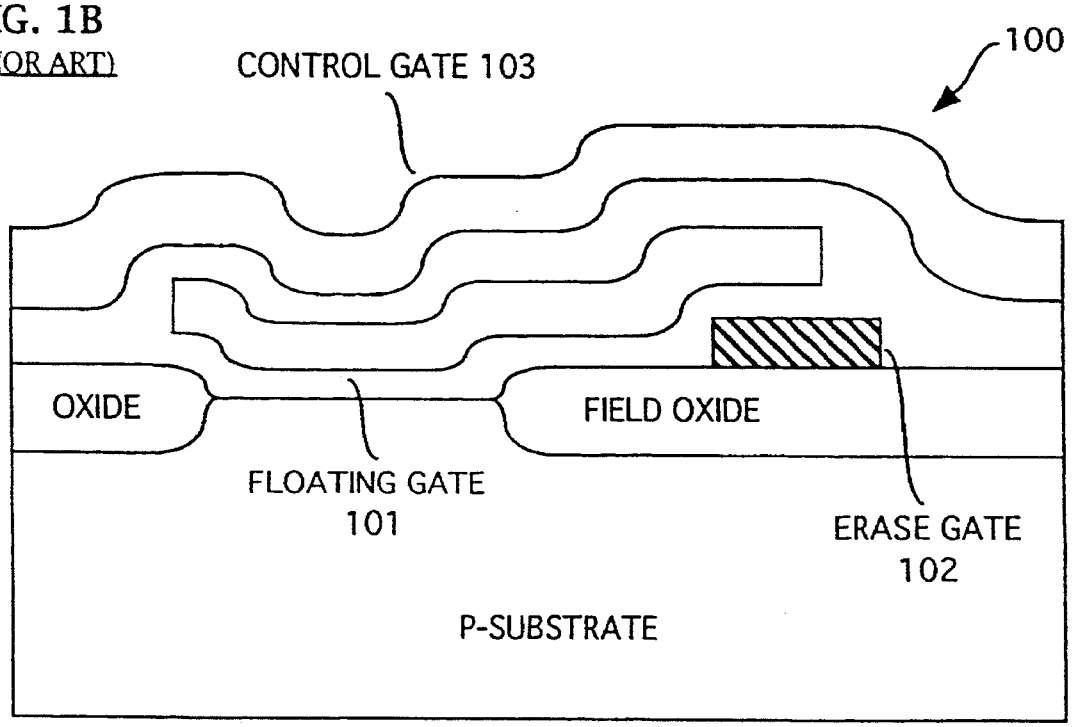
Figure 2:
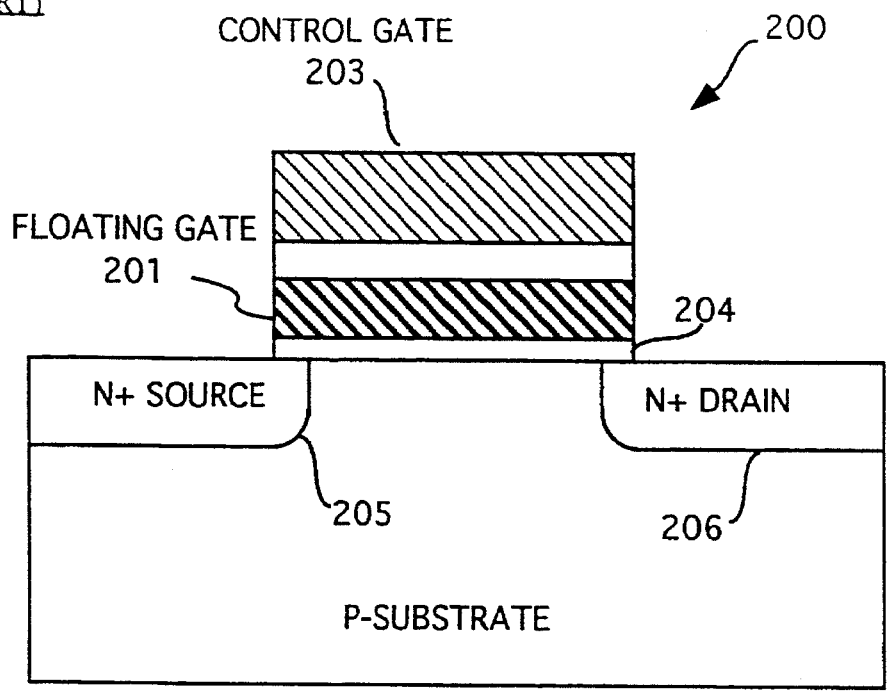
FIG. 2 illustrates a cross-sectional view of the stacked gate flash-EEPROM cell of Mukherjee et al. along a bit line.
Figure 3:
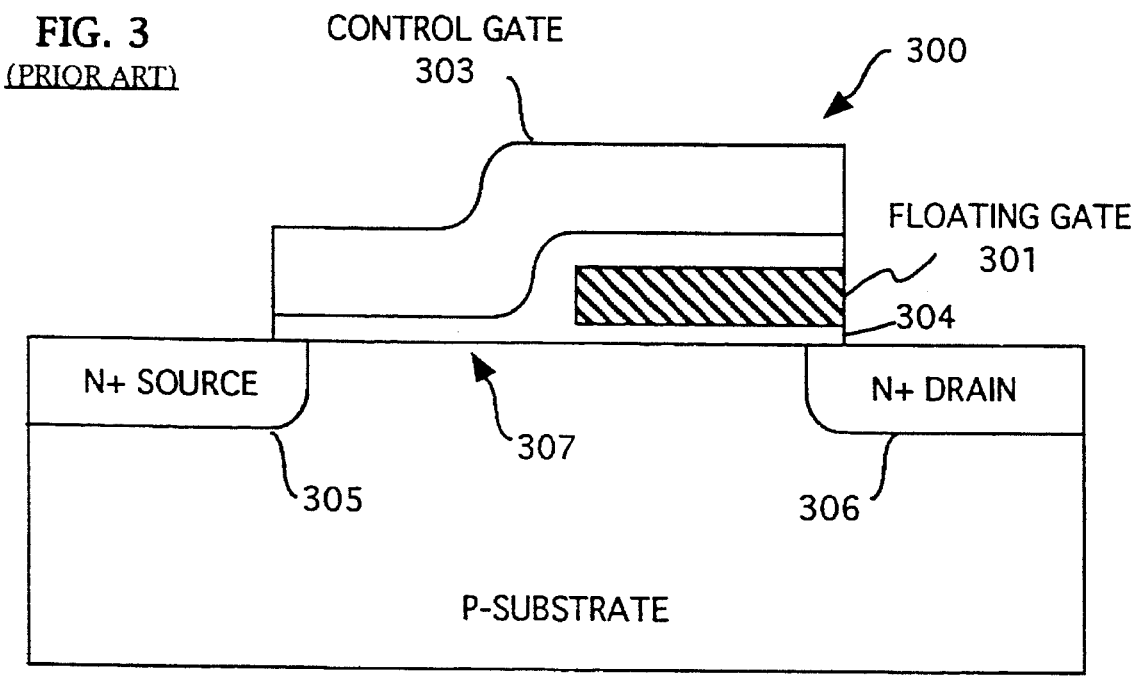
FIG. 3 shows a cross-sectional view of the split channel Flash-EEPROM cell of Samachisa et al. along a bit line.
Figure 4:
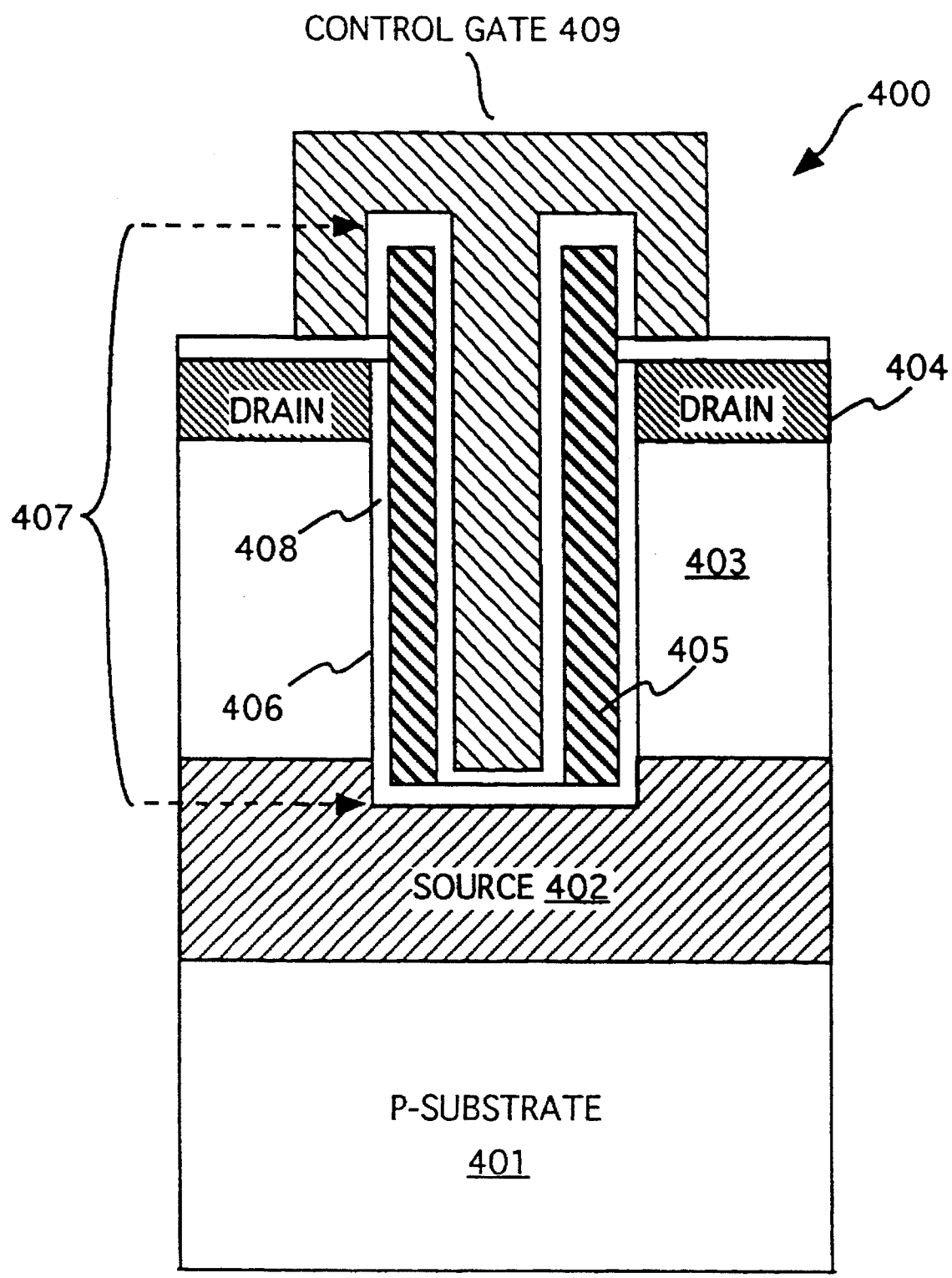
FIG. 4 illustrates a cross-sectional view along a bit line of the EPROM/EEPROM cell of Yoshida et al. formed in a trench.
Figure 5A:
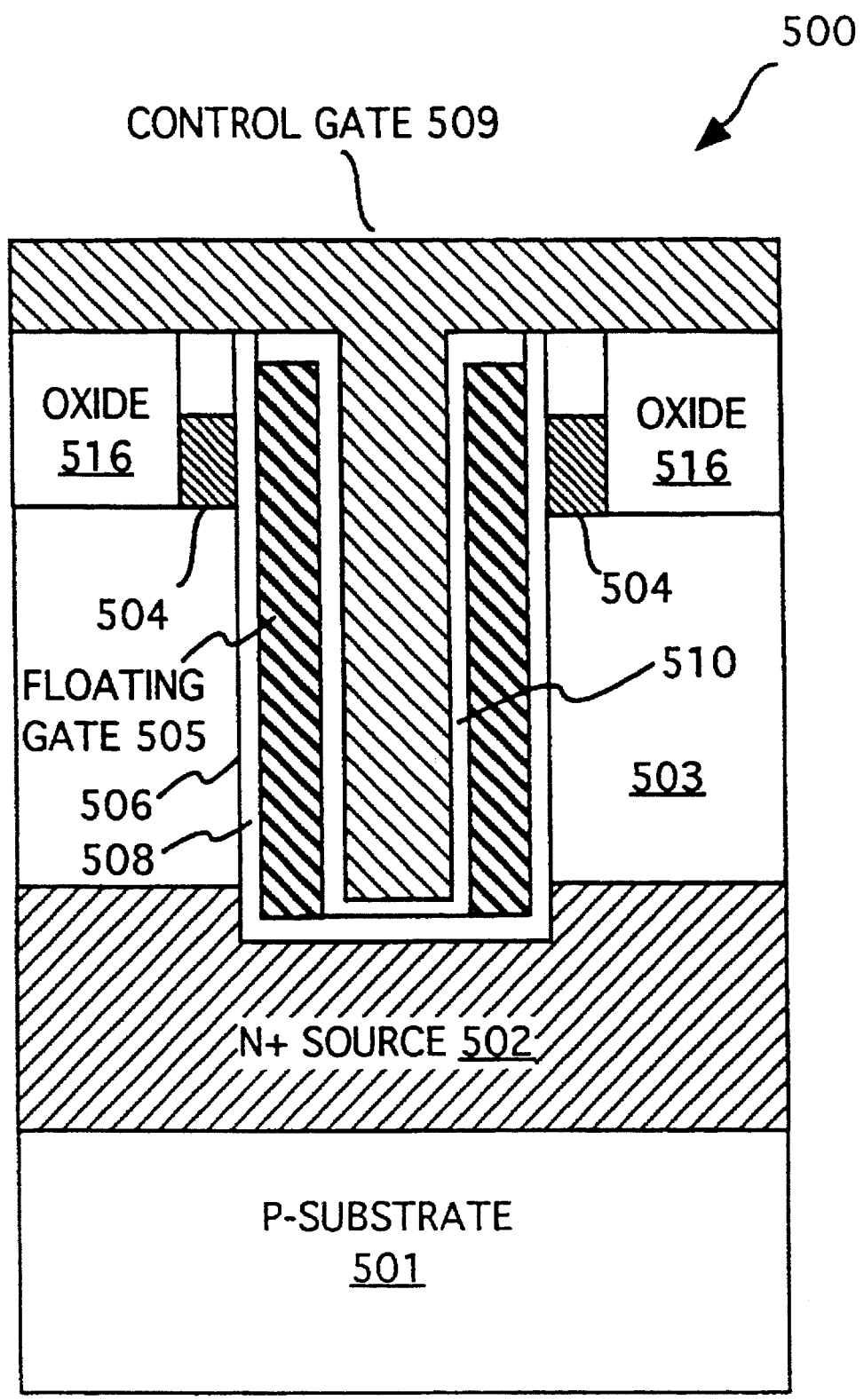
FIGS. 5A and 5B show cross-sectional views of a vertical stacked gate EEPROM cell along a word line and a bit line, respectively.
Figure 5B:
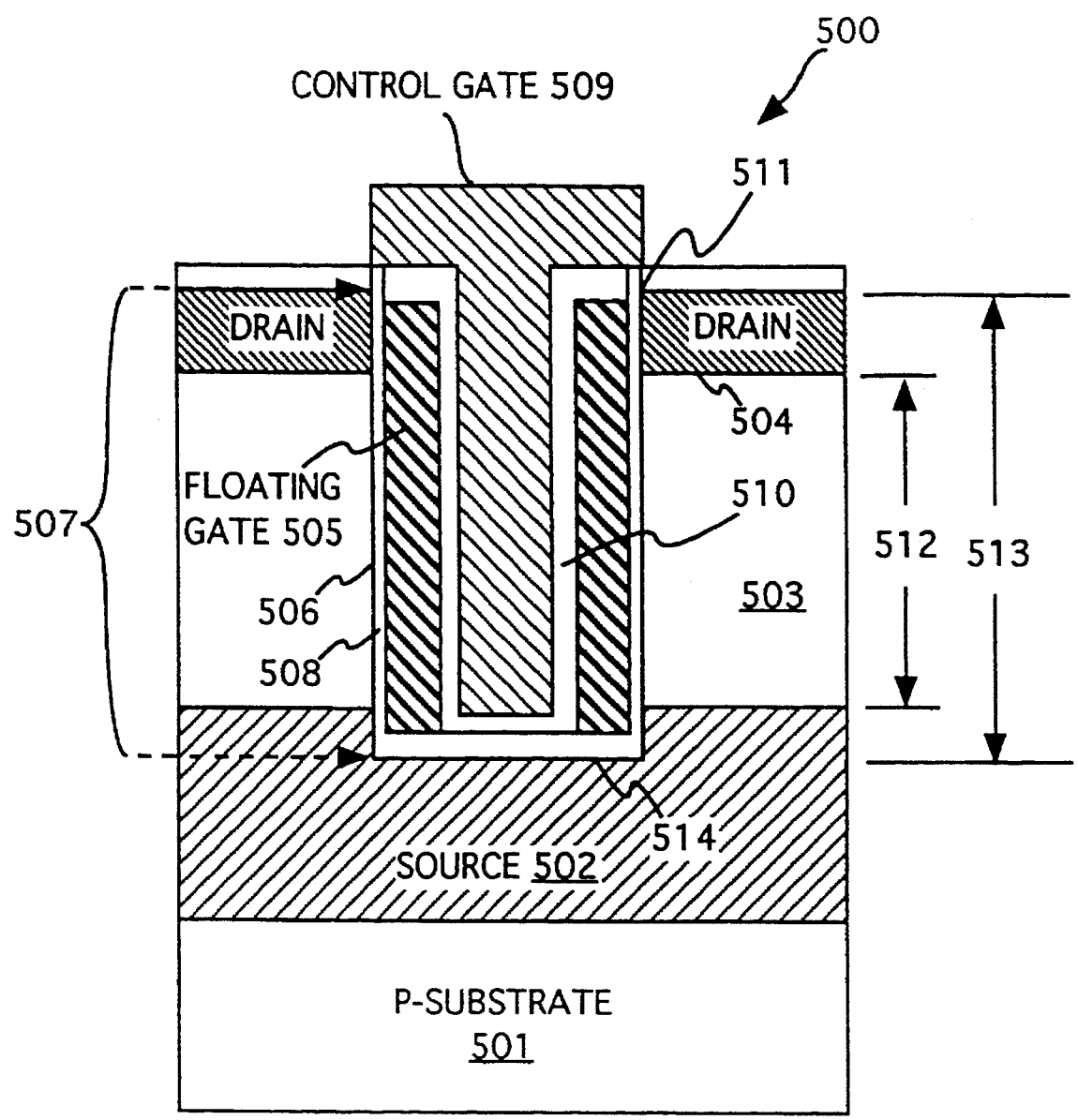

FIGS. 5A and 5B show cross-sectional views of a vertical stacked gate EEPROM transistor 500 in accordance with the present invention along a word line and a bit line, respectively. As shown in FIGS. 5A and 5B, a channel region 503 is formed on top of a source region 502, and a drain region 504 is formed on top of the channel region 503. Drain regions 504 of memory cells sharing the same bit line are connected by N+ diffusion, thereby eliminating the need for metal to diffusion contacts along the bit line.

Floating gate 505 is formed on the sidewalls 506 of a trench 507. Gate dielectric film 508 is formed between floating gate 505 and source region 502, drain region 504, as well as channel region 503. Control gate 509, formed adjacent to floating gate 505 in trench 507, covers floating gate 505. The control gate 509 is insulated from floating gate 505 and source region 502 by a layer of interpolysilicon dielectric film 510.

The transistor channel width of cell 500 is equal to the perimeter of trench 507 as defined by the trench opening on the surface of the chip, provided that sidewalls 506 of trench 507 are formed anisotropically and drain region 504 is formed on all edges 511 of trench 507. Transistor channel length 512, which is the distance between source region 502 and drain region 504, is determined by the thickness of channel region 503 rather than trench depth 513. To ensure channel conductivity, the bottom 514 of trench 507 extends to source region 502. Cell 500 is programmed by conventional hot electron injection and is flash erased by electron tunneling from floating gate 505 to either source region 502 or drain region 504.

2. Vertical Stacked Gate EEPROM with Separate Tunnel Oxide Layer

Figure 6:
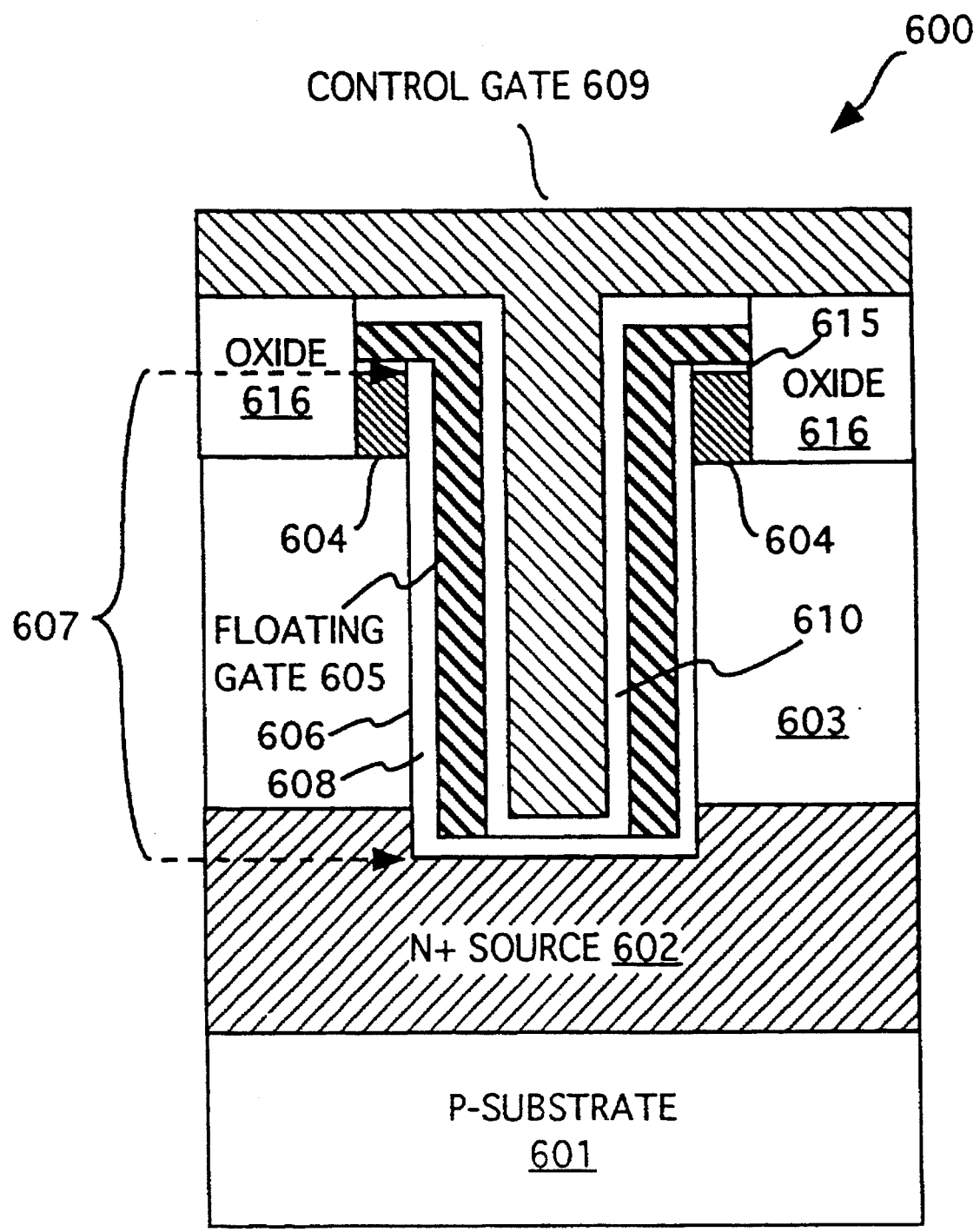
FIG. 6 illustrates a cross-sectional view along a word line of a vertical stacked gate EEPROM cell with tunnel oxide formed on the top surface of the drain region.

In another embodiment of the present invention shown in FIG. 6, a vertical stacked gate EEPROM cell 600 has a tunnel oxide layer 615 formed on the top surface of drain region 604. Transistor 600 is programmed by conventional hot electron injection and flash erased by electron tunneling from floating gate 605 to drain region 604. Because floating gate 605 now overlies drain region 604 between the trench 607 and bit line isolation 616, all tunneling during erasing occurs through tunnel oxide layer 615. As a result, the thickness of gate dielectric film 608 is increased relative to the thickness of tunnel oxide layer 615. This thicker gate dielectric film 608 provides significant improvements in reliability and yield when compared to, for example, prior art cells 200, 300 having thin gate isolation layers 204 and 304, respectively, which completely cover the channel region. The thickness of gate oxide 608 on channel region 603 is typically 10 to 30 nanometers thicker than gate oxide 508 (FIG. 5). FIG. 6 illustrates a cross-sectional view of EEPROM cell 600 along a word line in the array. The cross-sectional view of transistor 600 along a bit line is identical to that of the vertical stacked gate memory cell 500 shown in FIG. 5A.

3. Vertical Stacked Gate EEPROM with Extended Drain Region

Figure 7A:
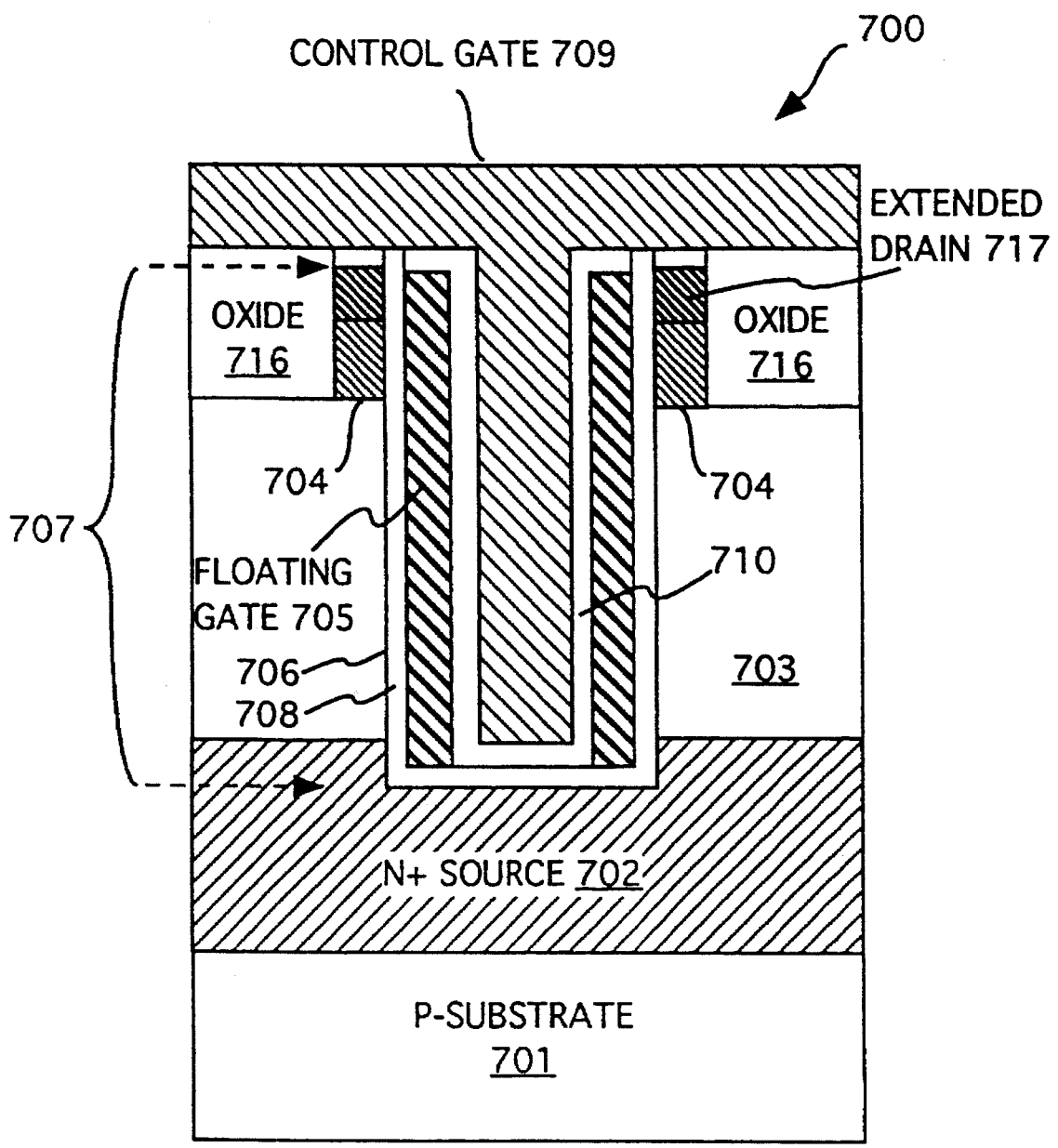
FIGS. 7A and 7B show cross-sectional views of a vertical stacked gate EEPROM cell with an extended drain region along a word line and a bit line, respectively.
Figure 7B:
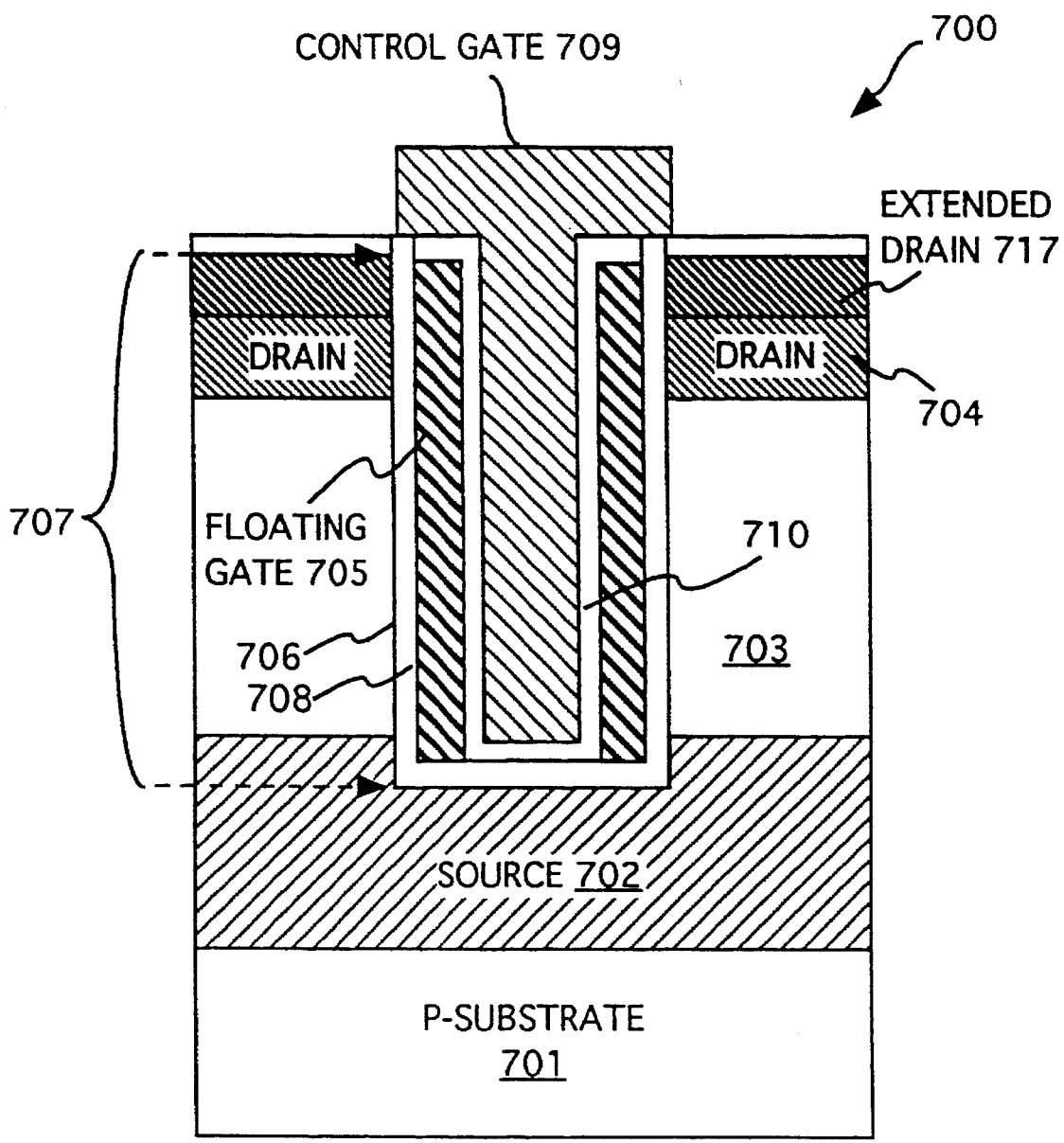

FIGS. 7A and 7B show cross-sectional views of a vertical stacked gate EEPROM cell having an extended drain region 717 along a word line and a bit line, respectively. This extended drain region 717, typically formed from polysilicon, provides a tunneling electrical field enhancement effect. It is well known to those skilled in the art that oxide grown thermally on a pretreated polysilicon surface (polysilicon heavily doped with an N+ dopant) provides a localized enhanced electrical field across the oxide, thereby lowering the voltage required to be applied across the oxide to achieve electron tunneling compared to the applied voltages required for oxide grown on a monocrystal silicon surface. In other words, the polysilicon surface of extended drain region 717 allows the oxide, i.e., gate dielectric film 708, to be grown thicker without increasing the voltage to achieve electron tunneling. Typically, gate dielectric film 708 is grown to a thickness between 20 and 40 nanometers. Because of the increased thickness of gate dielectric film 708, cell 700, like cell 600, significantly reduces prior art manufacturing yield problems. Memory cell 700 is programmed by conventional hot electron injection and flash erased by electron tunneling from floating gate 705 to extended drain region 717.

4. Vertical Stacked Gate EEPROM with Separate Erase/Program Gate

Figure 8A:
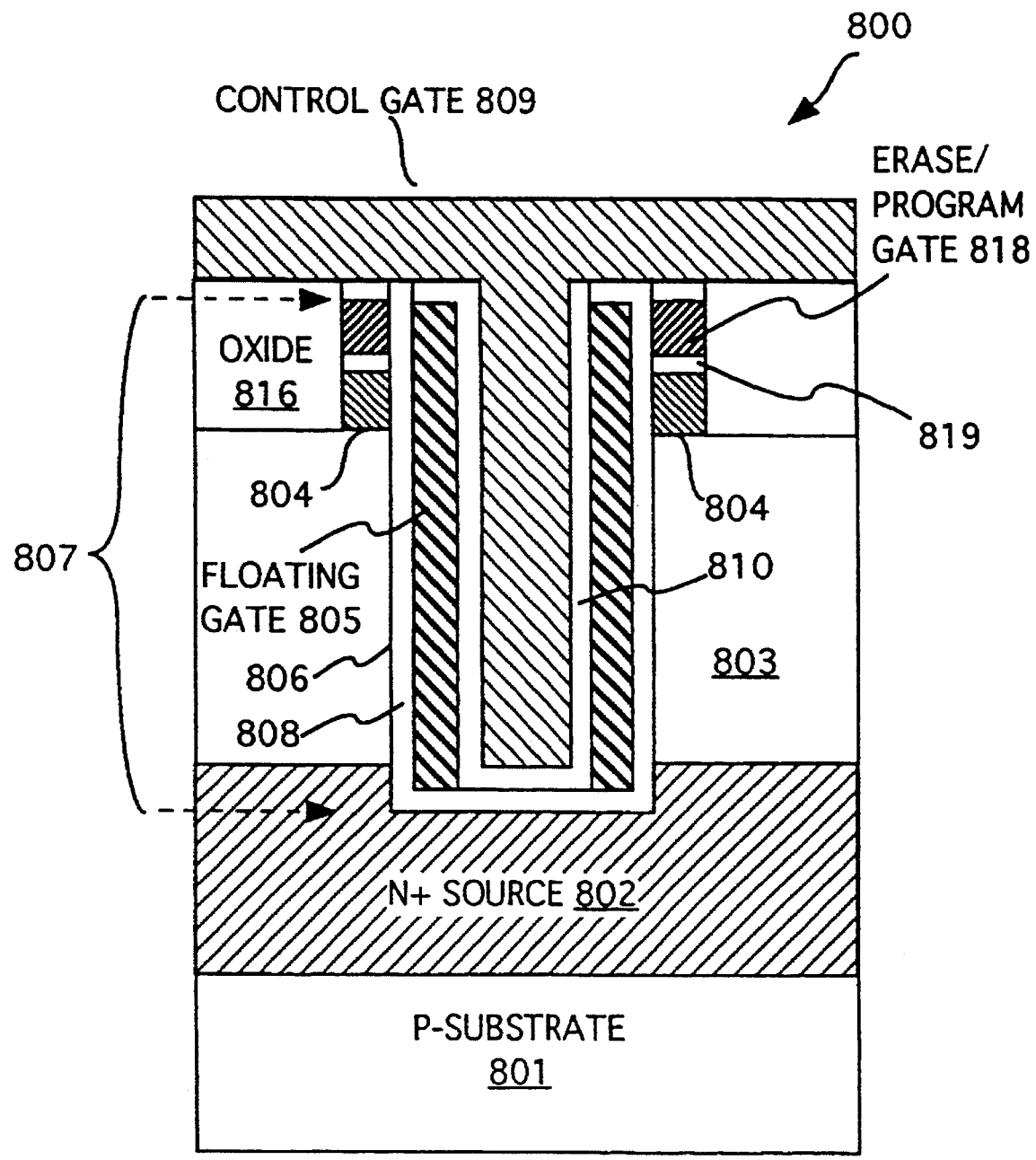
FIGS. 8A and 8B illustrate cross-sectional views of a vertical stacked gate EEPROM cell with a separate erase/program gate along a word line and a bit line, respectively.
Figure 8B:
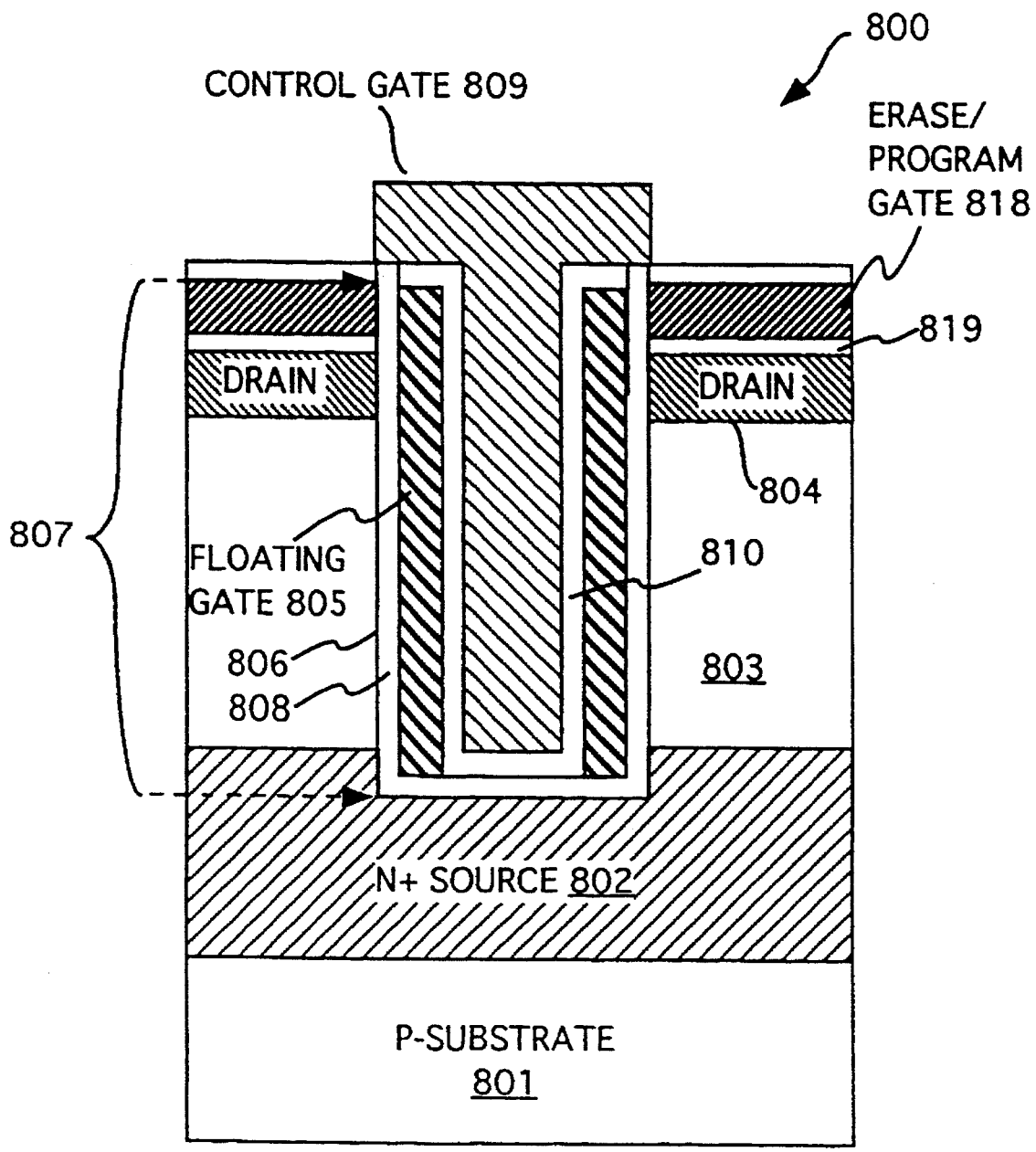

In another embodiment of the present invention, shown in FIGS. 8A and 8B, memory cell 800 is erased by electrons tunneling from floating gate 805 to a separate erase/program gate 818. Memory cell 800 is programmed, in contrast, by electrons tunneling from erase/program gate 818 to floating gate 805. A dielectric film layer 819, typically a silicon oxide having a thickness of 30 to 50 nanometers, is provided to electrically isolate drain region 804 from erase/program gate 818. Providing an appropriate voltage bias to memory cell 800, such as −6 V to −12 V on control gate 809 and +5 V to +8 V on erase/program gate 818, erases memory cell 800 without disturbing the unselected memory cells. In a similar manner but using the opposite polarities of the voltage bias condition described above, memory cell 800 is programmed by electrons tunneling from erase/program gate 818 to floating gate 805. Therefore, by using erase/program gate 818, cell-by-cell erasability is achieved.

5. Vertical Split Channel EEPROM with Separate Erase/Program Gate

Figure 9A:
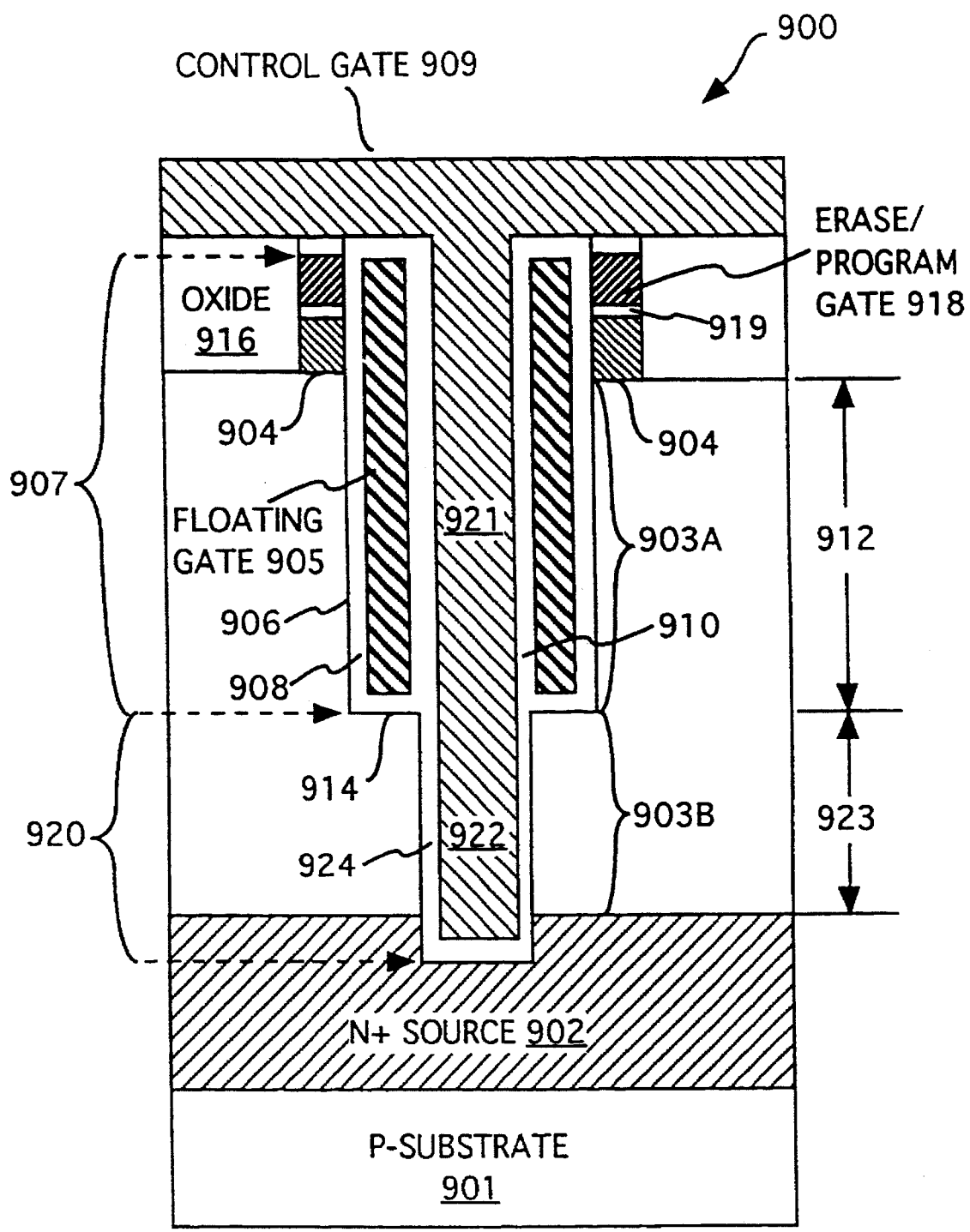
FIGS. 9A and 9B show cross-sectional views of a vertical split channel EEPROM cell with a separate erase/program gate along a word line and a bit line, respectively.
Figure 9B:
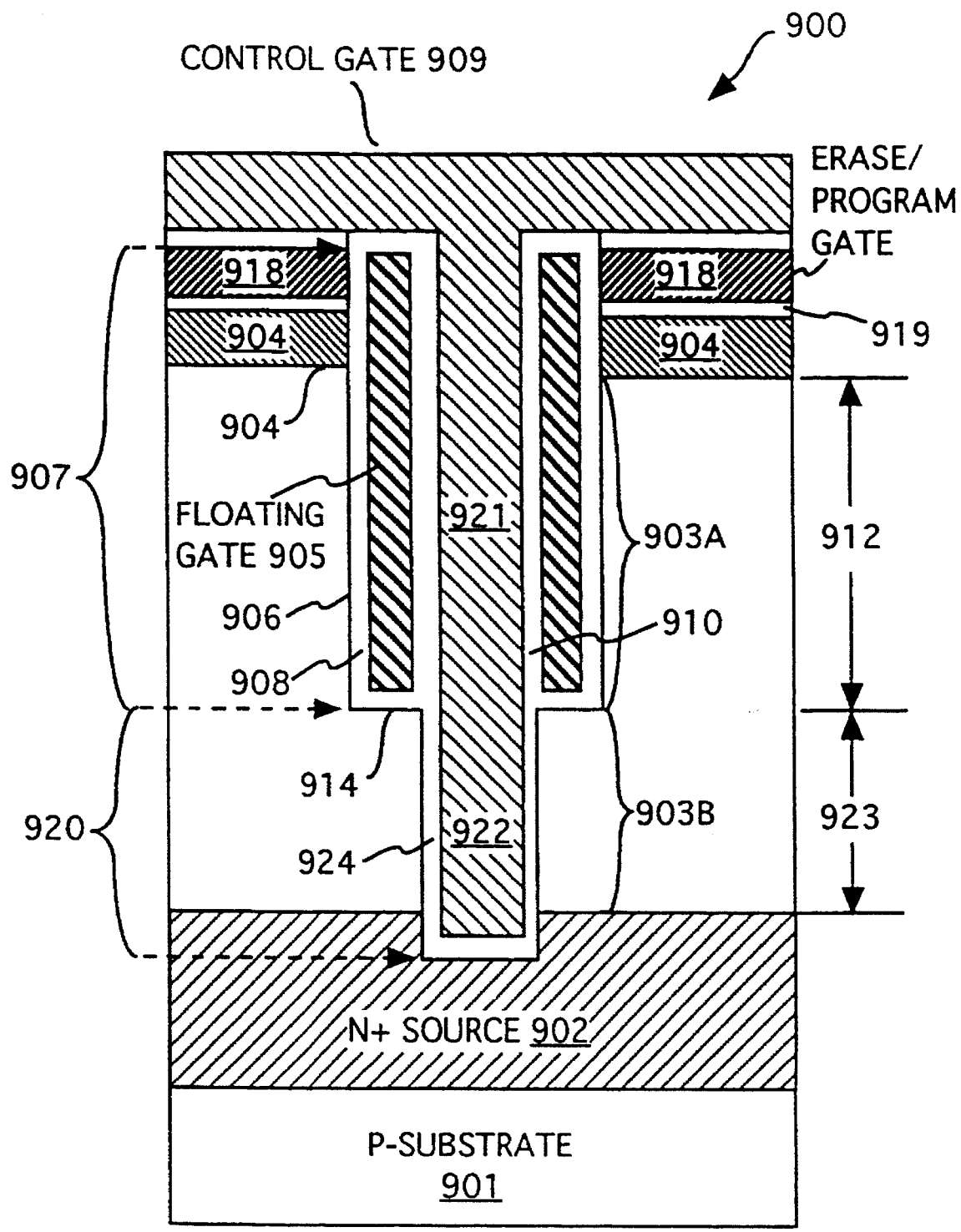

In accordance with another embodiment of the present invention, shown in FIGS. 9A and 9B, a series select transistor 922 is included in vertical split channel memory cell 900, thereby expanding the use of memory cell 900 in the depletion mode and eliminating potential read errors caused by an over-erased floating gate. Series select transistor 922 is integrated into the split channel EEPROM cell structure by adding another trench 920 adjacent to trench 907, thereby forming a split channel EEPROM structure. FIGS. 9A and 9B show cross-sectional views of vertical split channel EEPROM cell 900 with separate erase/program gate 918 along a word line and a bit line, respectively.

In this embodiment, two transistors are formed in series: transistor 921 formed in trench 907 and transistor 922 formed in trench 920. Transistor 921 is the floating gate transistor with channel length 912 determined by the edge of drain 904 and the bottom of trench 914 and with the channel width determined by the perimeter of trench 907. Transistor 922 is the series select transistor with channel length 923 determined by the distance between the bottom of trench 914 and source region 902, and with the channel width determined by the perimeter of the second trench 920.

Note that trench 920 is self-aligned to the inner edges of floating gate 905 inside trench 907. Control gate 909 of floating gate transistor 921 extends through trench 920 to source region 902. Control gate 909 is in operative relation to channel region 903B of transistor 922 and is insulated from channel region 903B and source region 902 by a layer 924 of gate oxide having a thickness of 20 to 40 nanometers. If series select transistor 922 is off, no current flows between source region 902 and drain region 904 even if floating gate transistor 921 is in the depletion mode. Note that channel region 903 is thicker than, for example, channel region 803 (FIGS. 8A and 8B) to accommodate the additional trench 920. However, as shown in FIGS. 9A and 9B, the present invention provides a vertical split channel EEPROM cell 900 having a separate erase/program gate 918 and a select transistor 922 without requiring additional surface area on the chip.

II. Methods of Manufacturing Vertical EEPROM Cells

Typically, a plurality of memory cells are grouped together to form the memory core of a semiconductor storage device. Other circuits surrounding the memory core perform functions such as decoding, accessing, memory erasing, programming, sensing, and data buffering. Due to some relatively high voltage circuits on chip, planar thick gate oxide MOSFETs (i.e. having gate oxide thickness in the range of 35 to 65 nanometers) are needed in addition to conventional planar MOSFETs (i.e. having gate oxide thickness in the range of 15 to 35 nanometers). The methods of manufacturing EEPROM cells in accordance with the present invention are compatible with the manufacturing of both types of MOSFETs.

1. Vertical Split Channel EEPROM with Separate Erase/Program Gate

In accordance with the present invention, the transistor trench is either non-self-aligned or self-aligned to the edge of the bit line isolation. In the non-self-aligned configuration, all four edges of the trench are defined by a photomask. The distance between the trench edge and the edge of the bit line isolation is larger than the sum of the minimum drain width required for each side of the trench and the minimum lithographical alignment tolerance. In the self-aligned configuration, a spacer formed on the sidewall of the bit line isolation defines two edges of the trench parallel to the bit line. Thus, the trench edges parallel to the bit line are self-aligned to the bit line isolation and the minimum lithographical alignment tolerance is not required to be part of the spacing between the trench and the bit line isolation.

Figure 10A:
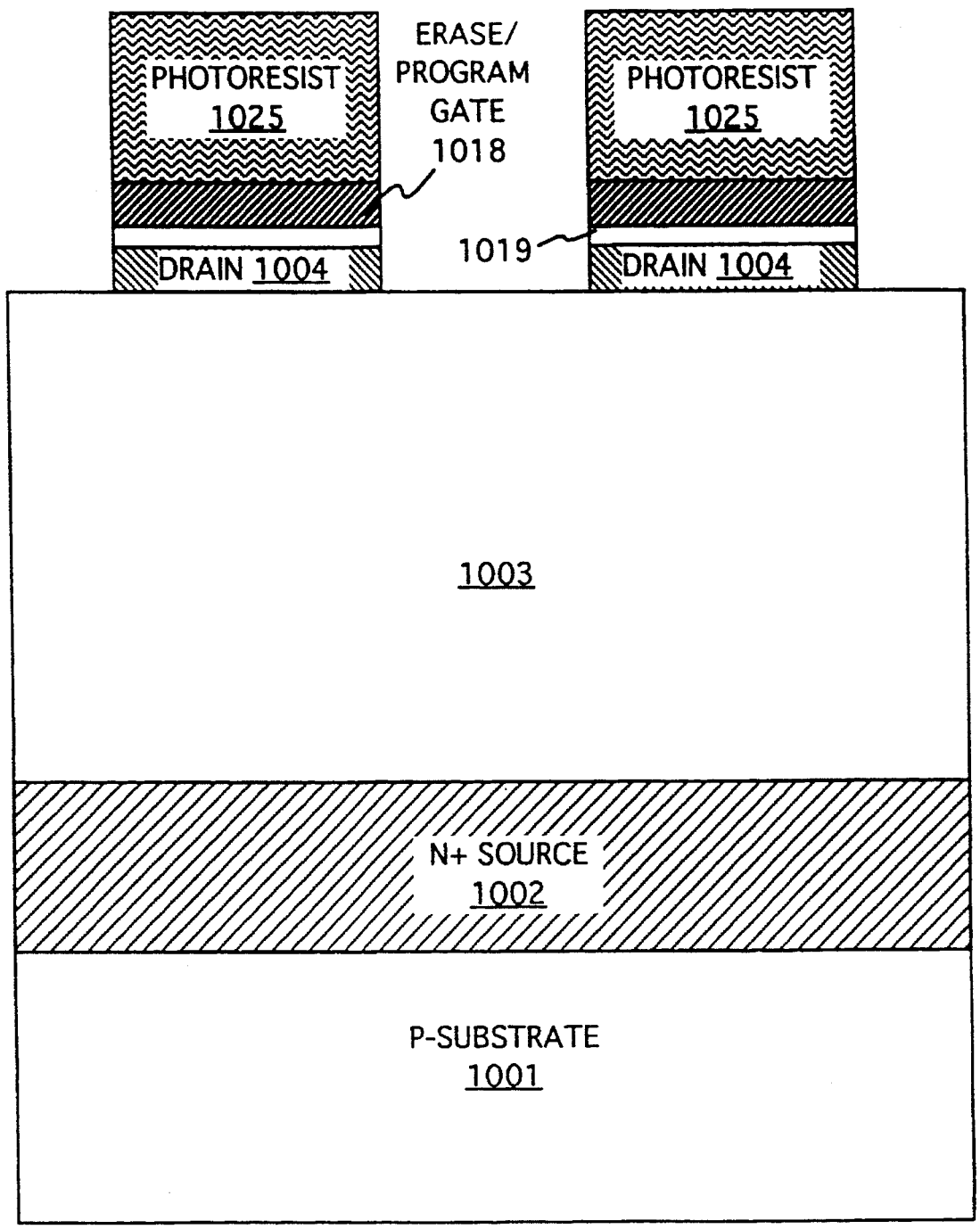
FIGS. 10A through 10E illustrate cross-sectional views along a word line of two vertical split channel EEPROM cells with separate erase/program gates at various stages in fabrication in a non-self-aligned process.

FIGS. 10A through 10E illustrate cross-sectional views along a word line of two vertical split channel EEPROM cells having separate erase/program gates and non-self-aligned trenches at various stages in fabrication. Referring to FIG. 10A, a P-type single crystal silicon substrate 1001 is lightly doped with boron to a resistivity ranging from 10 to 60 ohms-centimeter. A heavily doped N+ buried layer 1002 is formed on substrate 1001 in the memory core area and in the N-well area in the periphery of the memory device. Preferably, buried layer 1002 has a low sheet resistance of, for example, 20 to 150 ohms per square. This low sheet resistance minimizes the number of ground pick-ups in the memory core and ensures that the potential of buried layer 1002 (also referred to as the source region) is not raised during cell operations.

A layer 1003 of silicon epitaxial film approximately 1.5 to 3 micrometers thick is then deposited on top of N+ buried layer 1002 and P-type single crystal silicon substrate 1001. In one embodiment, layer 1003 is very lightly N-doped to a resistivity higher than 1 ohm-centimeter. After epitaxial deposition, conventional well formation in the array and the periphery is performed. The P-wells in the memory core (from which the channel regions will be formed) typically have a doping concentration of about $1\times10^{16}$ cm$^{-3}$ to $2\times10^{17}$ cm$^{-3}$, whereas the P-wells in the periphery have a doping concentration consistent with conventional planar N-channel MOSFETs of about $5\times10^{15}$ cm$^{-3}$ to $2\times10^{16}$ cm$^{-3}$. The N-wells in the periphery have a doping concentration consistent with conventional planar P-channel MOSFETs of about $8\times10^{15}$ cm$^{-3}$ to $4\times10^{16}$ cm$^{-3}$.

Following well formation, the memory core area is covered with a silicon nitride layer (not shown) to prevent oxide from growing in this area during the subsequent peripheral field oxidation. Conventional local oxidation of silicon (LOCOS) is then used to form isolated channel regions for the peripheral planar MOSFETs. The silicon nitride layer is then etched away in a conventional manner.

To form the drain regions of the to-be-formed vertical EEPROM transistors, arsenic is implanted in the memory core area at a dose of $5\times10^{15}$ cm$^{-2}$ to form layer 1004. A typical thickness of layer 1004 after full process completion is about 250 to 400 nanometers. Layer 1004 is then thermally oxidized to grow a layer of oxide 1019 about 35 to 65 nanometers thick followed by deposition of a heavily N+ doped polysilicon layer 1018 to a thickness of about 150 to 400 nanometers. Layer 1019 isolates layer 1004 from polysilicon layer 1018, and also serves as the gate oxide of the MOSFETs in the periphery.

Photoresist layer 1025 is deposited on polysilicon layer 1018 and then patterned. Subsequent to patterning, polysilicon layer 1018, oxide layer 1019, and N+ doped layer 1004 are anisotropically etched as shown in FIG. 10A. This etching defines the bit lines, i.e. drain regions, which are formed from layer 1004. Layer 1018 provide the erase/program gates of the EEPROM cells in the array, as well as the gate electrodes for the peripheral MOSFETs.

Figure 10B:
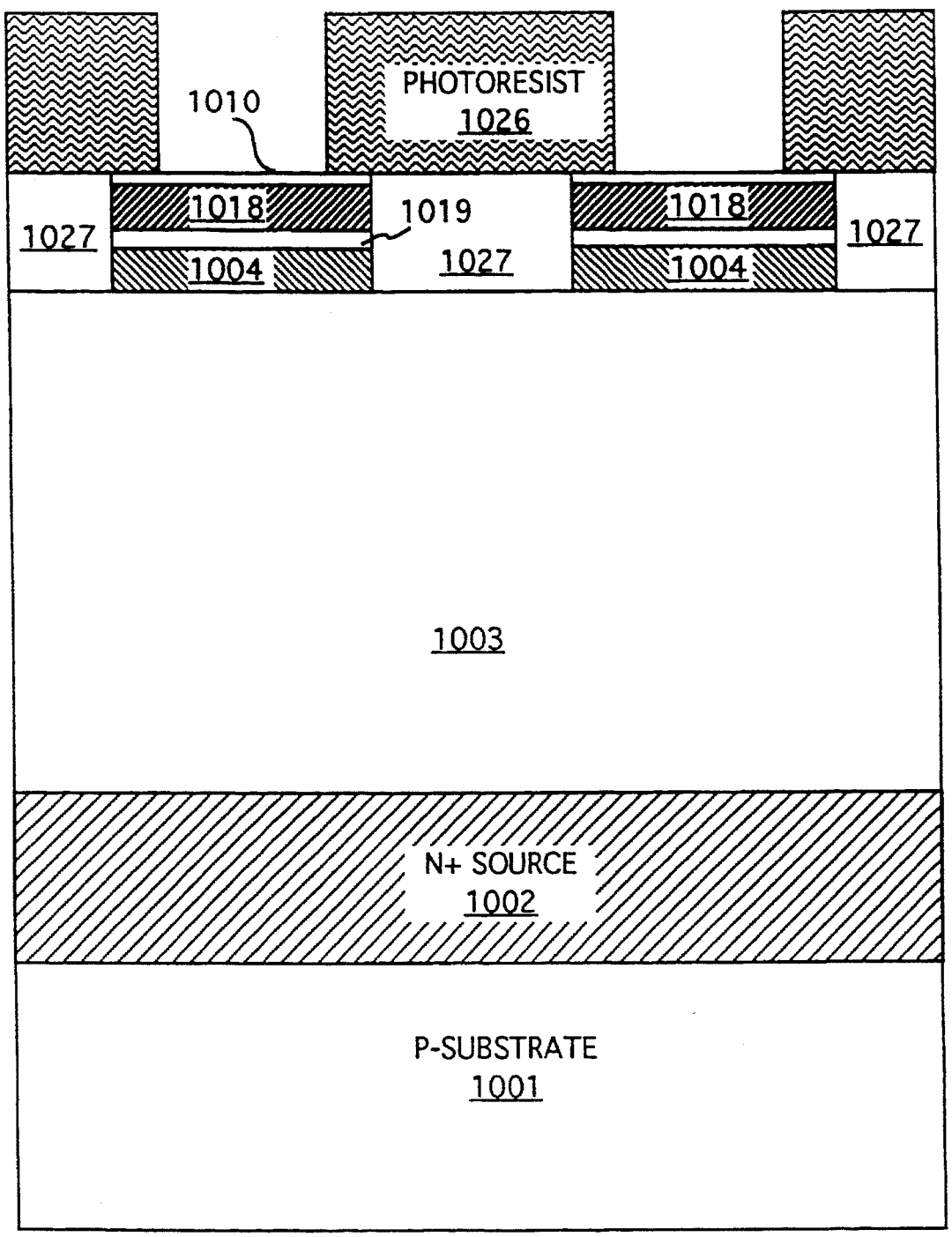
Figure 10C:
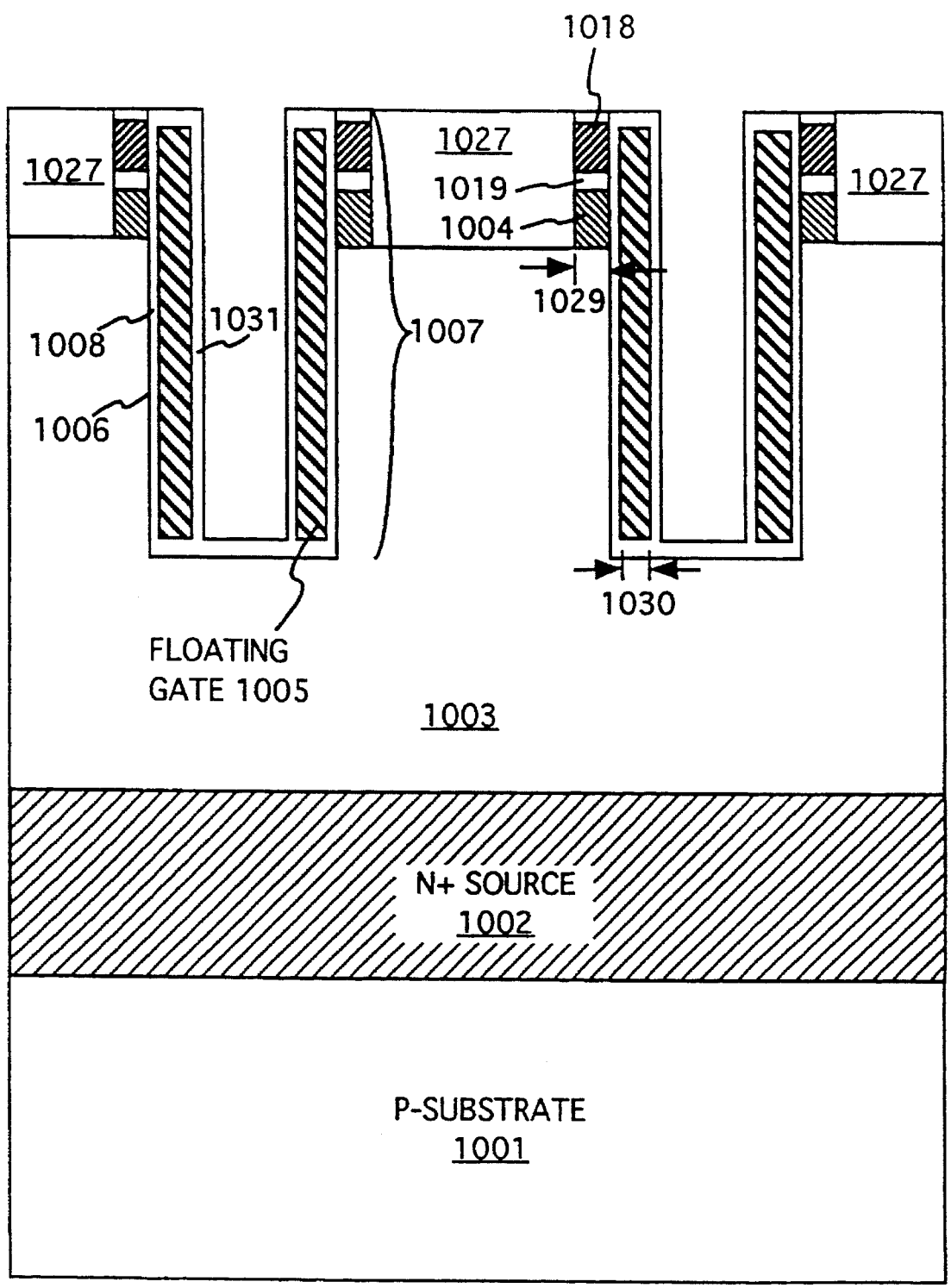

In one embodiment, a low dose boron implantation on partially-exposed layer 1003 ensures proper isolation between adjacent bit lines. Bit line isolation is completed by depositing a layer 1027 of CVD oxide on the array to a thickness of about 800 to 1000 nanometers. Layer 1027 is then planarized using a conventional resist planarization and etch back to leave an oxide layer 1010 (about 100 to 200 nanometers) on polysilicon layers 1018. In another embodiment, a LOCOS method is used to form the isolation for the bit lines. Photoresist layer 1026 is then deposited on the array and patterned as shown in FIG. 10B to define the rectangular trench opening 1007 (see FIG. 10C).

Vertical EEPROM transistor trenches 1007 are subsequently formed by an anisotropic etch through oxide layer 1010, polysilicon layer 1018, oxide layer 1019, N+ doped diffusion region 1004, and epitaxial layer 1003. Trench 1007, in one embodiment of the present invention, is deep enough to accommodate a floating gate transistor with a channel length ranging from 0.6 to 1.0 micrometers. Trench sidewalls 1006 are preferably perpendicular to the surface of silicon substrate 1001 and have minimal etch damage left on them. The minimum spacing 1029 between trench sidewall 1006 and bit line isolation 1027 is greater than the sum of the drain width required per trench edge and the process tolerance associated with the photomasking process.

A layer 1008 of thermal oxide having a thickness of about 20 to 40 nanometers is grown on trench sidewalls 1006 and at the bottom of trench 1007. In one embodiment, oxide layer 1008 is grown at a relatively high temperature of, for example, 950°–1000° C. and in a dry oxygen ambient so that an enhanced oxidation caused by high dopant concentration in drain region 1004 and erase/program gate 1018 can be minimized.

After this oxidation process, a layer of heavily phosphorus doped N+ polysilicon is deposited and anisotropically etched back without using any mask to form polysilicon floating gate 1005. The thickness 1030 of floating gates 1005 is typically 50 to 200 nanometers. Then a layer 1031 of interpoly dielectric film or a combination of dielectric films (such as oxide and nitride) is deposited to a thickness of about 20 nanometers on the exposed surfaces of floating gates 1005.

Figure 10D:
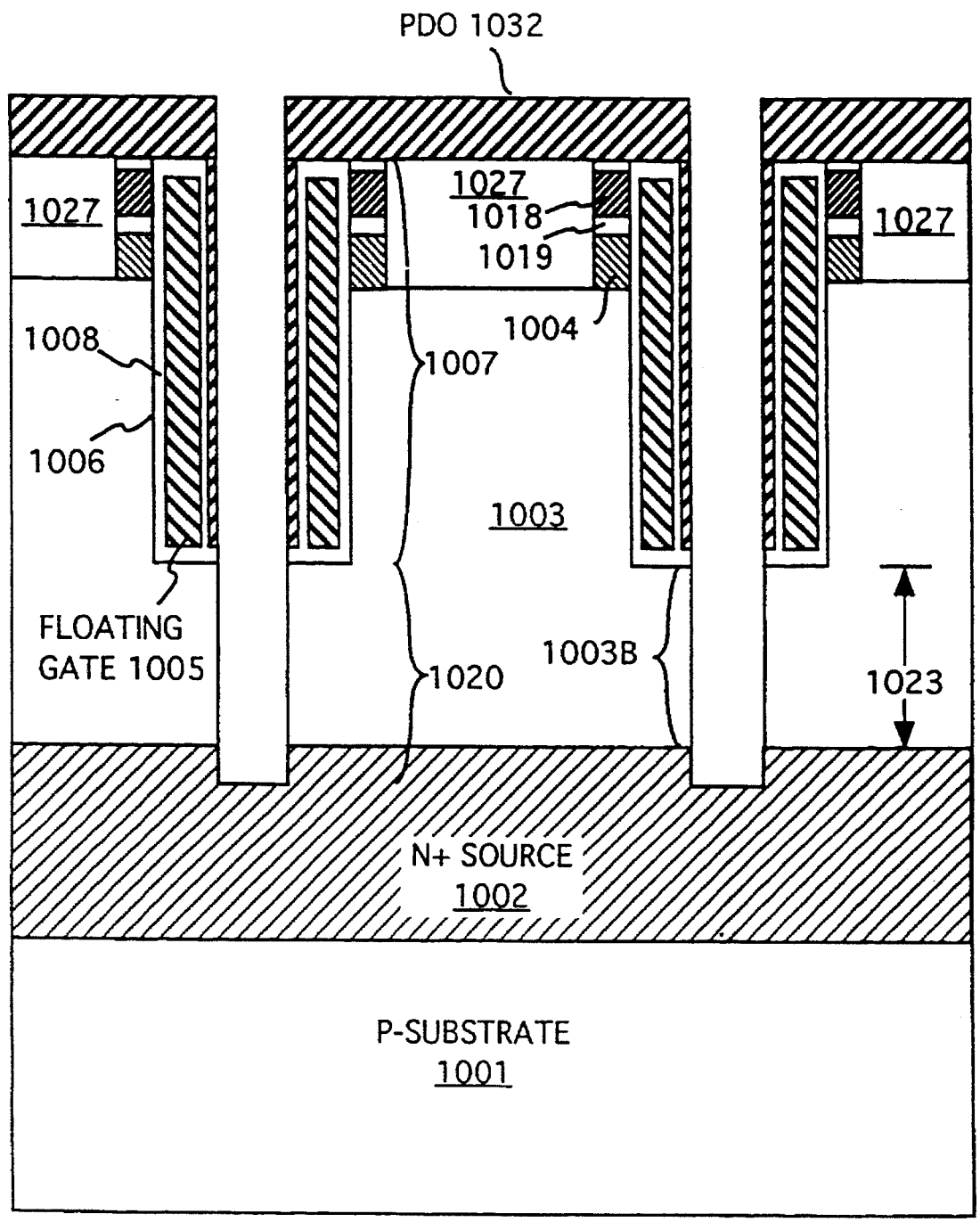

Deposition of layer 1031 is followed by deposition of a layer 1032 of phosphorus doped oxide (PDO). PDO layer 1032 is deposited in any conventional non-conformal manner such that the thickness of PDO layer 1032 deposited on the bottom and the sidewalls of trench 1007 is much thinner than the thickness of PDO layer 1032 deposited on the top surface of the array. In this manner, a plasma etch of PDO layer 1032 exposes the bottom of the first trench leaving the top surface and the sidewalls unexposed. After dry etching removes interpoly dielectric film 1008 at the bottom of trench 1007 and exposes layer (hereinafter channel region) 1003 a highly selective (i.e., to oxide) anisotropic silicon etch through channel region 1003 forms another trench 1020 as shown in FIG. 10D. Note that the bottom of trench 1020 must reach source region 1002 to ensure proper channel conductivity of the memory cells. The depth of trench 1020 is typically in the range of 0.75 to 1.0 micrometers so that the channel length 1023 of the to-be-formed series select transistor is approximately 0.5 to 0.75 micrometers.

Figure 10E:
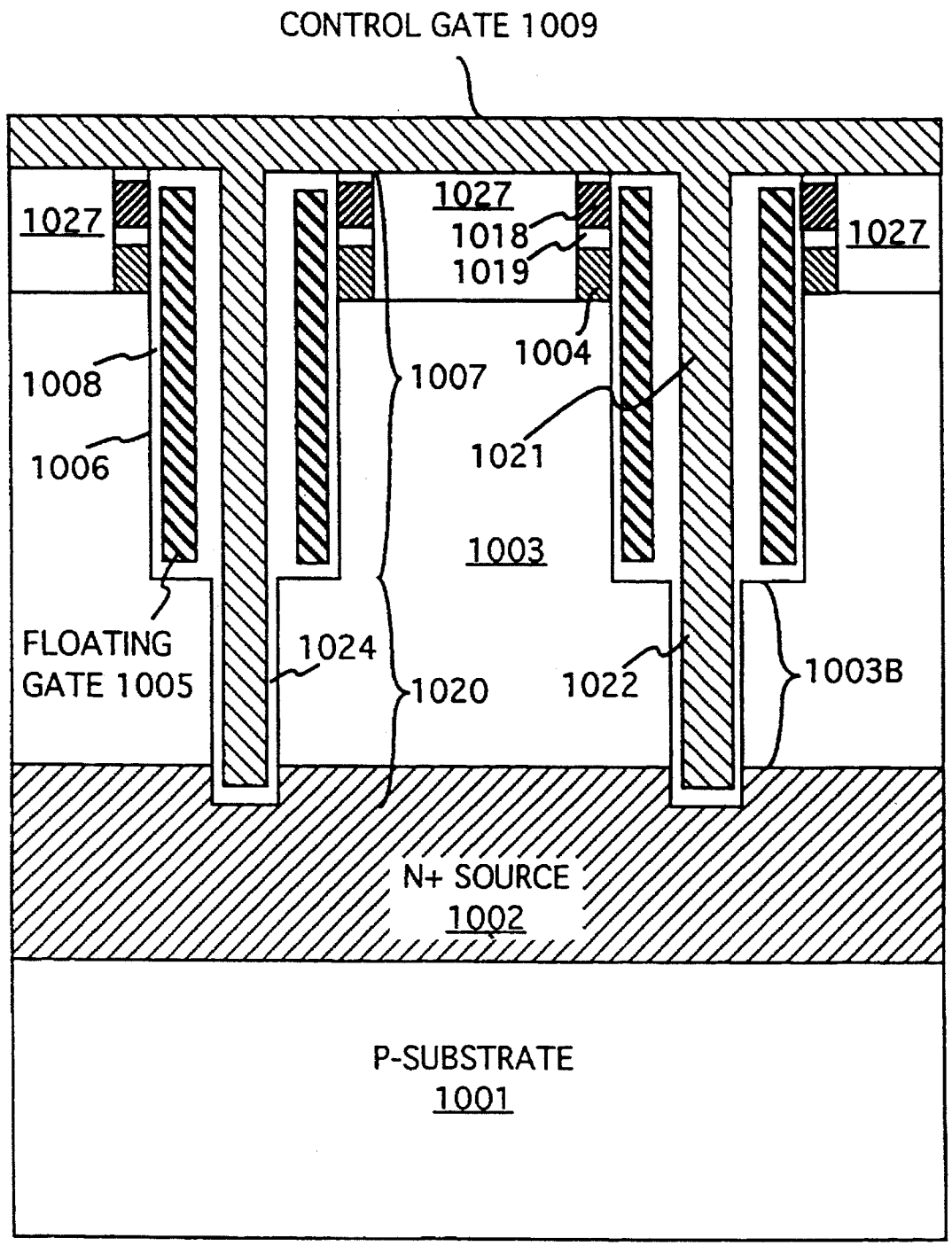

After formation of trench 1020, a photoresist mask (not shown) is used to define the gate electrodes of the thick oxide MOSFETs in the periphery. This step also removes dielectric layer 1031, polysilicon layer 1018, and oxide layer 1019 from the thinner oxide MOSFET region in the periphery. Following photoresist removal, gate oxide 1024 is grown over the sidewalls of trench 1020 and the thin oxide MOSFETs in the periphery. The thickness of this gate oxide is typically in the range of 20 to 40 nanometers. Then, a layer 1009 of heavily N+ doped polysilicon (or a composite layer of silicide/N+ polysilicon) is deposited on the array to fill trenches 1007, 1020 and cover the array as shown in FIG. 10E. This polysilicon layer 1009 is patterned to form the control gates of the memory cells, i.e., the word lines of the array (see FIG. 11), as well as the gate electrodes of the thin oxide MOSFETs in the periphery.

After conventional source and drain formation in the periphery, a thick layer of glass, usually PDO or borophosphosilicate glass (BPSG), is deposited and patterned for contact openings. Conventional metallization processes are carried out thereafter to interconnect all memory cells and MOSFETs in the periphery.

Figure 11:
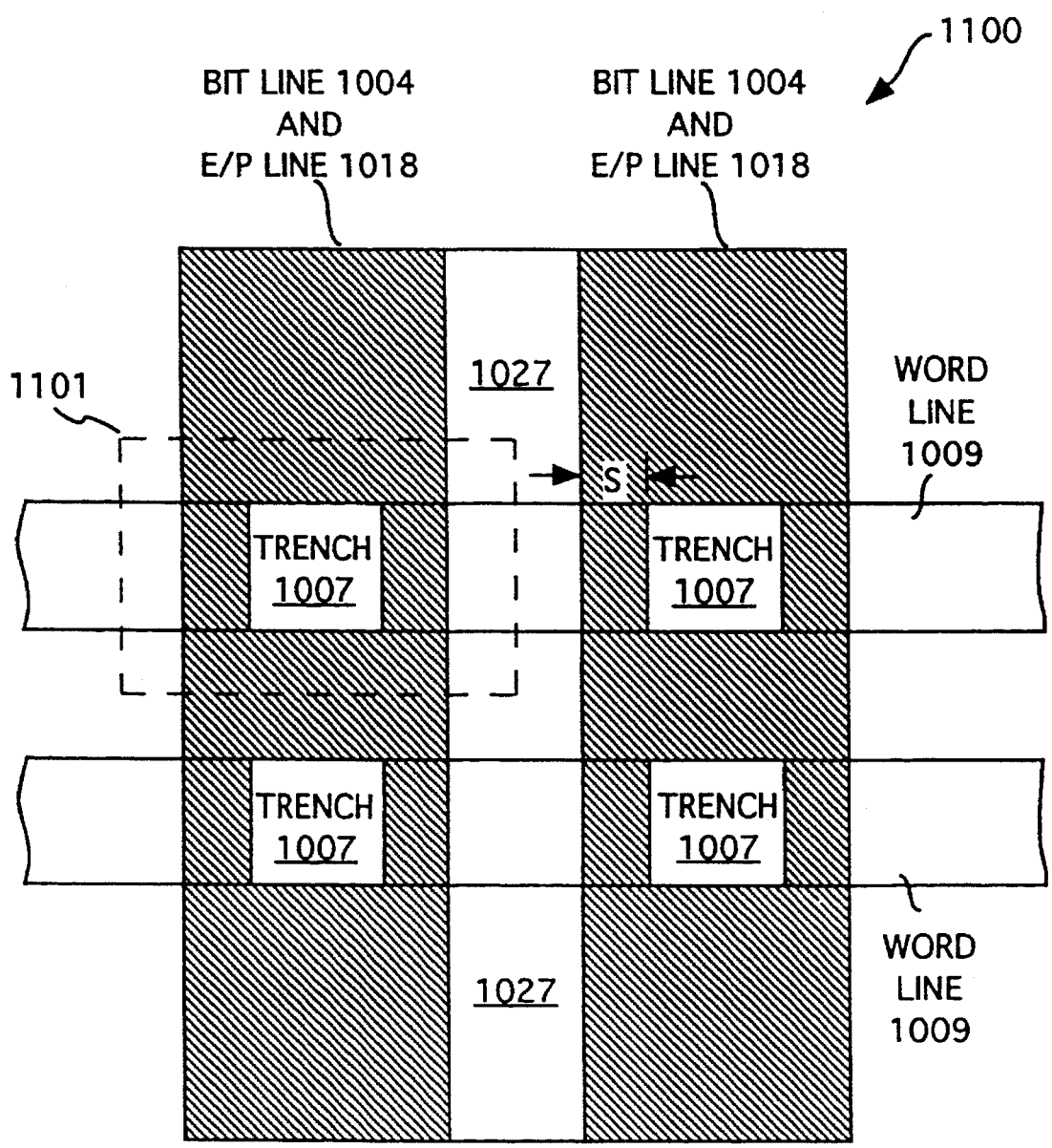
FIG. 11 shows a top view of a 2×2 array of vertical EEPROM cell formed non-self-aligned to the edges of bit line isolation.

FIG. 11 shows a top view of one embodiment of a 2×2 array 1100 of vertical EEPROM cells 1101, each cell 1101 having an associated non-self-aligned trench 1007. Note that array 1100 may include any vertical EEPROM cells in accordance with the present invention. A specific memory cell is accessed in a convuntual manner, i.e. by selecting the word line 1009 and bit line 1004 associated with that cell. Cells 1101 and their corresponding trenches 1007 are located at the intersections of word lines 1009 and bit lines 1004. The erase/program lines 1018 are formed on top of bit lines 1004 and share the identical layout with bit lines 1004.

For a given technology with minimum feature size X, the area $A_{cell}$ of any memory cell of the array is determined by the following equation:

$$A_{cell} = 4X^2 + 4XS$$

where S is the spacing between the edge of trench 1007 and the edge of bit line isolation 1027. More specifically, S is the sum of the minimum misalignment tolerance and the minimum drain width required per trench edge. Because the trench edges are defined lithographically, the smallest possible dimension the trench edge has is the minimum feature size X. For example, in 1.0 µm technology, X=1.0 µm and S=0.5 µm yields an area $A_{cell}$ equal to 6 µm², which is significantly smaller than any prior art split channel EEPROM cell having a separate erase/program gate.

To further reduce cell size, two edges of the trenches are self-aligned to the bit line edge. The process steps to provide these self-aligned trenches are identical to those steps described above in reference to FIGS. 10A–10E for cells having non-self-aligned trenches with the following differences noted in reference to FIGS. 12A–12D.

Figure 12A:
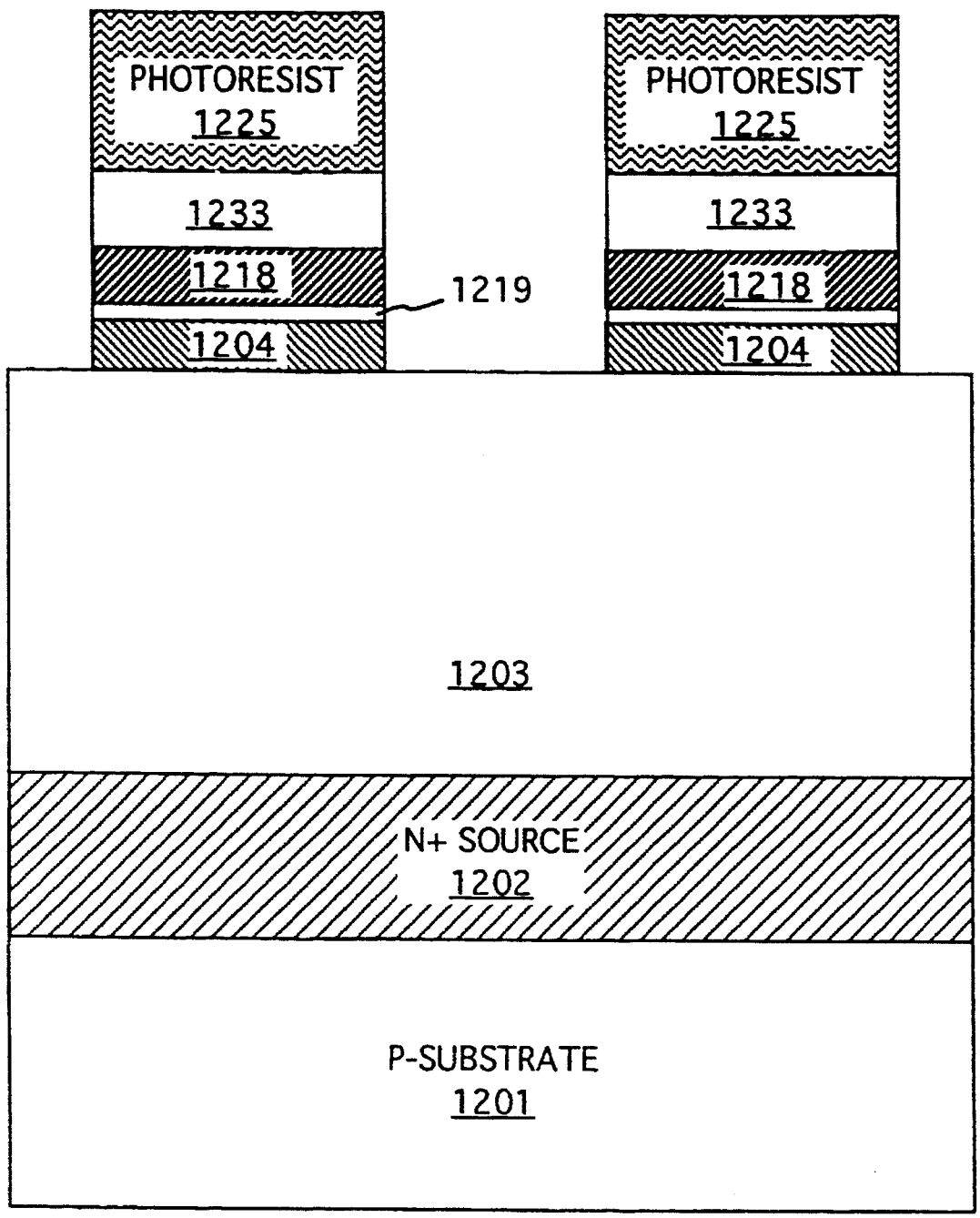
FIGS. 12A through 12D illustrate cross-sectional views along a word line of two vertical split channel EEPROM cells with separate erase/program gates at various stages in fabrication in a self-aligned process.
Figure 12B:
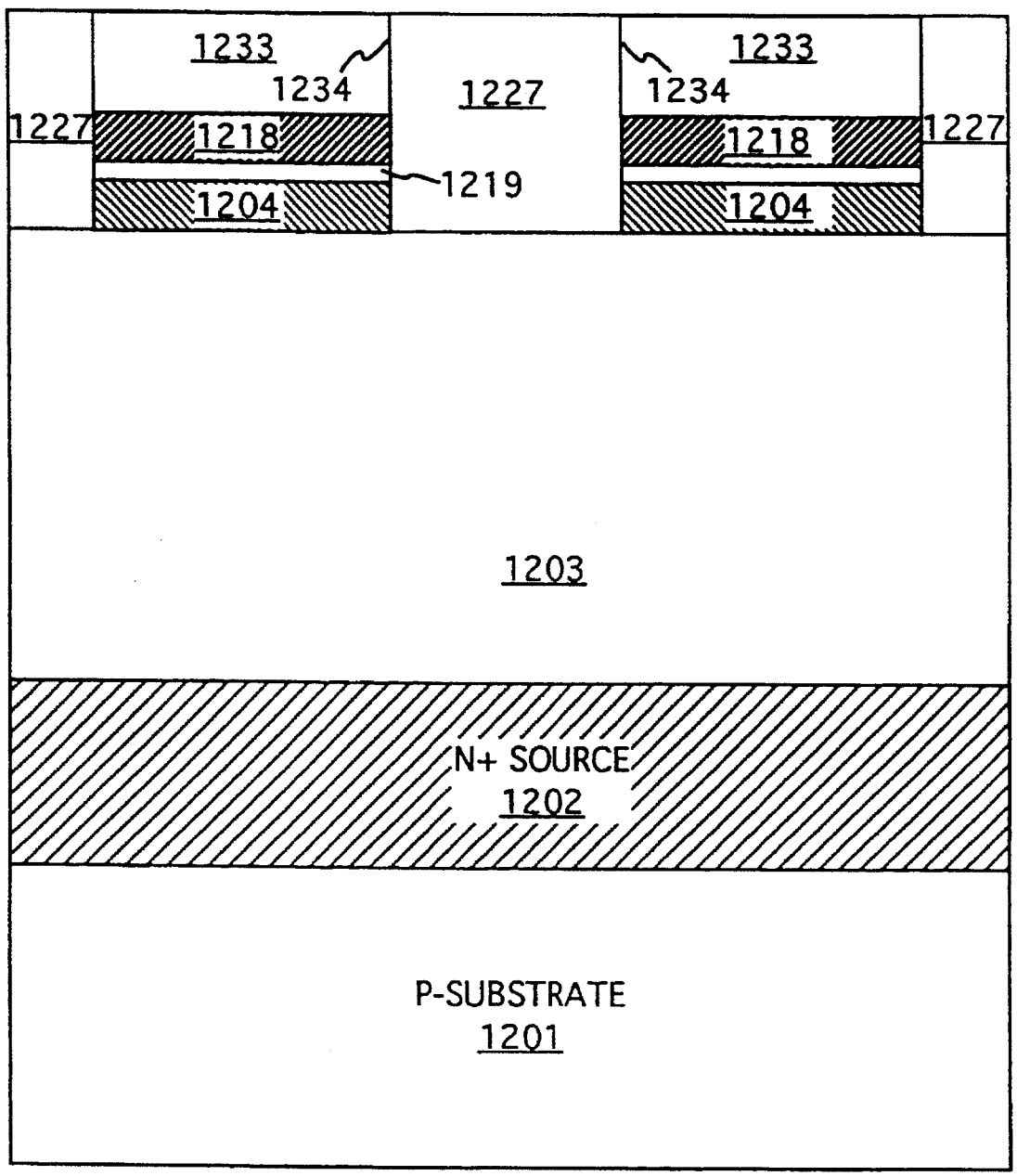

After deposition of polysilicon layer 1218, a layer 1233 of PDO about 400 to 800 nanometers thick is deposited on polysilicon layer 1218. A photoresist layer 1225 is then formed and patterned to etch PDO layer 1233, polysilicon layer 1218, oxide layer 1219, and drain region 1204 as shown in FIG. 12A. CVD oxide 1227 is deposited on the array to a thickness of 800 to 1000 nanometers. Using a conventional resist planarization technique, CVD oxide 1227 is etched back to expose PDO layer 1233. After this oxide etch, the thickness of PDO layer 1233 should be in the range of 250 to 450 nanometers on polysilicon layer 1218.

Figure 12C:
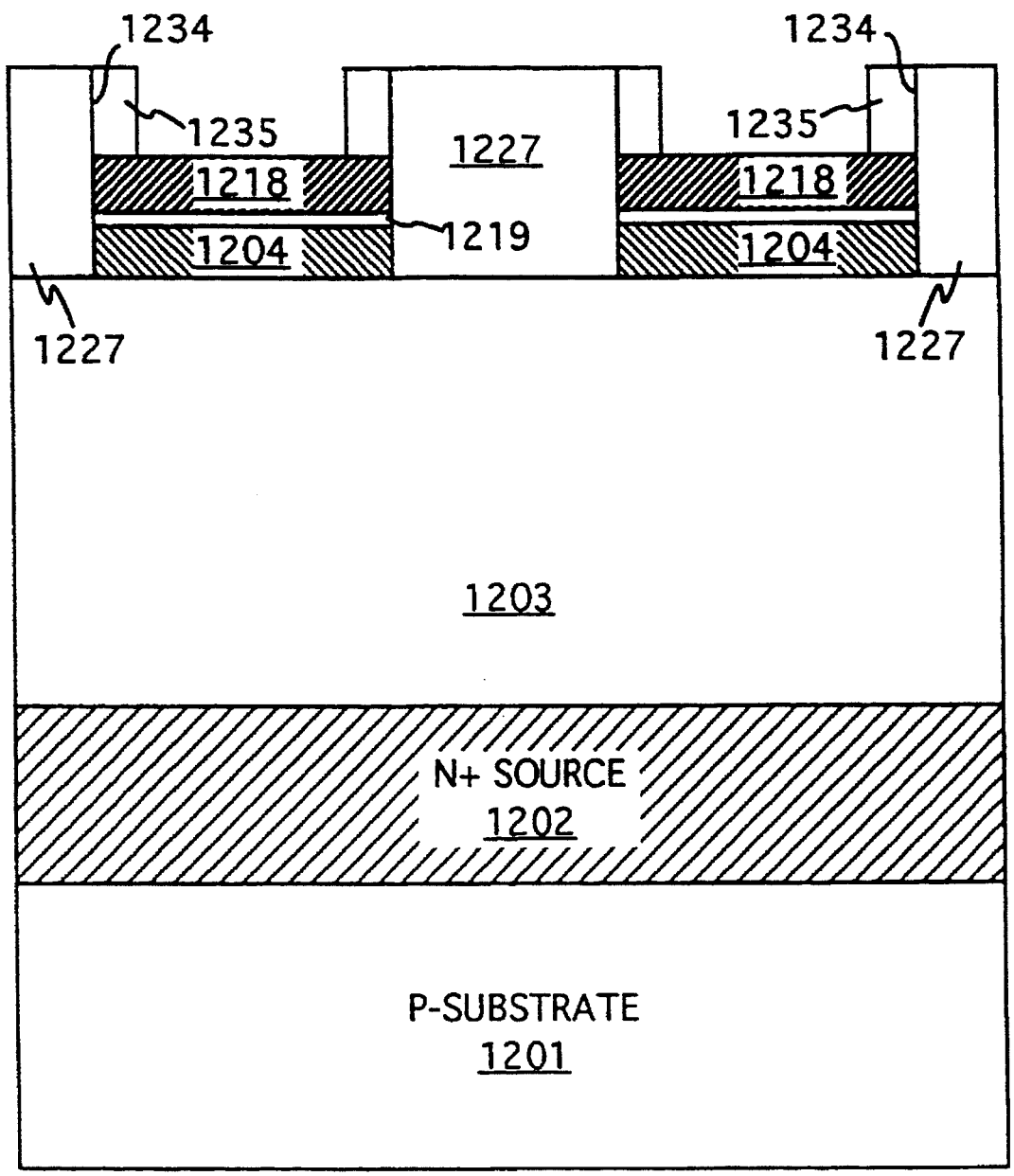
Figure 12D:
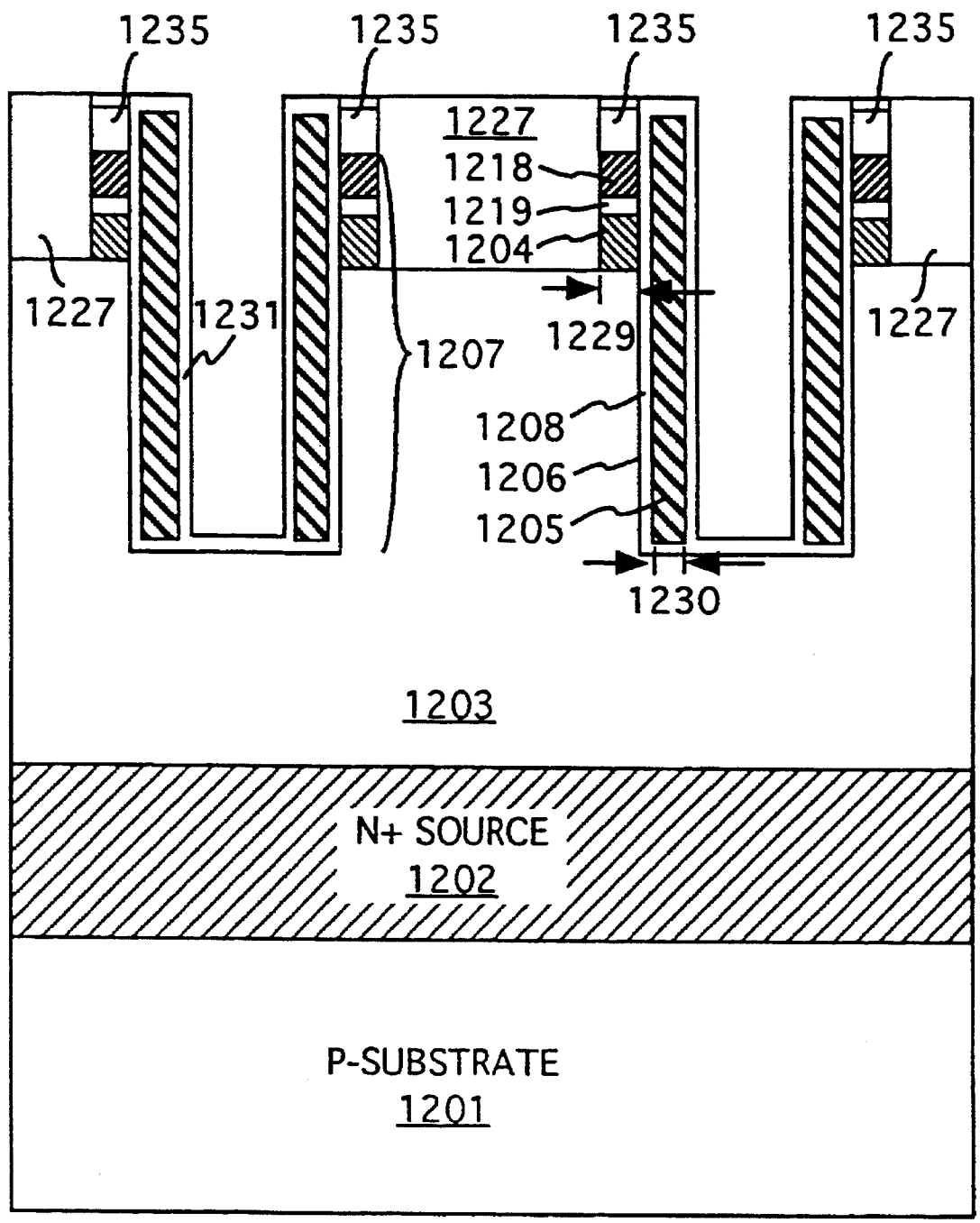

Next, PDO layers 1233 are selectively etched away using hydrofluoric acid to expose sidewalls 1234 of bit line isolation 1227. This etch is followed by formation of oxide spacers 1235 formed on sidewalls 1234 as shown in FIG. 12C. During the subsequent trench formation, the sides 1336 of trench 1207 are defined by oxide spacers 1235 as shown in FIG. 12D. The other two sides 1337 of trench 1207 (see FIG. 13) are defined by a photomask (not shown). The remaining steps, including the formation of gate isolation 1208 and floating gate 1205, are the same as non-self-aligned scheme described in reference to FIGS. 10A–10E.

The use of oxide spacer 1235 to define trench edges 1336 eliminates any potential misalignment problem. Furthermore, because trench edges 1336 are not defined lithographically, trench width 1338 in the word line direction can be made smaller than the minimum feature size allowed lithographically. Thus, the spacing S (FIG. 13) (referenced as spacing 1229 in FIG. 12) between trench edge 1206 and bit line isolation 1227, now determined by the width of oxide spacer 1235, is significantly reduced.

Figure 13:
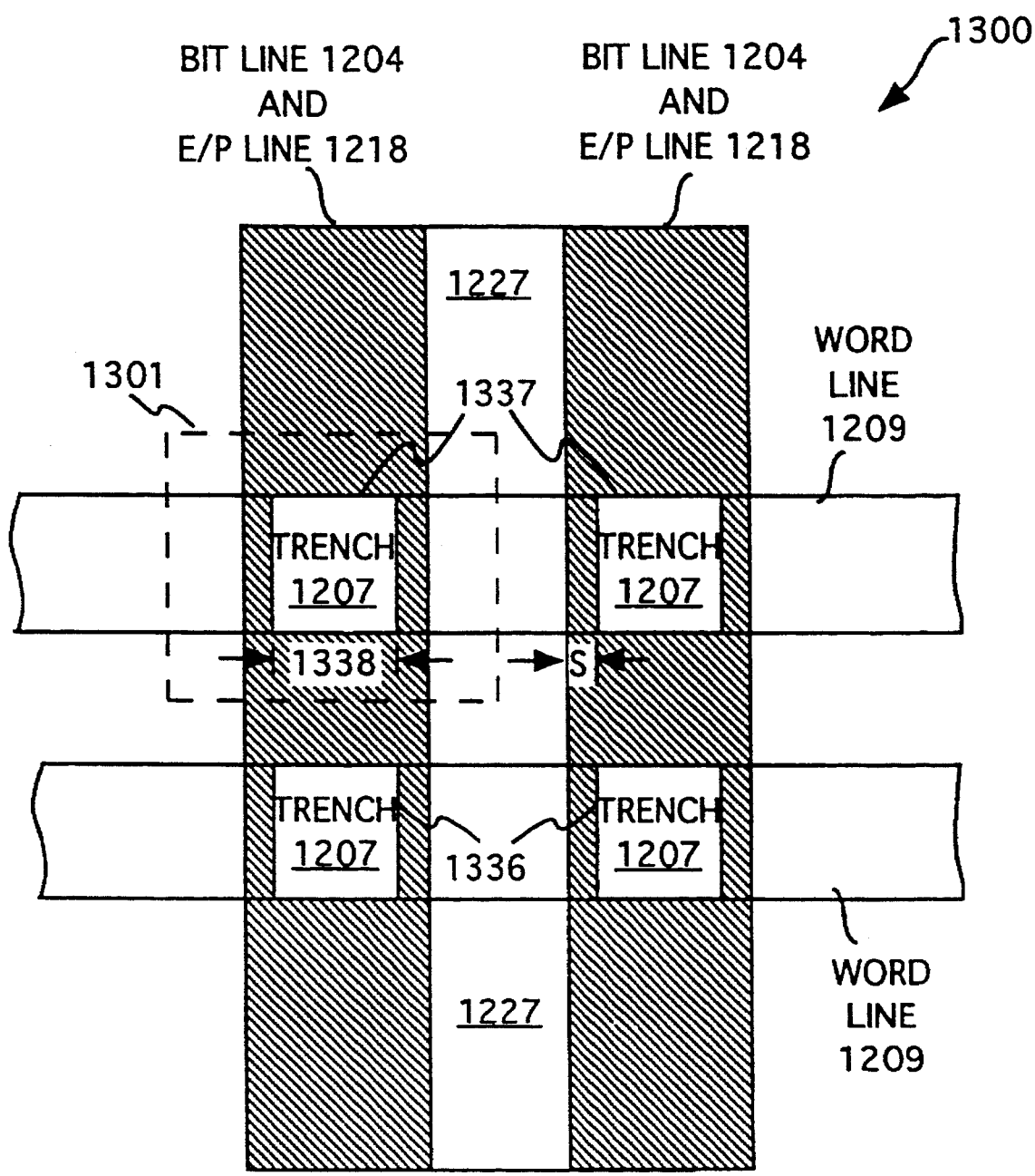
FIG. 13 shows a top view of a 2×2 array of vertical EEPROM cell formed self-aligned to the edges of bit line isolation.

FIG. 13 shows a top view of a 2×2 cell array 1300 of vertical EEPROM cells 1301 having self-aligned trenches 1207. As mentioned previously, this array configuration is applicable to all vertical EEPROM cells in accordance with the present invention. The bit line width, defined by a photomasking process, is equal to the minimum feature size allowed, X. The trench width 1338 along the word line direction is equal to X=2S, where S is the oxide spacer width. The area of the memory cell $A_{cell}$ is equal to $4X^2$. For 1.0 µm technology, X is equal to 1.0 µm. Thus, the cell area $A_{cell}$ is equal to 4 µm², which is a 33% reduction in cell size compared to the size of a cell having a non-self-aligned trench (See FIG. 11). However, because the width W of the memory cell is smaller, the trench cell current is reduced. Specifically, the trench perimeter is now equal to 4X–2S instead of 4X. The spacing between trench edge and bit line edge, S, can be adjusted by varying the spacer width and is equal to the minimum drain width required per trench edge.

Note that vertical EEPROM cells in accordance with the present invention are highly scalable. Therefore, cell size is reduced in proportion to the minimum feature size reduction. For example, if the minimum feature size is reduced 20% from 1.0 µm to 0.8 µm, then the cell size is correspondingly reduced 36% from 4 µm² to 2.56 µm².

2. Process Modifications

Those skilled in the art will recognize that elimination or addition of one or more steps in the above-described process descriptions provides a vertical EEPROM with different features. For example, to provide a vertical stacked gate EEPROM with a separate erase/program gate, the thickness of the channel region is reduced to about 1.2 to 2.0 micrometers such that the bottom of the trench reaches the source region. Those steps associated with the series select transistor formation are deleted.

As another example, to provide only vertical EEPROM cells without other features, the polysilicon layer used as the erase/program gate is replaced by a layer of oxide or by a nitride film used in a LOCOS process. As a further example, to produce vertical EEPROM cells having extended drain regions, the step of depositing oxide underneath the polysilicon layer is eliminated so that the polysilicon layer is in contact with the drain region and hence becomes the extended drain region.

Finally, to produce a vertical split channel EEPROM with a tunnel oxide formed on the top surface of the separate erase/program gate, a number of maskless process steps are added to the basic process as explained in reference to FIGS. 14A–14E. After deposition of polysilicon layer 1418, tunnel oxide 1434 is grown on the top surface of polysilicon layer 1418 to a thickness of approximately 10 to 25 nanometers. Then, a layer 1435 of polysilicon is deposited to a thickness of about 100–250 nanometers. An anisotropic etch using patterned photoresist layer 1425 yields the structure illustrated in FIG. 14A.

Figure 14A:
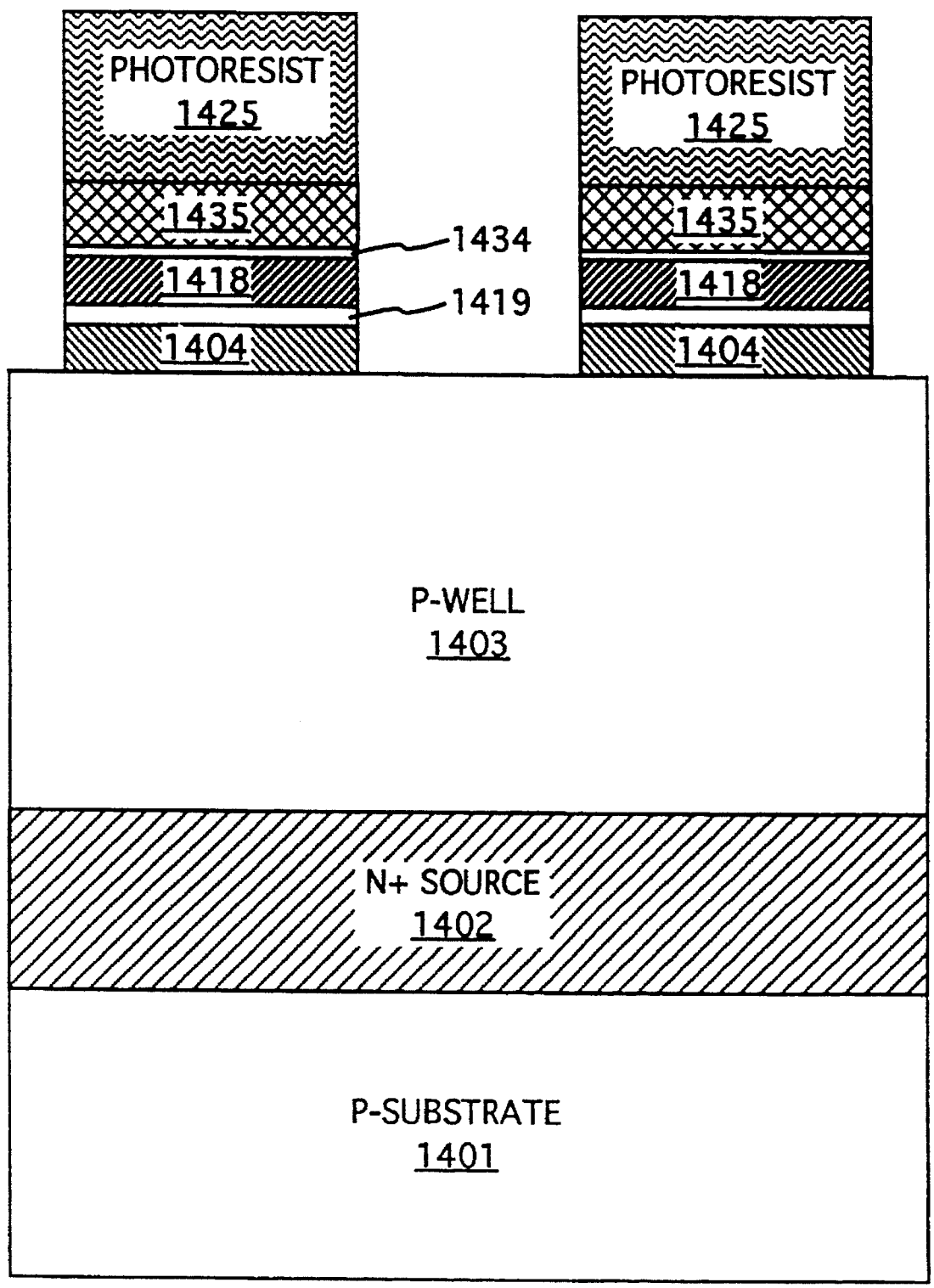
FIGS. 14A through 14E illustrate cross-sectional views along a word line of two vertical split channel EEPROM cells with tunnel oxide formed on the top surface of the separate erase/program gate at various stages in a non-self-aligned process fabrication.
Figure 14B:
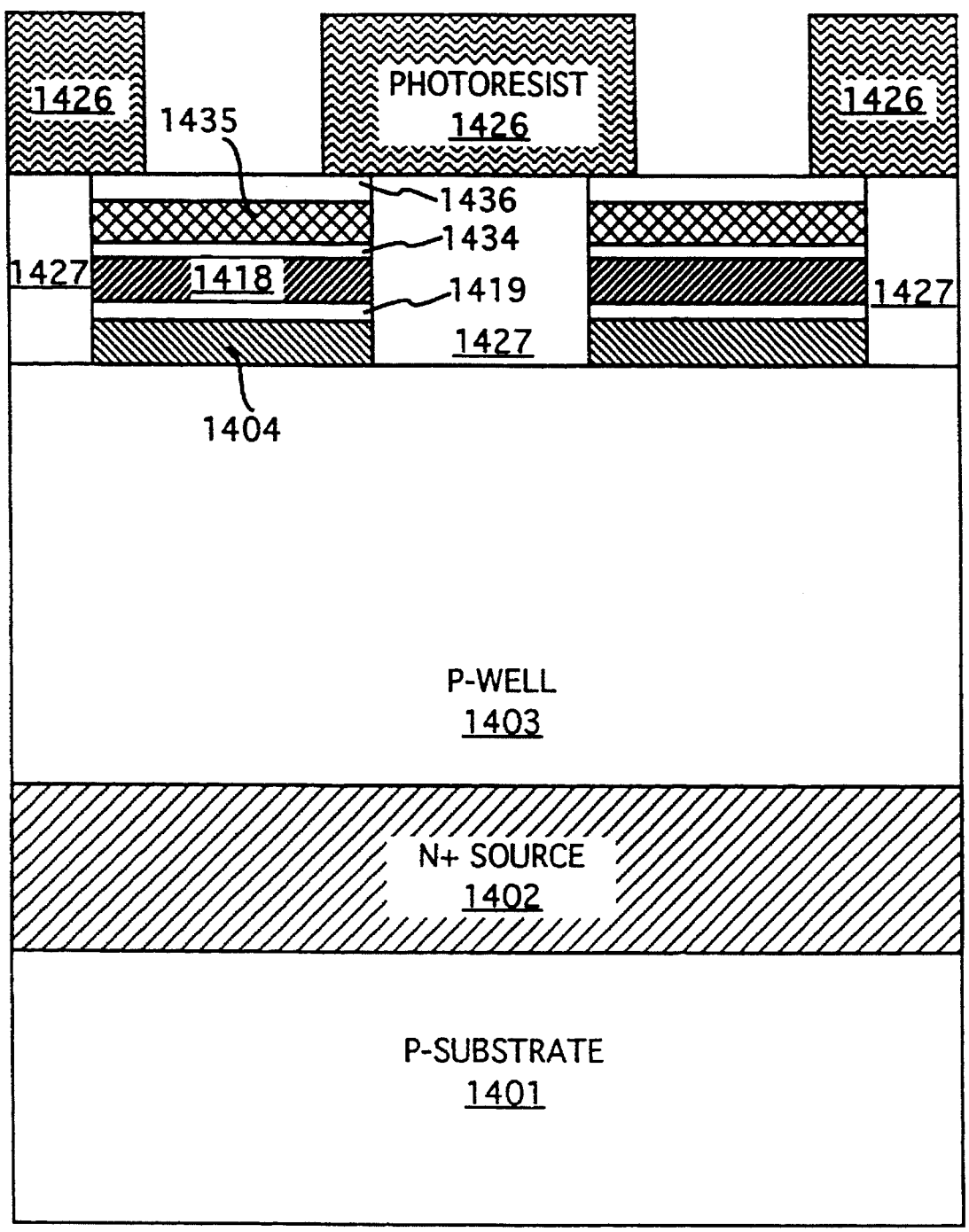
Figure 14C:
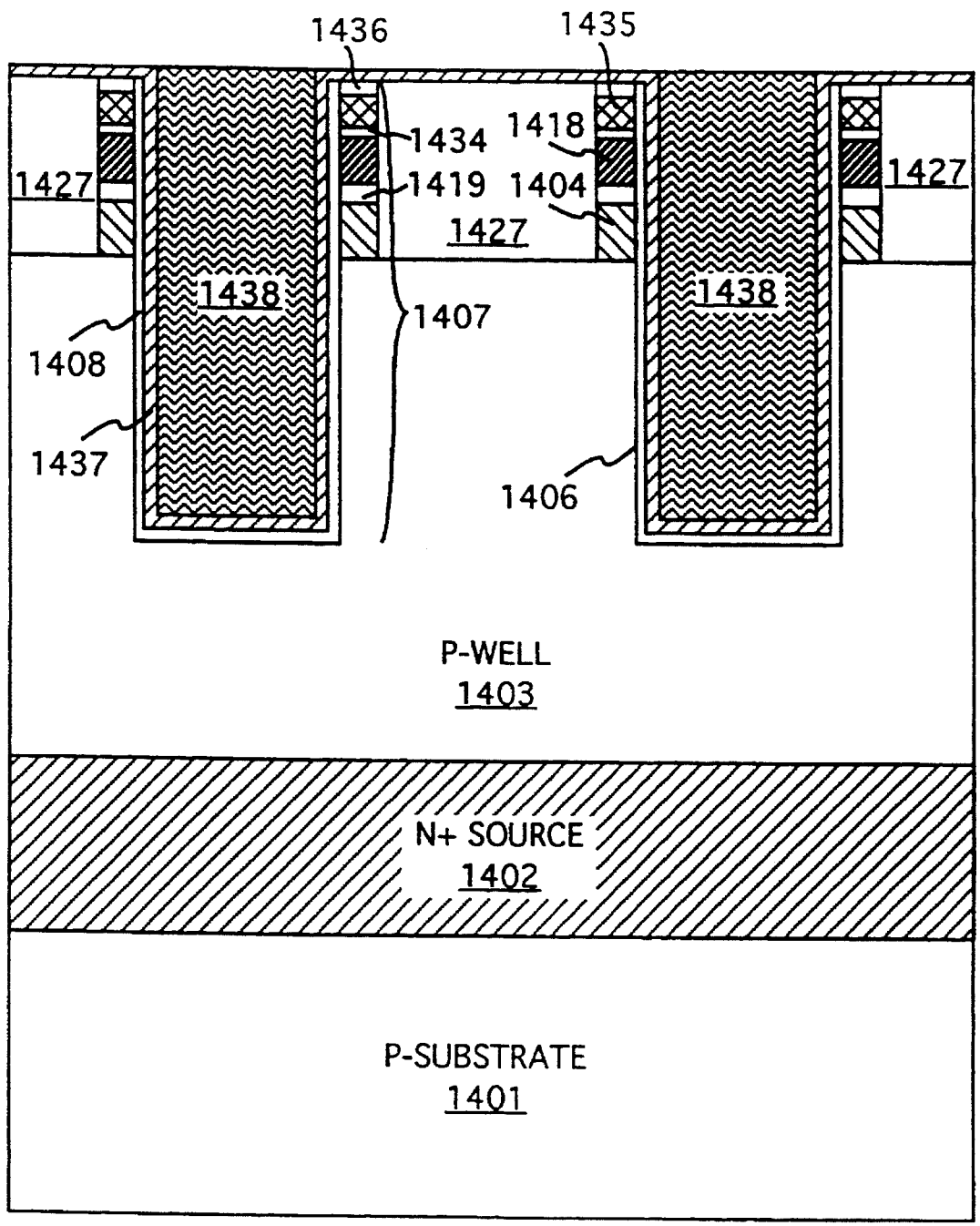
Figure 14D:
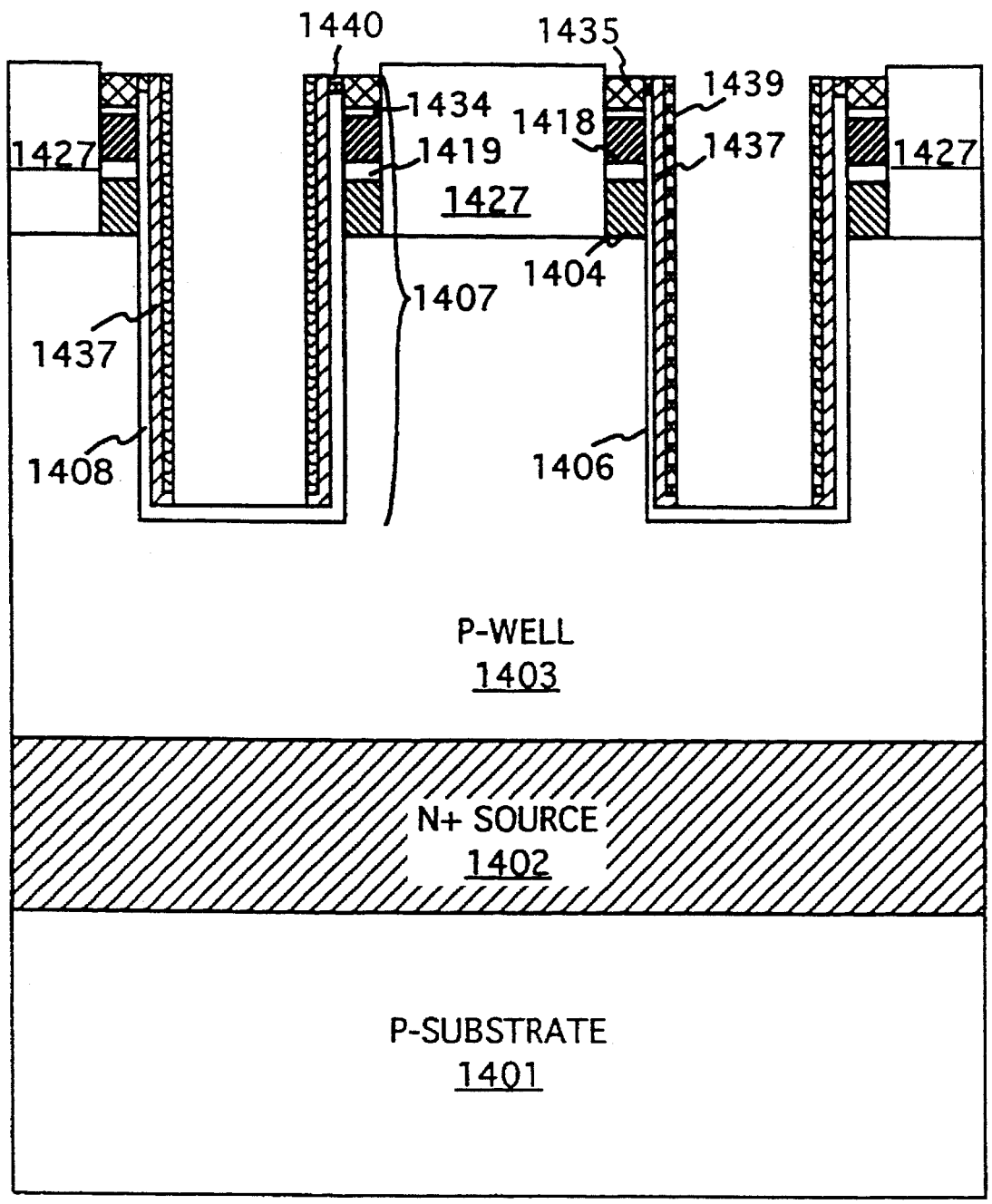

Oxide 1427 is then deposited over the array and planarized back to form the bit line isolation and leave a layer of oxide 1436 of approximately 1,000 Å on top of polysilicon layer 1435 as shown in FIG. 14B. Photoresist layer 1426 is formed and patterned to define the trench openings. An anisotropic etch forms trenches 1407 as illustrated in FIG. 14C. In conformance to the standard process steps described above, a gate dielectric film 1408 is subsequently thermally grown on trench sidewalls 1406.

Figure 14E:
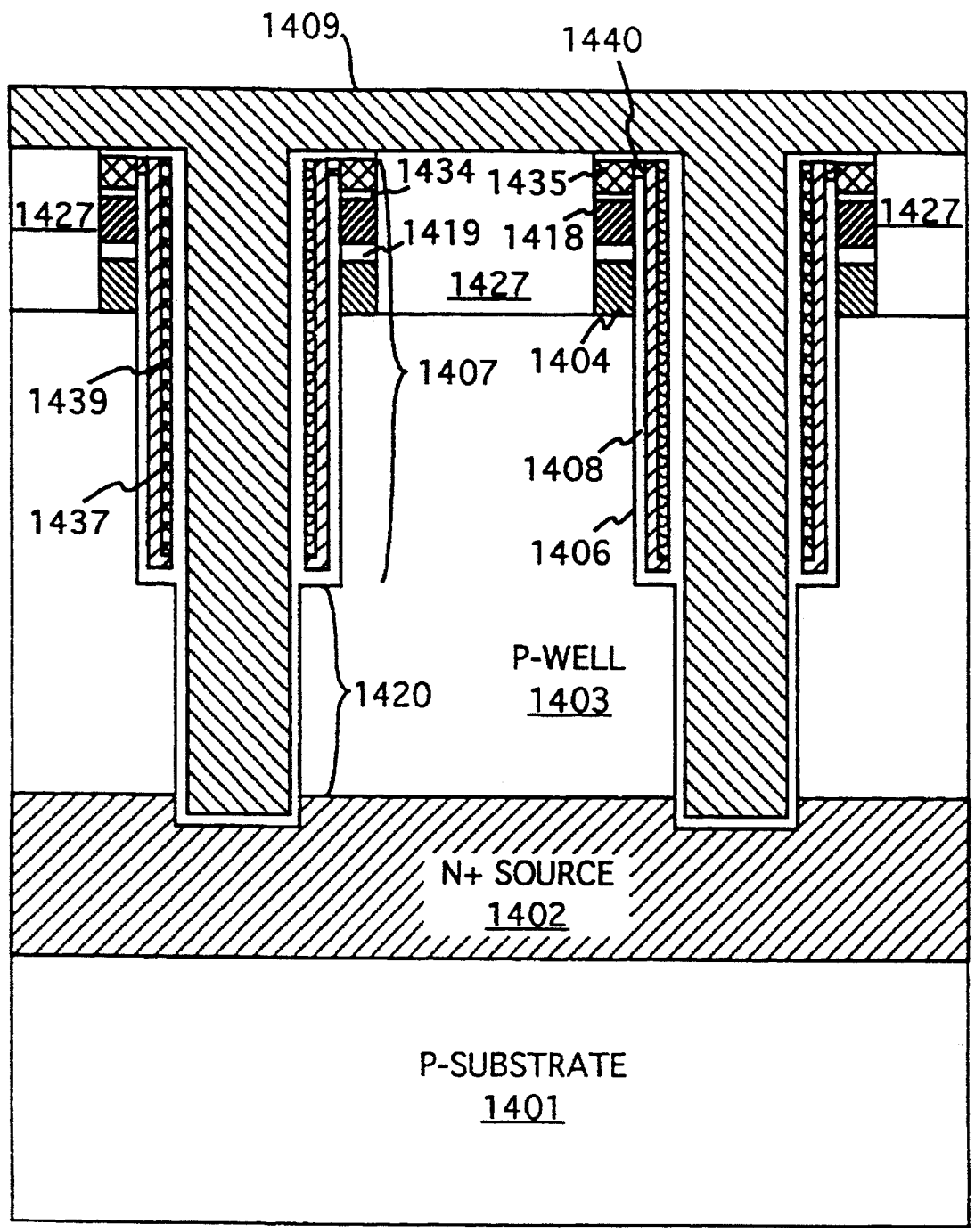

Then, a layer 1437 of polysilicon is deposited to protect gate dielectric film 1408 during the following processing steps. After this polysilicon deposition, a layer of photoresist is spun on the wafer and is exposed without a photomask such that only trenches 1407 are filled with photoresist 1438 as shown in FIG. 14C. The exposed portions of polysilicon layer 1437 and the underlying silicon oxide layer 1436 are then removed. A wet oxide etch step is carried out before the removal of photoresist to partially etch away the oxide between layer 1435 and layer 1437. This step creates a gap 1440 between polysilicon layers 1435 and layer 1437. Subsequently, a layer 1439 of polysilicon having a thickness of about 50 to 150 nanometers is deposited. This polysilicon layer 1439 fills in gap 1440 and connects layer 1435 to layer 1437. The remaining process steps to obtain the structure shown in FIG. 14E are the same steps described in reference to FIGS. 10C–10E, for example.

3. Vertical EEPROM Structures Using N+ Silicon Substrate

Figure 15:
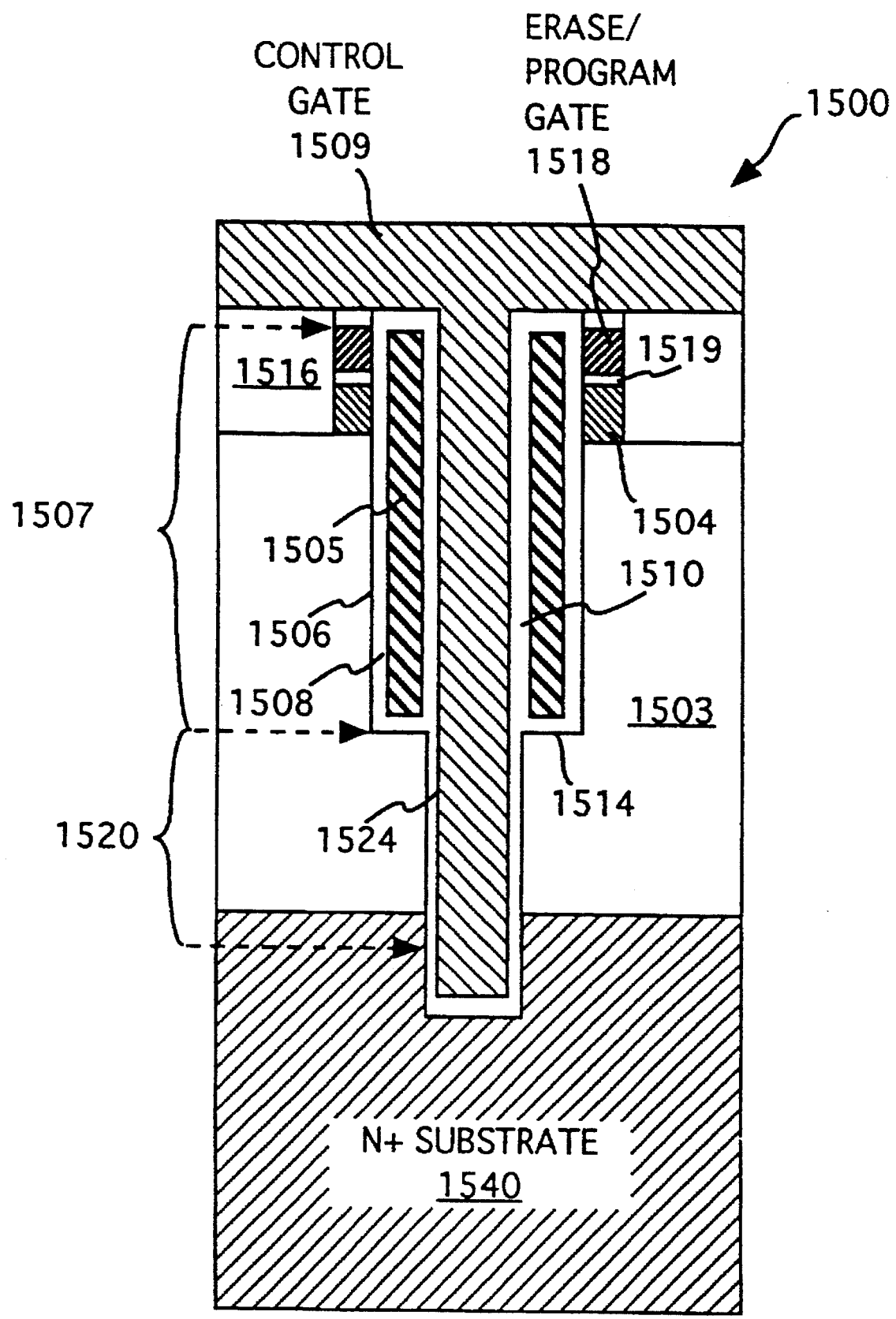
FIG. 15 shows a cross-sectional view along a word line of a vertical split channel EEPROM cell with a separate erase/program gate formed on a standard CMOS N-type epitaxial layer on an antimony doped $N^+$ silicon substrate.

In another embodiment of the present invention shown in FIG. 15, a vertical EEPROM cell is formed on a standard N-type CMOS epi substrate which is generally less expensive compared to the custom epi substrate described above in reference to FIGS. 5–14. An N-type CMOS epi substrate is typically an intrinsic or lightly doped N-type silicon epitaxial layer 1503 deposited on an antimony doped N+ monocrystal silicon substrate 1540. FIG. 15 shows a cross-sectional view along a word line of a vertical split channel EEPROM cell 1500 with separate erase/program gate 1518 formed on a standard N-type CMOS silicon epi substrate. All processing steps are identical to those described previously in reference to FIGS. 10A–10E with the exception that buried layer source region 1002 and substrate 1001 are replaced by the N+ monocrystal silicon substrate 1540. However, because N+ substrate 1540 is used as the common source region in the memory core as well as the N-well for the planar p-channel MOSFETs in the periphery, N+ substrate 1540 is connected to the most positive potential on chip. Thus, the potential of the common source region of the memory cells cannot be grounded. The bit line voltage, i.e. the drain voltage, is now lower than the source voltage. Thus, memory cell 1500 is sourcing current during the read operation instead of sinking current as is typical during a commonly grounded source approach.

4. Memory Cell Operations

The key operations for any memory device are write and read, which allow data to be stored into and retrieved from a storage element, respectively. The write operation of a conventional EEPROM cell, especially a flash-EEPROM cell, generally includes two steps as mentioned briefly above: erasing the cell by discharging the floating gate, and programming the cell by charging the floating gate. Because flash-EEPROMs cannot be erased cell-by-cell, these memory cells are usually first erased and then programmed to a fixed threshold voltage. In one embodiment of the present invention, the memory cells are programmed by hot electron injection in which the floating gate attracts electrons from the channel region near the drain diffusion and flash erased by electrons tunneling from the floating gate to the common source region.

Figure 16:
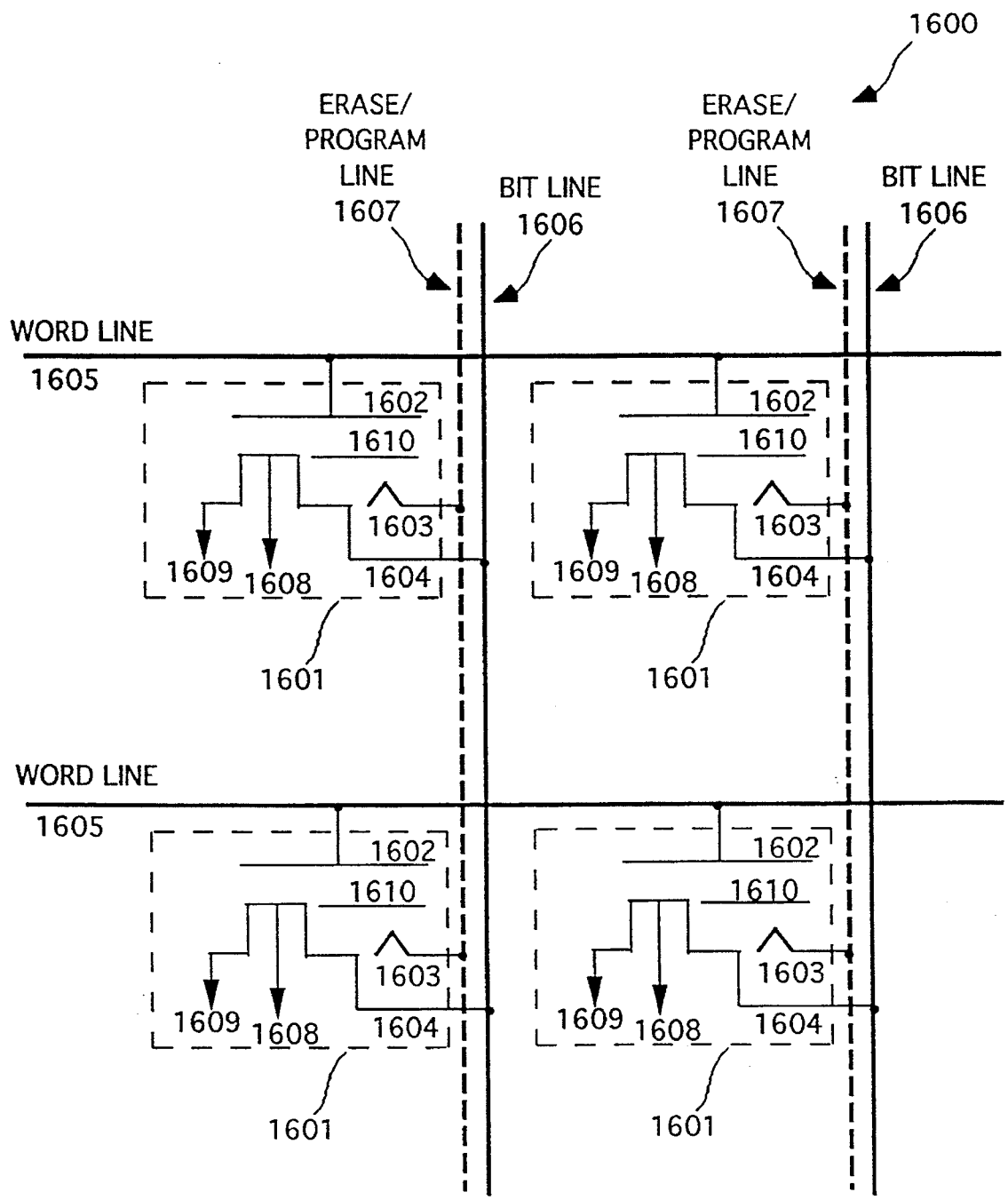
FIG. 16 shows a schematic diagram of a 2×2 array of vertical split channel EEPROM cell with separate erase/program gates.

FIG. 16 is a schematic diagram of a 2×2 array 1600 of vertical split channel EEPROM cells 1601. In addition to the commonly grounded P-well region 1608 and the source region 1609, there are three other terminals associated with each memory cell 1601: control gate 1602, erase/program gate 1603, and drain 1604. The voltage applied on each of these three terminals is adjusted independently to access and determine the operation mode of each memory cell 1601. The word line 1605 (connecting all the control gates 1602 of memory cells 1601 on the same row) and the bit line 1606 (connecting all the drains 1604 of memory cells 1601 on the same column) are conventionally used to select a specific memory cell 1601 during a read operation. Because all erase/program gates 1603 in the same column are connected, a memory cell 1601 is selected during a write operation, i.e. for erasing or for programming, by choosing a word line 1605 and erase/program line 1607.

Figure 17:
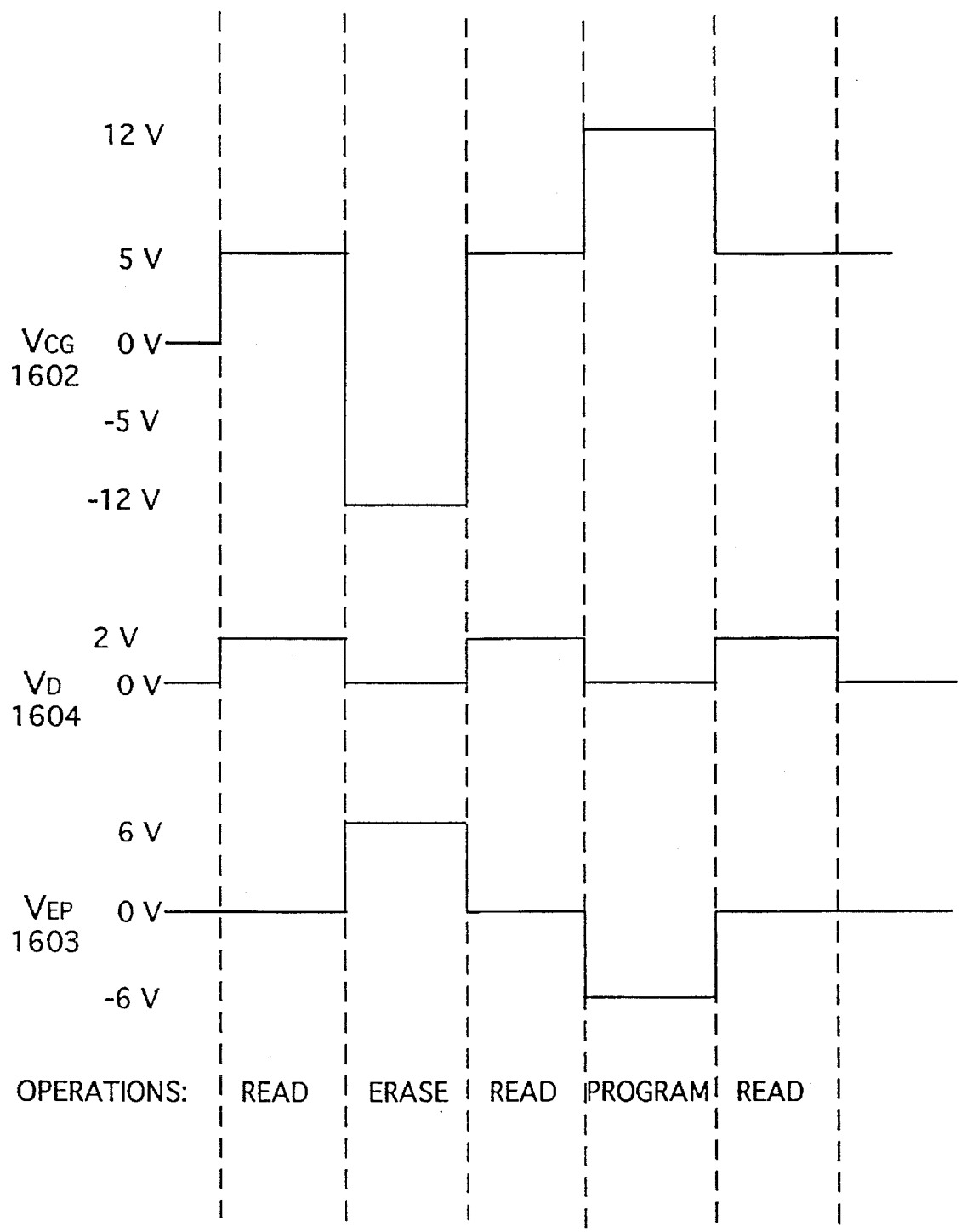
FIG. 17 illustrates a timing diagram of a selected memory cell.

FIG. 17 illustrates a timing diagram of voltages on control gate 1602 ($V_{CG}$), drain 1604 ($V_D$), and erase/program gate 1603 ($V_{E/P}$) during various operations. The bias conditions for all cells in the array, selected and unselected, are summarized below in Table I:

TABLE I

| Read Mode | Selected Cell | Same Row Unselected Cell | Same Column, Unselected Cell |
|---|---|---|---|
| $V_{CG}$ | 5 V | 5 V | 0 V |
| $V_D$ | 2 V | 0 V | 2 V |
| $V_{EP}$ | 0 V | 0 V | 0 V |

| Erase Mode | Selected Cell | Same Row Unselected Cell | Same Column Unselected Cell |
|---|---|---|---|
| $V_{CG}$ | −12 V | −12 V | 5 V |
| $V_D$ | 0 V | 0 V | 0 V |
| $V_{EP}$ | 6 V | −5 V | 6 V |

| Program Mode | Selected Cell | Same Row Unselected Cell | Same Column Unselected Cell |
|---|---|---|---|
| $V_{CG}$ | 12 V | 12 V | −5 V |
| $V_D$ | 0 V | 0 V | 0 V |
| $V_{EP}$ | −6 V | 5 V | −6 V |

For example, in one embodiment of the present invention, the tunnelling oxide thickness is adjusted such that significant tunnelling occurs when the voltage across the tunnel oxide is equal to or greater than 12 volts. Assuming the coupling ratio between control gate 1602 and floating gate 1610 is ½, the tunneling condition is created, for example, by providing 12 volts on control gate 1602 (via word line 1605) and −6 volts on erase/program gate 1603 (via erase/program line 1607). It is well known in the art that the voltage across the tunnel oxide is the difference between the floating gate voltage (i.e. one half the control gate voltage $V_{CG}$ if the floating gate is uncharged) and the voltage $V_{EP}$. Depending on the polarity of the voltage applied on control gate 1602 and erase/program gate 1603, the selected memory cell is either erased or programmed, i.e. the floating gate is either discharged or charged, respectively. In this manner, cell-by-cell erasability and programmability are achieved. In order to prevent write disturbing on unselected cells, especially those with negatively charged floating gate, unselected word lines and E/P lines are biased at predetermined conditions such that the leakage current across the tunnel oxide of unselected memory cells is negligible. In accordance with one embodiment of the present invention, during the erase operation, +5 V is applied on unselected word lines, i.e. control gate 1602, and −5 V is applied on unselected E/P lines, i.e. erase/program gate 1603; and vice versa during the program operations.

To read a selected memory cell, a low voltage of, for example, 2.0 volts, is provided to drain 1604 via bit line 1606 while grounding erase/program gate 1603 via erase/program line 1607. In another embodiment of the present invention, bit line 1606 is set at a fixed voltage, e.g. 2.0 volts, throughout all operations so that the selected memory cell is continuously monitored during the program operation.

For those vertical EEPROM cells without a separate erase/program gate, a memory cell is selected by choosing a bit line and a word line for both read and write operations. The bias conditions are summarized below in Table II:

TABLE II

| Read Mode | Selected Cell | Same Row Unselected Cell | Same Column Unselected Cell |
|---|---|---|---|
| $V_{CG}$ | 5 V | 5 V | 0 V |
| $V_D$ | 2 V | 0 V | 2 V |
| $V_S$ | 0 V | 0 V | 0 V |

| Erase Mode | Selected Cell | Same Row Unselected Cell | Same Column Unselected Cell |
|---|---|---|---|
| $V_{CG}$ | −12 V | −12 V | 0 V |
| $V_D$ | Floating | Floating | Floating |
| $V_S$ | 5 V | 5 V | 5 V |

| Program Mode | Selected Cell | Same Row Unselected Cell | Same Column Unselected Cell |
|---|---|---|---|
| $V_{CG}$ | 12 V | 12 V | 0 V |
| $V_D$ | 6 V | 0 V | 6 V |
| $V_S$ | 0 V | 0 V | 0 V |

Note that the bias conditions are similar to those for conventional flash-EPROM cells. During an erase operation, electrons are transferred from the floating gate to the source region. Cell by cell erasiality is not achievable for structures without a polysilicon erase/program gate 1607.

5. Using On Chip Memory Array As Programmable References for Reading and Writing EEPROM Cells As mentioned previously, the key functions of a memory device are to record or store signals (i.e., information) and then playback or retrieve this information. Input and output signals are either analog or digital signals.

Due to the advancement in high speed digital computation and telecommunication, analog signals, such as audio and video signals, are converted to digital signals for data processing and then later converted back to analog signals for audio playback or video/graphical display. This cycle of analog-to-digital conversion, digital data (signal) processing, and then digital-to-analog conversion is very common in many multimedia applications. In fact, data storing and retrieving are typically required before or after any digital data processing.

Storing multiple bits of information in a single memory cell is equivalent to storing a sampled-and-held analog signal in a single memory cell. The number of bits allowed to be stored per cell is determined by the resolution of the analog-digital conversion integrated on the same chip. Because the storage memory cells vary with temperature and power supply fluctuations, the present invention provides a set of references that tracks these cells for on-chip read and write operations. In accordance with the present invention, a plurality of memory cells in the array are prewritten to a determined threshold voltage and cell current level to function as references.

Allocating a plurality of memory cells to function as reference cells provides excellent tracking between storage cells and reference cells because the transistor characteristics over both temperature and power supply variations are identical for both storage cells and reference cells. These reference cells provide the limits (either voltage or cell current levels) for characterizing state levels of each memory cell. Each memory cell storing n bits of digital data or equivalent analog signal has $2^n$ associated states.

Each state is defined by a distinctive level of threshold voltage, or cell current, or even bit line voltage of a cell during a read mode. Each state is characterized in accordance with the present invention by a pair of limits, an upper limit and a lower limit, which constitute the reference levels. For example, as shown in FIG. 18, two bits of data stored in a memory cell are represented by four states or levels, S1 to S4. These four states are characterized by five reference levels, Ref 0 to Ref 4.

State S1, representing the lowest level of data "00", is defined in one embodiment as the lowest level of channel conductivity (which corresponds to the highest level of threshold voltage and the lowest level of cell current). State S1 is characterized by reference levels Ref 0 and Ref 1. To maximize the number of bits stored per cell, the difference between each state (in terms of voltage or cell current), typically referred to as the least significant bit (LSB), is uniform and is equal to 2 times the maximum resolution limit. Reference levels are set at +½ LSB and −½ LSB from each state. Thus, each reference level is 1 LSB from the next reference level and ½ LSB from the next state. In accordance with the present invention, reference cells sharing the same bit line are written to the same reference level. References used for reading or writing to a selected memory cell are read out from reference cells that share the same word line as the selected memory cell. For instance, five column of memory cells are required for two-bit data storage (four states) per memory cell.

Because a memory device retrieves and plays back stored information, one embodiment of the present invention varies the charging and discharging of the floating gate by comparing the input information to the memory cell with feedback from this cell. For each digital input signal, a pair of references corresponding to the state representing the input data signal is selected, thereby setting lower and upper limits.

Figure 19:
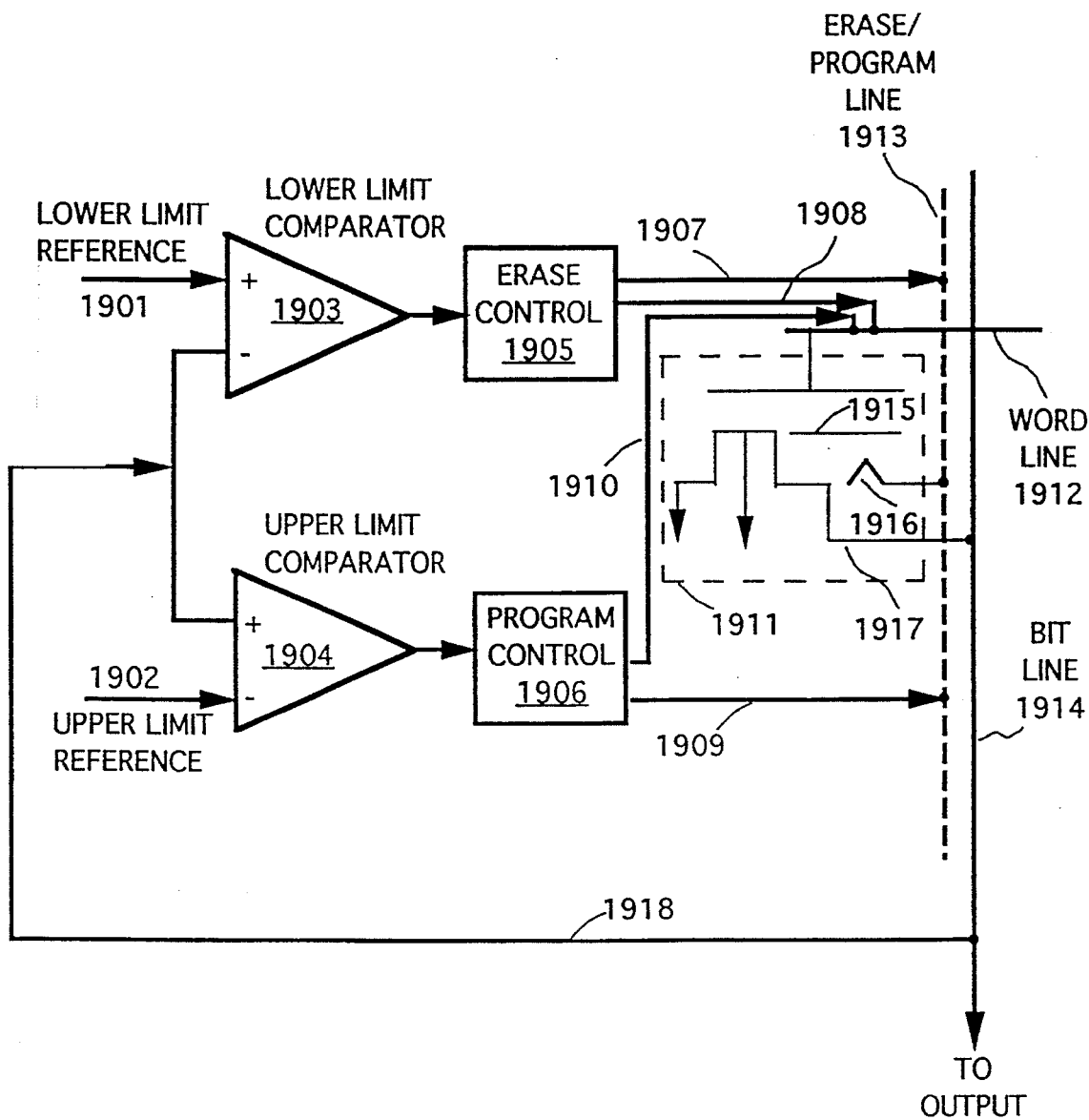
FIG. 19 illustrates a schematic diagram of a write circuit using upper and lower limits to steer the programming and erasure of a selected storage cell.

FIG. 19 illustrates schematically how the lower limit reference 1901 and the upper limit reference 1902 vary the programming and erasing of a selected storage cell 1911. Lower limit reference 1901 is provided to the positive input terminal of lower limit comparator 1903 whereas upper limit reference 1902 is provided to the negative input terminal of upper limit comparator 1904. A feedback signal from storage cell 1911 on line 1918 is provided to the negative input terminal of lower limit comparator 1903 as well as the positive input terminal of upper limit comparator 1904. Lower limit comparator 1903 controls the activation of the erase operation via erase control 1905 while upper limit comparator 1904 controls the activation of program control 1906. A total of $2^n+1$ references, that is $2^n+1$ columns of reference cells, are required for writing n bits of data into a memory cell.

Using this writing scheme, the content of a selected memory cell, for example cell 1911, is first compared with the new data to be stored as defined by lower limit reference 1901 and upper limit reference 1902. Based on this comparison, either erase control 1905 or program control 1906 is activated to respectively discharge (erase) or charge (program) floating gate 1915. This process repeats until both erase control 1905 and program control 1906 are disabled by comparators 1903 and 1904, thereby signifying the state of the selected memory cell is at the same level as the input signal. In this manner, the inefficient, prior art method of fully erasing the selected storage memory cell before programming it to a new state is eliminated. Moreover, because the programming and erasing of selected memory cell 1911 is repeated until the feedback signal on line 1918 from storage cell 1911 matches the state of the input signal, the conventional program/erase window narrowing effect has significantly less impact on the writing method used in the present invention.

For an analog input of level Sa, instead of converting the input to a digital format and then selecting the associated pair of references, the upper limit reference 1902 and lower limit reference 1901 are changed to Sa+½ LSB and Sa−½ LSB, respectively. The least significant bit (LSB) is the difference between two adjacent reference levels and is generated on chip with the same set of references as described above in reference to FIG. 18.

Memory cell 1911 shown in FIG. 19 is a vertical split channel EEPROM cell having a separate erase/program gate 1916. If memory cells without erase/program gates are used, then signals from program control 1906 and erase control 1905 are provided on bit line 1914. If flash-EEPROM cells are used, a block of memory cells are erased simultaneously prior to programming. Then, the feedback method described in detail above in reference to FIG. 19, together with the use of a minimum programming pulse, set the memory cell level to just above the desired lower limit.

In accordance with the present invention, if a defective memory cell is selected and is unable to achieve the desired state despite charging or discharging the floating gate, a maximum write limit is established on-chip to stop the write operation. The maximum write limit is either a real time limit or a limit on the number of program/erase pulses applied to the memory cell. Once either write limit is reached, the write process is stopped and directed to continue on a redundant cell provided in the array.

Figure 20:
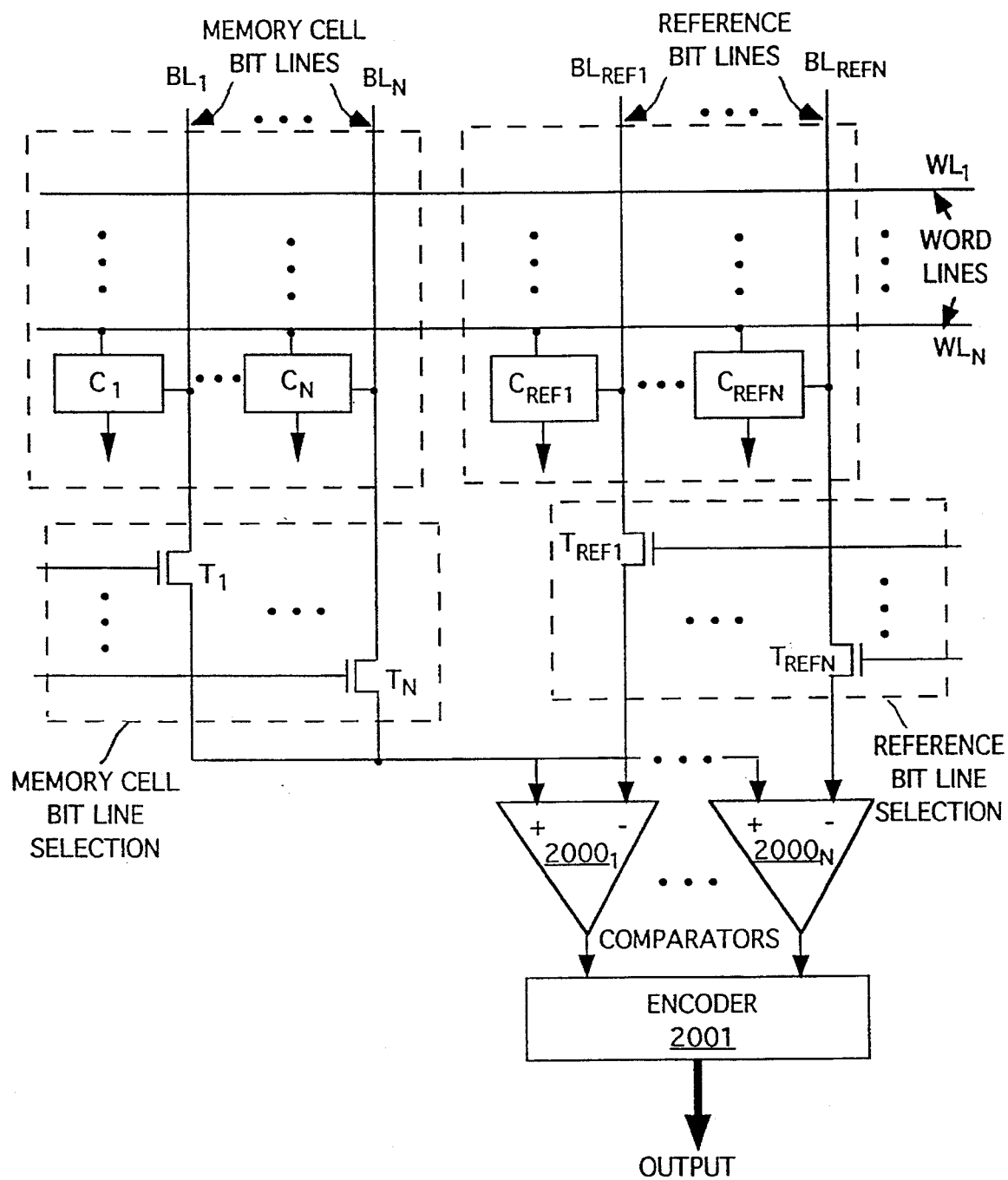
FIG. 20 shows a schematic diagram of a read circuit using comparators in parallel to encode the comparison results to digital output.

To read stored information as an analog output signal from a selected memory cell, the memory cell current is provided to one input terminal of a differential amplifier. A reference level of maximum channel conducting is provided to the other input terminal of the differential amplifier to compensate for variations in the temperature and the supply voltage. The output signal of the differential amplifier is the analog output of the memory cell. Referring to FIG. 20, to read stored information in cell $C_1$ as a digital output signal, comparators $2000_1$ through $2000_N$ compare the cell current from cell $C_1$ with that of on-chip reference cells $C_{REF1}$ through $C_{REFN}$. Encoder 2001 encodes the result of this comparison into digital data. Note that the readout of cell $C_1$, i.e. either the cell current or the corresponding bit line voltage, is compared to the readout of the reference cells $C_{REF1}$ through $C_{REFN}$ in parallel. The number of references cells (and the number of comparators) required for n bits storage per memory cell is $2^n-1$. References below the lowest state and above the highest are not needed to encode the comparison results into digital data.

To improve the read access time of a memory cell, one embodiment of the present invention senses the bit line voltage instead of the cell current. It is well known in the art that the channel conductance of a memory cell is a linear function of the stored charge and threshold voltage, assuming the drain voltage is much smaller than the difference of the gate voltages $V_G$ and the threshold voltage $V_T$. The cell current will pull down the precharged bit line level when the selected bit line is left floating during a read operation. Thus, the decay of the bit line voltage is solely a function of the cell current.

At the same time, the reference bit lines $BL_{REF}$ are all selected (by turning on transistor $T_{REF}$) and the cell current of reference cells $C_{REF}$ associated with, for example, word line $WL_N$ of selected memory cell C1 will pull down the voltage on bit lines $BL_{REF}$ at different rates. At time $t_s$ after word line $WL_N$ is turned on, the spectrum of reference levels provided by reference $C_{REF}$ are provided to comparators 2000. The bit line voltage level of memory cell C1 is also provided to comparators 2000 via bit line $BL_1$ at the same time under the same environment as reference bit lines $BL_{REF}$. In other words, because memory cell C1 and reference cells $C_{REF}$ are connected to word line $WL_N$, accurate tracking between the selected memory cell and its associated reference cells under all chip conditions is ensured. The output signals from comparators 2000 are encoded by encoder 2001 to yield a digital readout of memory cell C1. The precharged bit line level and the sampling time $t_s$ are selected to maximize the storage capacity per memory cell.

Figure 21:
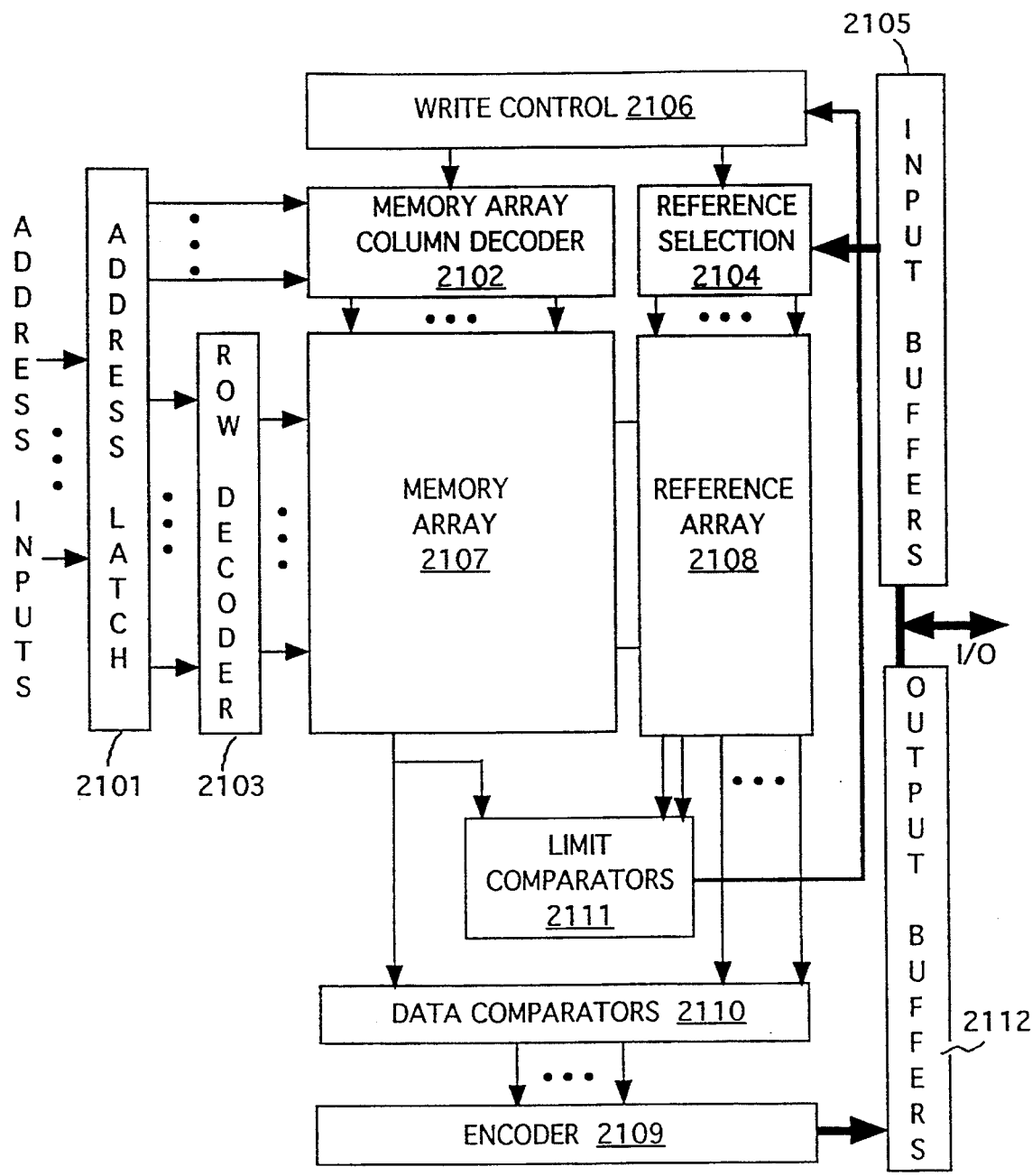
FIG. 21 illustrates a schematic block diagram of a system for storing multiple bits per cell.

FIG. 21 illustrates a schematic block diagram of a system for storing multiple bits per cell or analog signals. Address input signals, i.e. both row and column addresses, are first latched into address latch 2101 and then directed into column decoder 2102 and row decoder 2103. The output signal from row decoder 2103 activates the word line of the selected memory cell in memory array 2107 and the corresponding reference cells in reference array 2108. The output signal from the column decoder 2102 activates the bit line and the erase/program line of the selected memory cell. The bit lines of the reference cells are selected by the signals from reference selection 2104, which decodes the digital data from input buffers 2105. Write control 2106 consists of the erase control 1905 and program control 1906 (see FIG. 19). During the write operation, two reference cells in the reference array 2108 are selected according to the data input signals. The cell currents of these two reference cells are fed into the limit comparators 2111 as the lower and upper limits. The cell current of the selected memory cell in memory array 2107 is also directed into the limit comparators 2111 to compare with the cell current of the two selected reference cells. The result of this comparison is fed back to the write control 2106 to set up the predetermined bias condition for erase and program operations. During the read operation, data comparators 2110 are used to compare the cell current of the selected memory cell in memory array 2107 with that of all reference cells in the reference array 2108 associated with the selected word line. The comparison result is then encoded by the encoder 2109 to provide the digital signals representing the stored information. These signals drive the output buffers 2112 to provide the memory output signals. The present invention, unlike conventional memory devices, (1) uses the readouts from a block of memory cell array as references, (2) establishes a set of the references to characterize each state of the memory cell, (3) employs an innovative write scheme to ensure that each cell is at the desired state and is read out correctly, (4) uses $2^n-1$ comparators to compare the storage cell readout and the reference cell readouts in parallel, (5) uses an encoder to generate digital output from the comparators' results, and (6) integrating digital-analog convertors into conventional memory devices.

In accordance with the present invention, both manufacturing yield and reliability are significantly improved in comparison with conventional EEPROM cells. Specifically, in conventional EEPROM cells, two major problems in the yield and reliability area are (1) the program and erase window narrowing due to electrons trapped in oxide and electron traps generated by tunneling electrons through the thin tunnel oxide, (explained in detail by C. S. Jenq, et al., in a lecture entitled, "High Field Generation of Electron Traps in MOS Capacitors", presented during Semiconductor Interface Specialist Conference, December 1977. The present invention solves the window narrowing problem by using cell current feedback and the program/erase method described above in reference to FIGS. 19–21. Specifically, in accordance with the present invention, the memory cell is not programmed or erased by a fixed number of program/erase pulses but rather is continuously programmed or erased until the cell readout matches the input state.

Those skilled in the art recognize that the program and erase window narrowing effect is cumulative and is thus worsened each time more electrons travel through the tunnel oxide. To slow down the window narrowing effect and prolong memory cell life, the number of electrons passing through the tunnel oxide must be reduced. In a conventional flash-EEPROM cell array, a given memory cell must be fully erased and then reprogrammed irrespective of whether the present state is different from the desired state, thereby unnecessarily increasing the number of electrons passing through the tunnel oxide and generating extra electron traps which shorten memory cell life. In accordance with the write method of this invention, the memory cell readout is compared with the input signal. When the two match, no erasing or programming occurs, i.e. no electrons will pass through the tunnel oxide.

Moreover, each conventional erase and program operation swings the threshold voltage of the memory cell from the lowest allowed value to the highest allowed value. This swing maximizes the number of electrons passing through the tunnel oxide, thereby further shortening memory cell life. The present invention uses on-chip memory cells as references, thereby reducing the number of electrons required to pass through the tunnel oxide to change the memory cell from one state to another state. The resulting improvement in sensing resolution yields a smaller least significant bit (LSB). Moreover, reducing the number of electrons passing through the tunnel oxide also significantly reduces the number of traps generated in the tunnel oxide, thereby greatly minimizing the impact of the program and erase window narrowing effect. Thus, the present invention improves the reliability of the memory cell and prolongs the life of the memory device.

The present invention solves the tunnel oxide problem by providing vertical memory cells having the configurations described, in reference to FIGS. 5–9 for example. Specifically, by using a polysilicon layer as an extended drain region or as a separate erase/program gate, relatively thicker tunnel oxide is grown on the polysilicon surface in comparison with conventional memory cells. In another embodiment, tunnel oxide is grown on the top surface of the drain area or the erase/program gate. In this manner, the gate oxide of the storage transistor is formed by a process independent from the tunnel oxide. Thus, thickening the gate oxide in relation to the tunnel oxide is easily achieved in the present invention.

7. Vertical EEPROM Cells Formed on Side Walls of An Open Trench

The vertical EEPROM cells described above are formed inside a trench with a rectangular or square opening (see, for example, FIGS. 11 and 13). In these embodiments, a floating gate transistor is formed on the inner four side walls of the trench, while the drain region surrounds the trench. The commonly grounded source region in the present invention is buried inside the silicon substrate by forming an N+ diffusion area prior to the epitaxial layer deposition. In this closed-trench configuration, the vertical EEPROM cells provide the advantage of a large transistor width equal to the perimeter of the trench opening.

Figure 22:
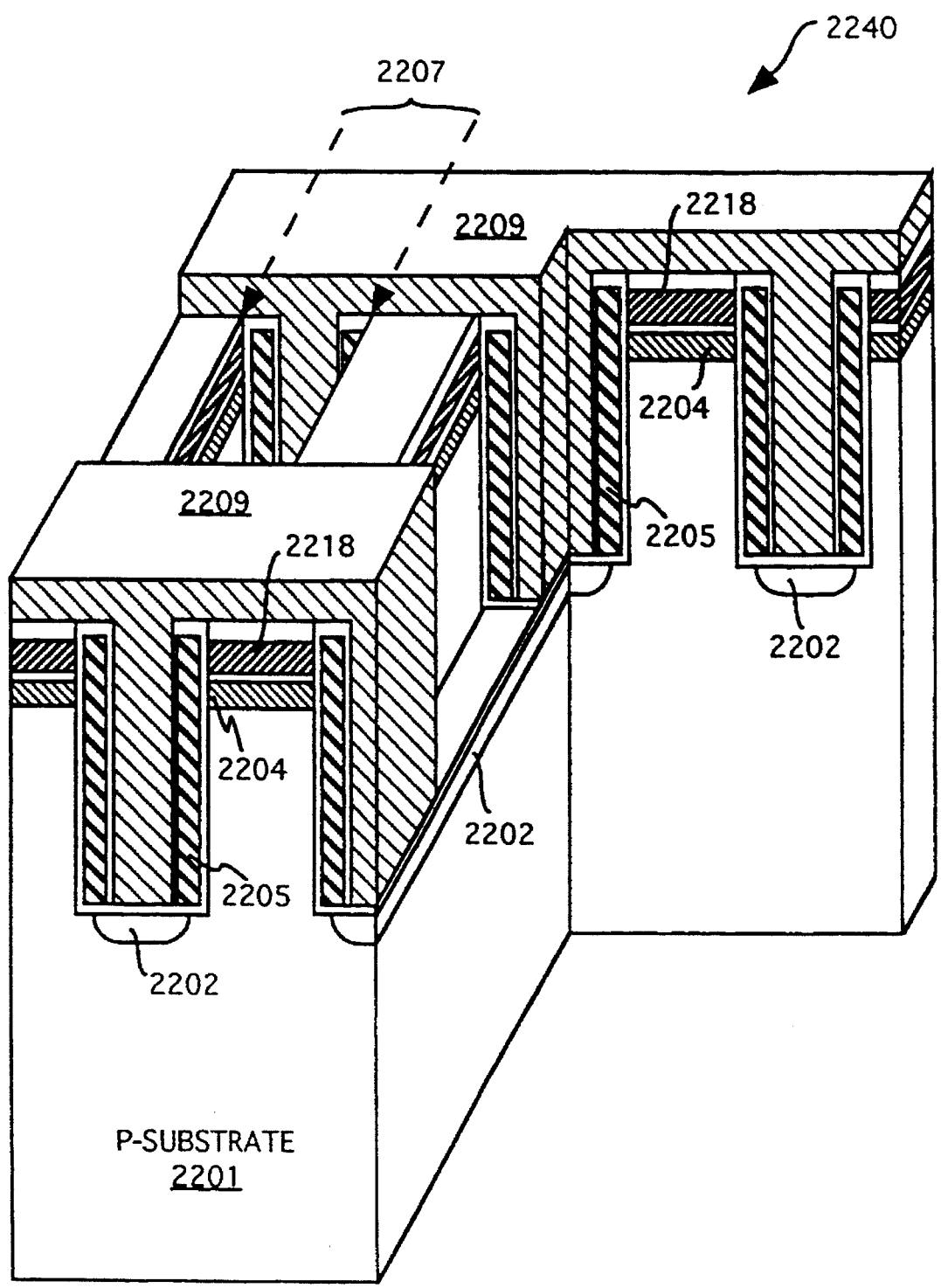
FIG. 22 shows a perspective cross-sectional drawing of an array of vertical stacked gate EEPROM structures formed on the side walls of long open trenches.

To reduce the cost of manufacturing the above-described EEPROM cell, another embodiment of the present invention eliminates the epitaxial layer deposition. Instead of forming vertical EEPROM cells on the sidewalls of rectangular or square trenches, vertical EEPROM cells are formed on the sidewalls of long open trenches. A partial cut-away of an array 2240 of these vertical stacked gate EEPROM cells is shown in FIG. 22. The long trenches 2207 run parallel to the drain region 2204. Source regions 2202 are formed at the bottom of trenches 2207 and are buried under floating gates 2205 but not directly under drain regions 2204. Source regions 2202 are formed between drain regions 2204 but at a different silicon surface level.

Figure 23A:
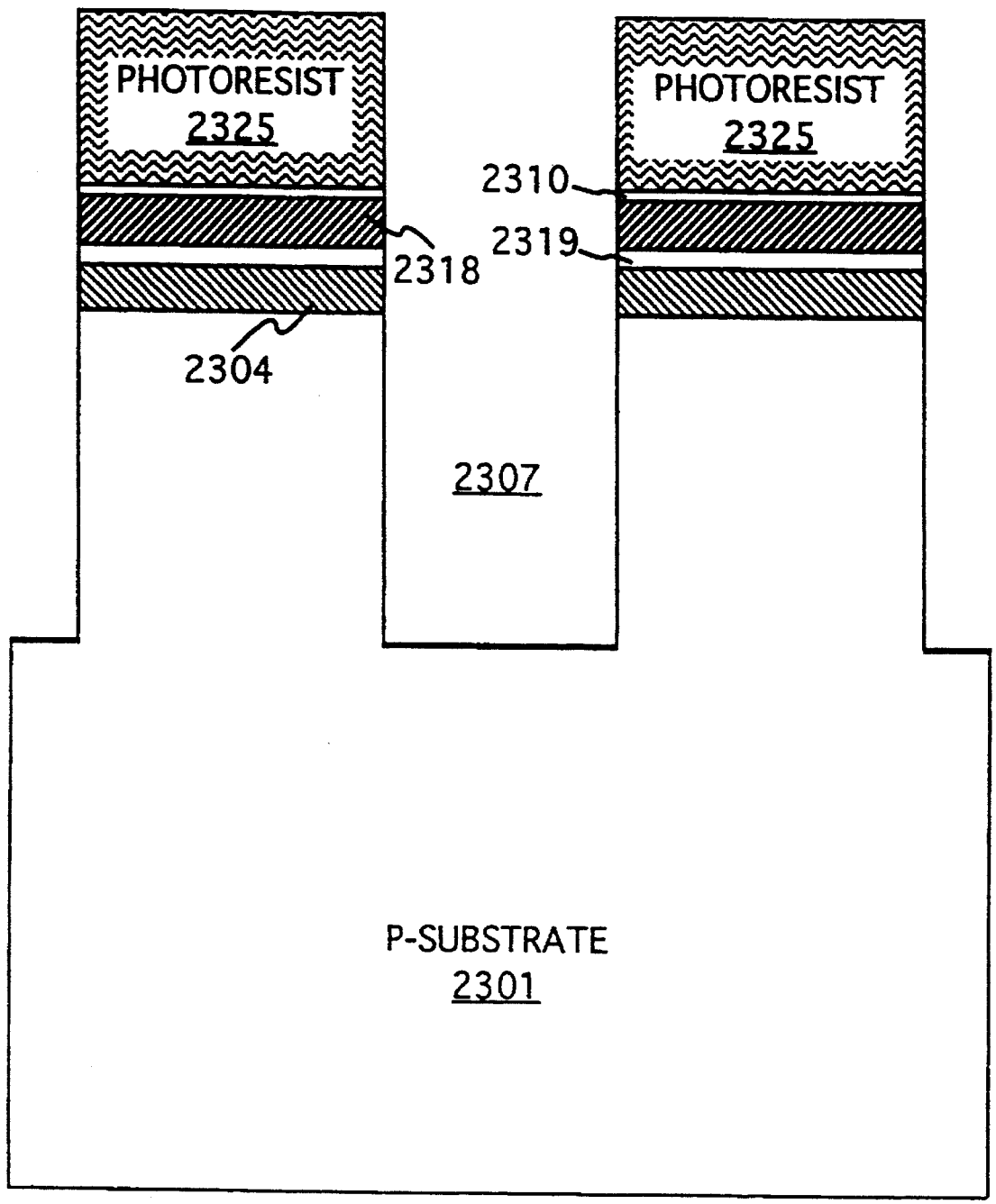
FIGS. 23A through 23C illustrate cross-sectional views of vertical stacked gate EEPROM structures along a word line formed on sidewalls of long open trenches at various processing stages in fabrication.
Figure 23B:
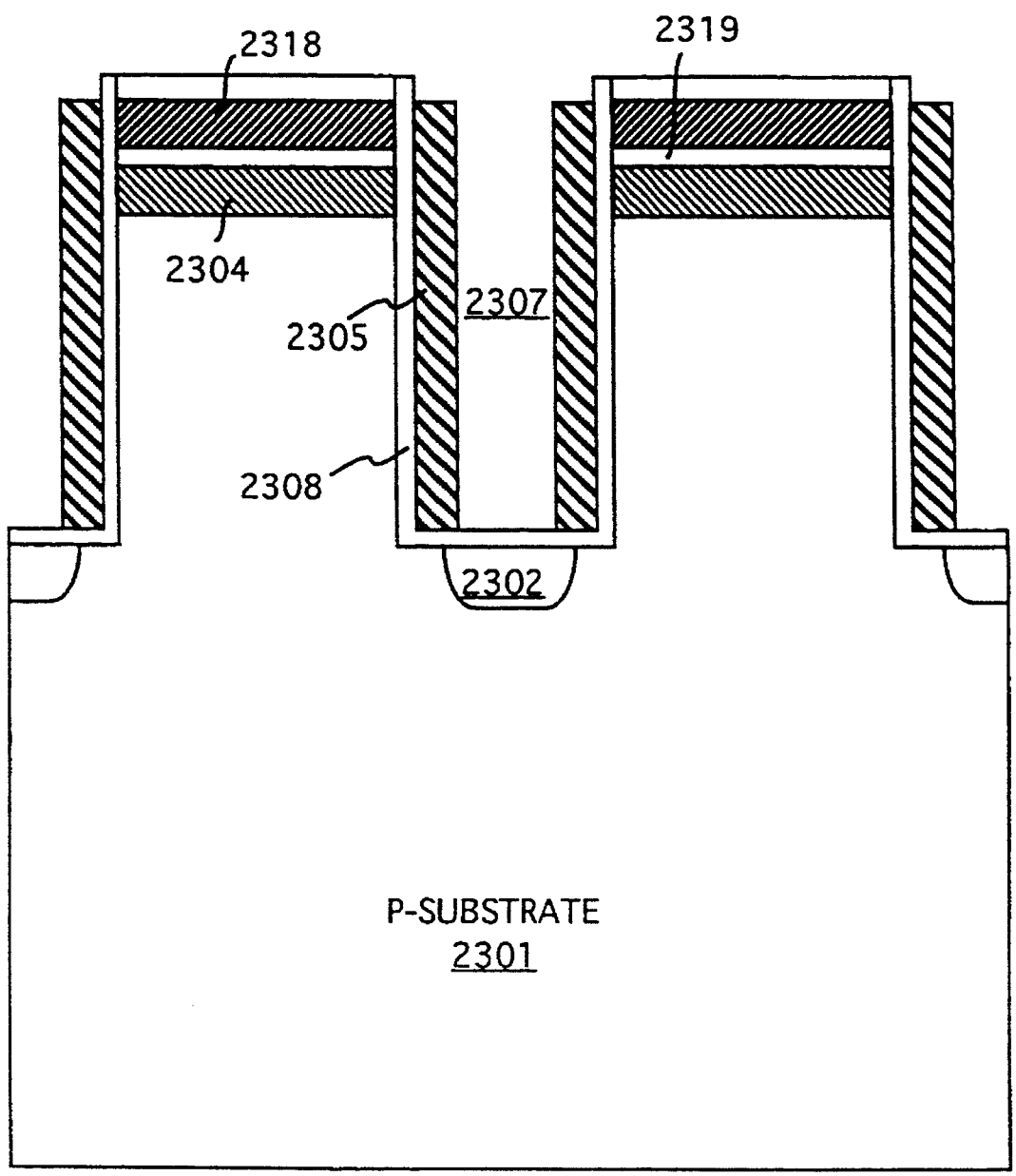

Fabrication of vertical stacked gate EEPROM cells having erase program gates formed on the sidewalls of long open trenches 2207 starts with a P-type single crystal silicon substrate 2201 with resistivity ranging from 30 to 60 ohm-centimeters. The steps for forming, for example, a vertical split channel EEPROM having a separate erase/program gate (as shown in FIG. 10A) are followed with the exception of forming the buried N+ layer 1002 and silicon epitaxial layer 1003. In this embodiment of the present invention and referring to FIG. 23A, long open trenches 2307 are formed by etching through oxide layers 2310 and 2319, polysilicon layer 2318 (erase/program gate), and N$^+$ doped single crystal silicon layer 2304 (drain region) into silicon substrate 2301. The depth of trench 2307 is approximately 1.0 to 1.5 micrometers below the surface of silicon substrate 2301. Gate dielectric film 2308 having a thickness of 20 to 40 nanometers is then grown on the sidewalls of these long trenches 2207. After this gate oxide growth, floating gates 2305, shown in FIG. 23B, are formed on gate dielectric film 2308 by previously described spacer formation processes. The width of floating gate 2305 is typically in the range of 50 to 200 nanometers.

Figure 23C:
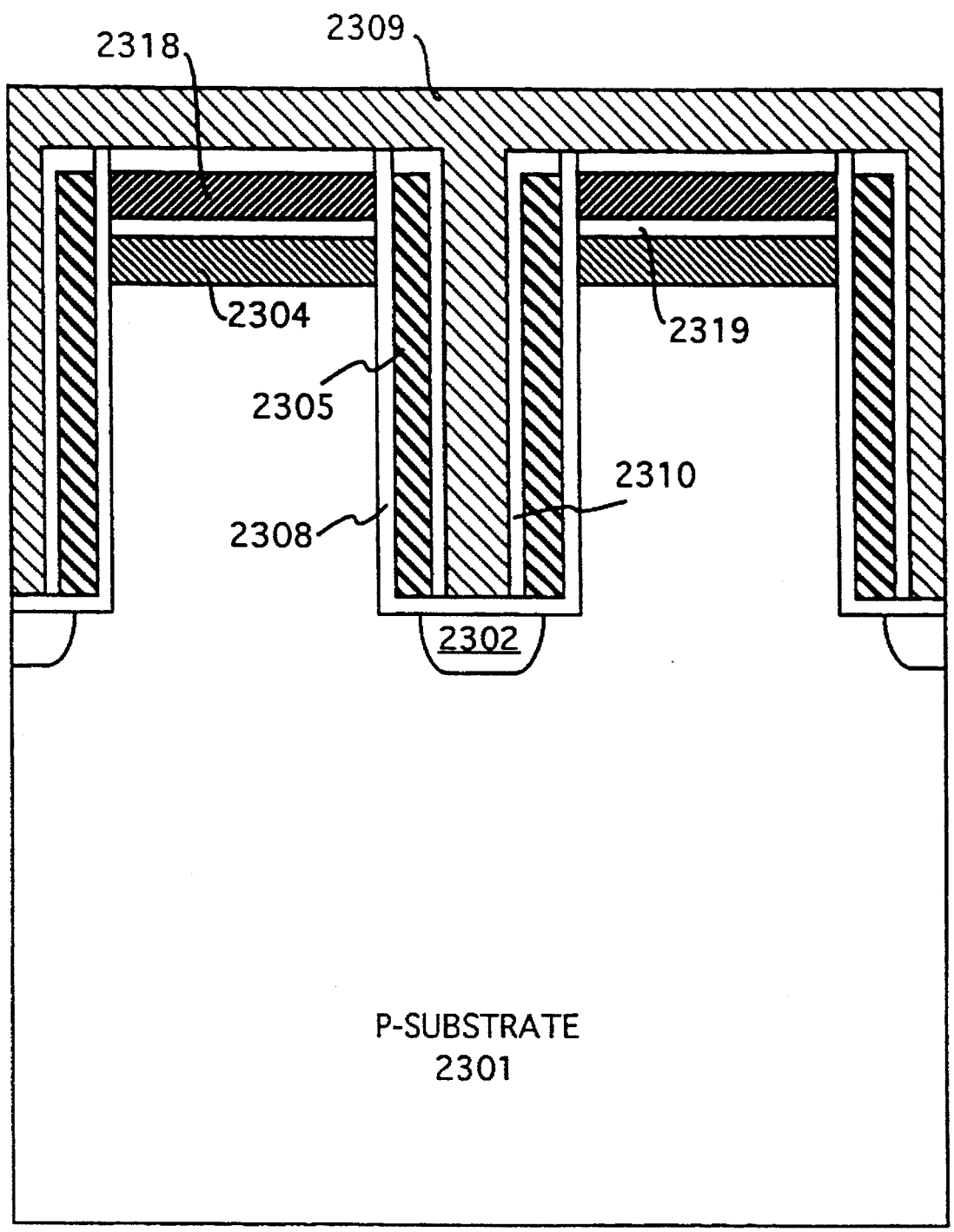

Next, arsenic dopants are implanted to form N+ diffusion source regions 2302 at the bottom of trenches 2307. A layer of interpoly dielectric film or combination of dielectric films (ONO stacked films) with a thickness equivalent to approximately 20 nanometers of oxide is deposited over the array and inside trenches 2307. As shown in FIG. 23C, another layer of heavily phosphorus doped N+ polysilicon is then deposited to fill trenches 2307 and patterned to form the control gates 2309, i.e. word lines of the memory array. In another embodiment, this layer of polysilicon deposited and used as control gate 2309 covers the sidewalls of trench 2307 but only partially fills trench 2307, thereby simplifying the subsequent self-aligned polysilicon etch step. Floating gates 2305 are self-aligned to control gates 2309 and are etched in the same etching step as the control gates (FIG. 22). Conventional standard CMOS EEPROM processes are then followed.

Figure 23D:
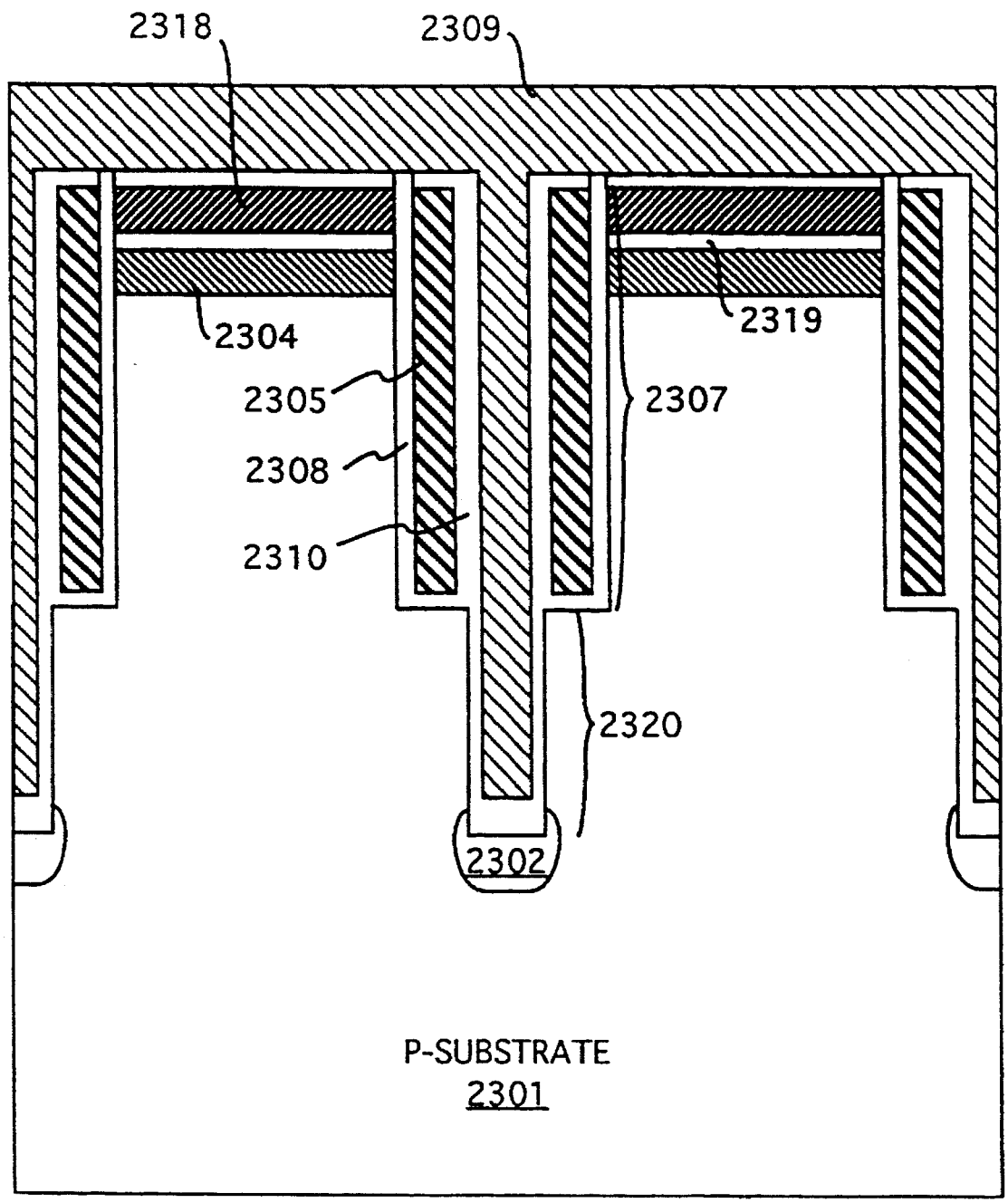
FIG. 23D shows a cross-sectional view of vertical split channel EEPROM structures along a word line formed on sidewalls of long open trenches.

In accordance with another embodiment of the present invention and referring to FIG. 23D, a split channel EEPROM cell having floating gates 2305 formed on the sidewalls of long open trenches 2307 is formed by adding process steps prior to the last oxidation of the ONO formation. Specifically, the second long open trench 2320 is self-aligned to the first trench 2307 by depositing PDO and then anisotropically etching back the PDO to expose the bottom of the first trench (see for example the description regarding FIG. 10D). FIG. 23D illustrates a cross-sectional view along a word line 2309 of a plurality of vertical split channel EEPROM cells formed on the sidewalls of open trenches (not shown).

Figure 24:
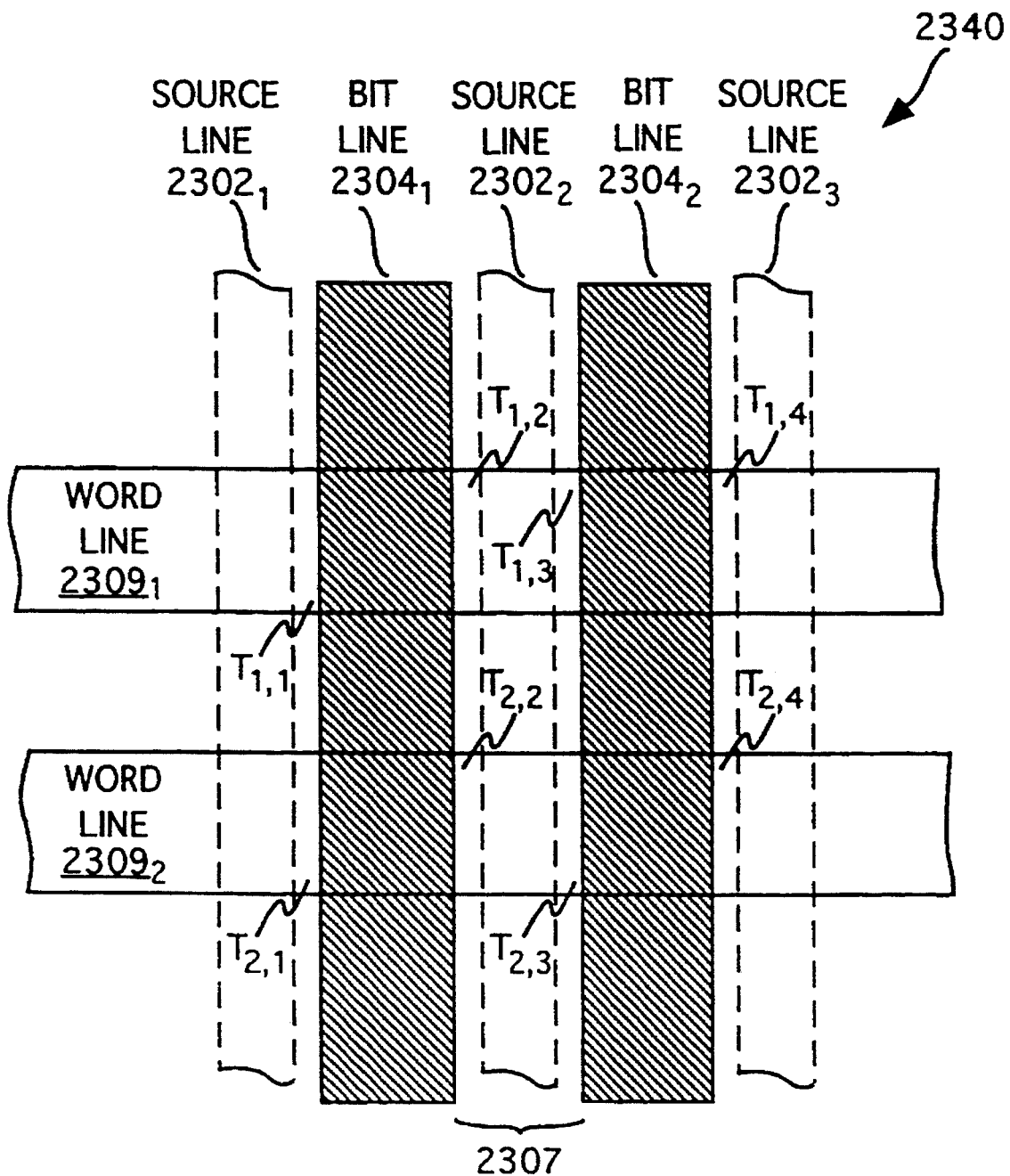
FIG. 24 illustrates a top view of an array of vertical EEPROM cells formed on the side walls of long open trenches.

The vertical EEPROMs produced in accordance with this embodiment are scalable and eliminate the need for an epitaxial layer deposition. FIG. 24 shows a top view of the array 2340 of vertical EEPROM cells formed on the sidewalls of long open trenches 2307. Note that in this configuration, the trenches 2307 are formed between bit lines 2304 and intersect a plurality of word lines 2309. Two floating gate transistors share a drain region associated with each intersection of a word line 2309 and a bit line 2304. For example, transistors $T_{1,1}$ and $T_{1,2}$ share a drain region (not shown) associated with the intersection of word line $2309_1$ and bit line $2304_1$. Thus, a particular transistor, for example transistor $T_{1,2}$, is identified by the intersection of bit line $2304_1$, word line $2309_1$, and source line $2302_2$. The cell size, the cell current, and the cell operation vary depending on the connection of source lines 2302 as described in detail below.

Figure 25A:
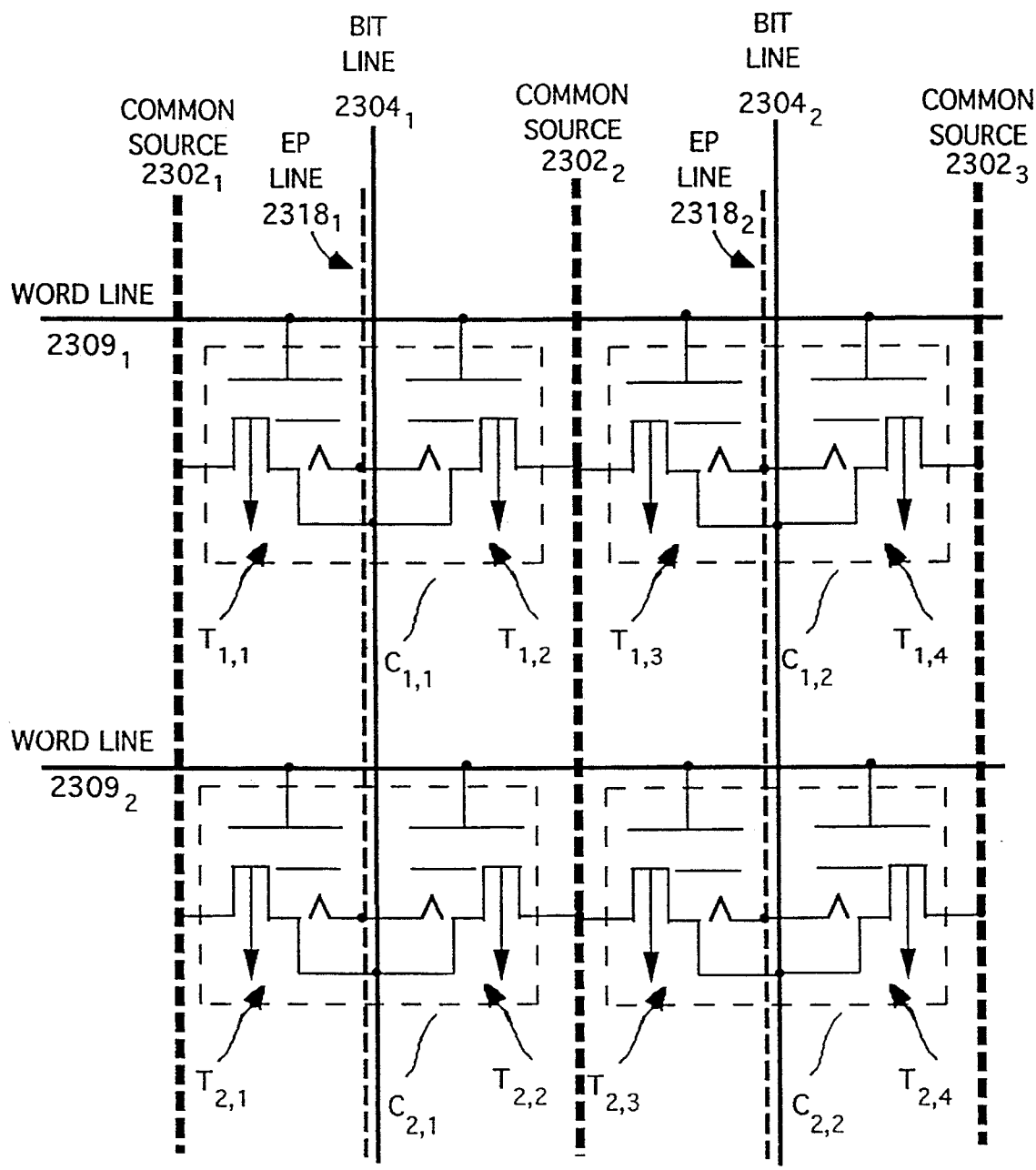
FIG. 25A illustrates a schematic diagram of an array of vertical EEPROM cells formed on side walls of long open trenches having a common source.

Referring to FIG. 25A, if source lines $2302_1$, $2302_2$, and $2302_3$ are connected together and grounded, two transistors, for example $T_{1,1}$ and $T_{1,2}$, associated with the same drain region (see FIG. 23D) become one cell C1,1 having a floating gate transistor width equal to $2 \times W_C$, where $W_C$ is the width of control gate 2309 (word line).

This common source connection makes the cell operation of these long trench EEPROM cells identical to that of their counterparts described in reference to Tables I and II. The cell size of these long trench EEPROM cells $C_{1,1}$, $C_{1,2}$, $C_{2,1}$ and $C_{2,2}$ having a common source 2302 is equal to $4X^2$, where X is the minimum feature size of a given technology. For 0.8 μm technology, the minimum feature size X is 0.8 μm and the cell size $A_{cell}$ is equal to 2.56 μm².

Figure 25B:
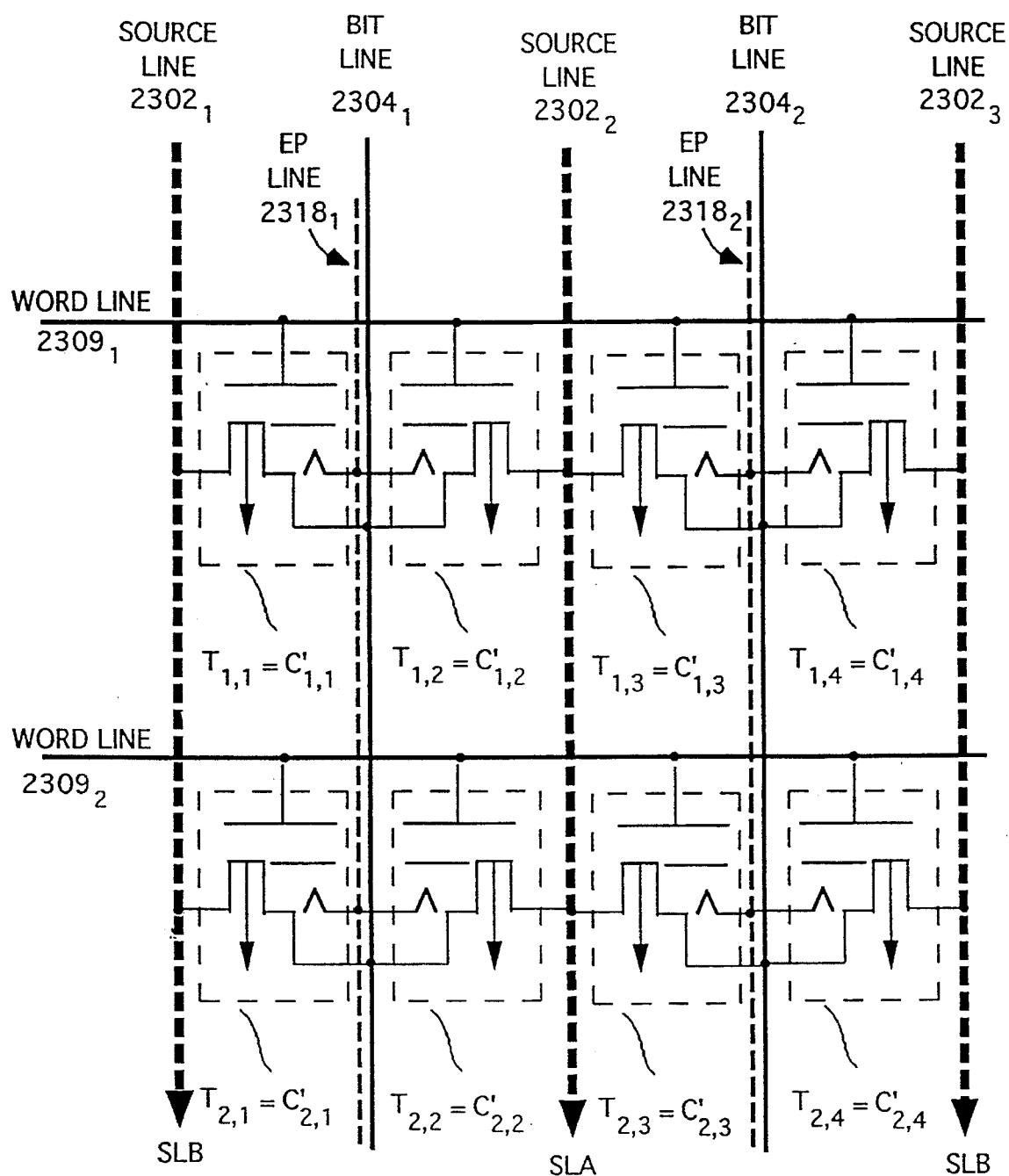
FIG. 25B is a schematic diagram of an array of vertical EEPROM cells formed on the side walls of long open trenches having an alternate source.

If two source lines $2302_1$ and $2302_2$ associated with selected bit line $2304_1$ are connected to two separated global source lines SLB and SLA respectively as shown in FIG. 25B, two floating gate transistors $T_{1,1}$ and $T_{1,2}$ associated with the intersection of word line $2309_1$ and bit line $2304_1$ constitute two memory cells $C'_{1,1}$ and $C'_{1,2}$ sharing one drain region (not shown). In this embodiment, each cell $C'_{1,1}$ or $C'_{1,2}$ has a floating gate transistor width equals to $W_C$. Thus, the cell size is now one-half that of cells having a common source configuration (FIG. 25A). For 0.8 μm technology, the minimum feature size X is 0.8 μm and the cell size $A_{cell}$ is equal to 1.28 μm².

Unlike the common source configuration shown in FIG. 25A, because two cells share the same drain region as well as the same erase/program gate, cell operations for the long trench EEPROM cells with the alternating source approach are different from those described in reference to Tables I and II. Typically, these cells are programmed by hot electron injection and erased by tunneling electrons from the floating gate to the source region. The unselected source lines are floating during all operations. Tables III and IV summarize the bias conditions for illustrative cells $C'_{1,1}$ and $C'_{1,2}$, respectively.

TABLE III

| To program cell $C'_{1,1}$: | $2309_1 = 12$ volts | $2304_1 = 6$ volts |
|---|---|---|
| | $2302_1 = $ Ground | $2302_2 = $ Floating |
| To read cell $C'_{1,1}$: | $2309_1 = 5$ volts | $2304_1 = 2$ volts |
| | $2302_1 = $ Ground | $2302_2 = $ Floating |

TABLE III-continued

| To erase cell $C'_{1,1}$: | $2309_1 = -12$ volts | $2304_1 = $ Floating |
|---|---|---|
| | $2302_1 = 6$ volts | $2302_2 = $ Floating |

TABLE IV

| To program cell $C'_{1,2}$: | $2309_1 = 12$ volts | $2304_1 = 6$ volts |
|---|---|---|
| | $2302_1 = $ Floating | $2302_2 = $ Ground |
| To read cell $C'_{1,2}$: | $2309_1 = 5$ volts | $2304_1 = 2$ volts |
| | $2302_1 = $ Floating | $2302_2 = $ Ground |
| To erase cell $C'_{1,2}$: | $2309_1 = -12$ volts | $2304_1 = $ Floating |
| | $2302_1 = $ Floating | $2302_2 = 6$ volts |

Using these bias conditions, memory cells sharing the same global source line and word line will be erased simultaneously. In another embodiment, erasure is achieved by tunneling electrons from the floating gate to a separate polysilicon erase gate instead of the source region. In this embodiment, only cells $C'_{1,1}$ and $C'_{1,2}$ will be erased the same time.

The preceding description is meant to be illustrative only and not limiting. Those skilled in the art will be able to devise other structures and methods within the scope of the present invention upon consideration of the detailed description and the accompanying drawings. The present invention is set forth in the appended claims.

I claim:

1. A method of forming a vertical memory cell comprising the steps of:

doping a substrate to form a source region;

forming a channel region on said source region;

forming a drain region on said channel region, wherein said drain region includes an extended drain region to provide a tunneling electrical field enhancement effect;

forming a trench through said drain region and said channel region;

forming a floating gate in said trench; and forming a control gate in operative relation to said floating gate.

2. A method of forming a vertical memory cell comprising the steps of:

doping a substrate to form a source region;

forming a channel region on said source region;

forming a drain region on said channel region;

forming a conductive layer insulated from said drain region;

forming a trench through said conductive layer, said drain region, and said channel region to said source region, thereby forming an erase/program gate from said conductive layer;

forming a floating gate in operative relation to said erase/program gate, said drain region, said channel region, and said source region; and forming a control gate in operative relation to said floating gate.

3. A method of forming a vertical memory cell, comprising:

forming a first transistor in a first trench in a substrate; and forming a second transistor in a second trench in said substrate, said second transistor being connected in series with said first transistor in said memory cell, wherein said second trench is disposed in said first trench and extends deeper into said substrate than does said first trench.

4. The method of claim 3, further comprising:

doping said substrate to form a source region;

forming a channel region on said source region;

forming a drain region on said channel region;

forming said first trench through said drain region and a portion of said channel;

forming a floating gate in said first trench;

forming said second trench through a portion of said channel region to said source region; and forming a control gate in operative relation to said floating gate and said channel region, wherein said control gate is formed in said first and said second trenches.

5. A method for forming a vertical memory cell, comprising:

doping a substrate to form a channel region;

depositing a conductive layer on said substrate to form a drain region;

forming a first trench through said conductive layer and into said substrate;

forming a floating gate on the sidewall of said first trench;

forming a second trench in said substrate after forming said floating gate;

doping said substrate to form a source region in said second trench; and forming a control gate in operative relation to said floating gate, wherein said control gate is disposed in said first trench and said second trench.

6. The method of claim 5, wherein forming said second trench comprises forming said second trench at a bottom of said first trench.

7. The method of claim 4 further comprising forming a conductive layer insulated from said drain region, wherein said first trench is formed through said conductive layer, thereby forming an erase/program gate from said conductive layer.

8. The method of claim 3, wherein forming said first transistor comprises forming a floating gate transistor, and forming said second transistor comprises forming said second transistor so that said first and second transistors both modulate a single channel region and together form a split-gate memory cell.

9. A method for forming an array of vertical memory cells comprising:

forming a first layer of a semiconductor material having a conductivity type for forming channel regions of said memory cells;

forming on said first layer, a second layer of a semiconductor material having a conductivity type for forming drain regions of said memory cells;

patterning said second layer to form bit lines;

forming bit line isolation regions between said bit lines and extending above said bit lines;

forming spacers which are on sidewalls of said bit line isolation regions and overlying portions of said bit lines; and forming trenches through said bit lines and into said first layer, said trenches having sidewalls aligned with edges of said spacers.

10. The method of claim 9, further comprising forming a source region, wherein said first layer overlies said source region and forming said trenches creates openings through said first layer to said source region.

11. The method of claim 9, further comprising doping bottoms of said trenches to from source regions for said memory cells.

12. The method of claim 9, further comprising forming a third layer above said second semiconductor layer, wherein:

patterning said second semiconductor layer comprises forming a photoresist mask above said third layer, and etching openings through said third layer and said second layer according to a pattern of said photoresist mask;

forming said bit line isolation regions comprises filling said openings to a point approximately level with a top surface of said third layer; and selectively etching said third layer to create sidewall spacers on said bit line isolation regions.

13. The method of claim 12, wherein said third layer comprises phosphorous doped silicon dioxide, said bit line isolation comprises silicon dioxide, and said selective etch is selective to phosphorous doped silicon dioxide.

14. The method of claim 9, wherein forming each of said trenches comprises:

forming a first trench in said first layer, wherein a sidewall of said first trench is aligned with an edge of one of said spacers;

forming a floating gate on said sidewall of said first trench; and forming a second trench through a bottom surface of said first trench, said second trench having a sidewall aligned with an edge of said floating gate.

15. The method of claim 9, further comprising:

forming third layer of a conductive material overlying said second layer; and patterning said third layer to form erase program gates.

16. The method of claim 15, wherein:

patterning said second layer uses a mask which is also used when patterning said third layer;

top surfaces of said bit line isolation regions are above a top surface of said third layer;

said spacers overlie portions of said erase/program gates; and forming said trenches etches through said erase/program gates and aligns edges of said erase/program gates with said edges of said spacers.

* * * * *